US005489986A

United States Patent [19]
Magome et al.

[11] Patent Number: 5,489,986
[45] Date of Patent: Feb. 6, 1996

[54] POSITION DETECTING APPARATUS

[75] Inventors: Nobutaka Magome, Kawasaki; Kazuya Ota, Tokyo; Hideo Mizutani, Yokohama; Kouichiro Komatsu, Tokyo, all of Japan

[73] Assignee: Nikon Corporation, Tokyo, Japan

[21] Appl. No.: 233,081

[22] Filed: Apr. 25, 1994

Related U.S. Application Data

[63] Continuation of Ser. No. 62,727, May 18, 1993, abandoned, which is a continuation of Ser. No. 892,700, May 29, 1992, abandoned, which is a continuation of Ser. No. 483,820, Feb. 23, 1990, abandoned.

[30] Foreign Application Priority Data

| Feb. 28, 1989 | [JP] | Japan | 1-48293 |
| Feb. 28, 1989 | [JP] | Japan | 1-48294 |
| Mar. 3, 1989 | [JP] | Japan | 1-51735 |
| Mar. 27, 1989 | [JP] | Japan | 1-74196 |

[51] Int. Cl.$^6$ ........................... G01B 11/00
[52] U.S. Cl. ........................... 356/401; 356/363
[58] Field of Search .................. 356/399–401, 356/349, 356, 363; 355/43, 53; 250/548

[56] References Cited

U.S. PATENT DOCUMENTS

| 4,402,596 | 9/1983 | Kanatani | 355/43 |
| 4,592,625 | 6/1986 | Uehara et al. | 350/415 |
| 4,677,301 | 6/1987 | Tanimoto et al. | 250/548 |
| 4,710,026 | 12/1987 | Magome et al. | 356/356 |
| 4,870,289 | 9/1989 | Sato et al. | 356/400 |
| 4,880,310 | 11/1989 | Nishi | 356/401 |
| 4,993,837 | 2/1991 | Oshida et al. | 356/401 |
| 5,000,573 | 3/1991 | Suzuki et al. | 356/400 |
| 5,070,250 | 12/1991 | Komatsu et al. | 356/401 X |

FOREIGN PATENT DOCUMENTS

| 57-142612 | 9/1982 | Japan . |
| 58-150924 | 9/1983 | Japan . |
| 60-130742 | 7/1985 | Japan . |
| 62-261003 | 11/1987 | Japan . |
| 63-153820 | 6/1988 | Japan . |
| 63-283129 | 11/1988 | Japan . |

Primary Examiner—Richard A. Rosenberger
Assistant Examiner—K. P. Hantis
Attorney, Agent, or Firm—Shapiro and Shapiro

[57] ABSTRACT

In a position detecting apparatus having an object optical system, two beams are generated for irradiating a diffraction grating formed on an object from two directions at a predetermined intersect angle for forming an interference fringe, the beams passing through a pupil plane of the object optical system spaced apart a predetermined distance from each other. An opto-electric detector receives diffracted light from the grating via the object optical system and outputs a detection signal, and the position of the object is determined on the basis of the detection signal. An adjustable optical member provided in a light path between an optical source and the object changes incident angles at which the two beams are incident on the grating while keeping the intersect angle between the two beams substantially constant.

8 Claims, 27 Drawing Sheets

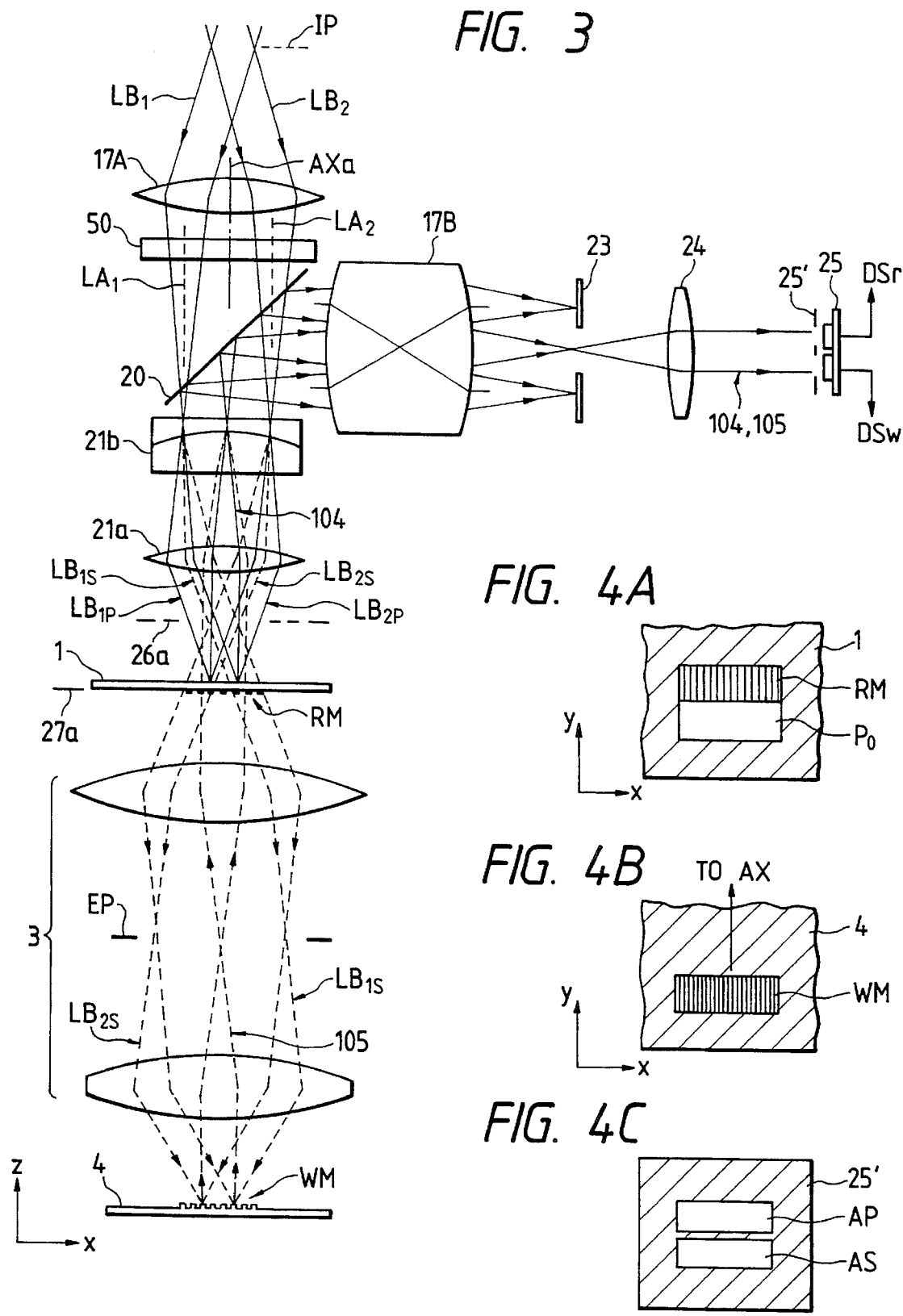

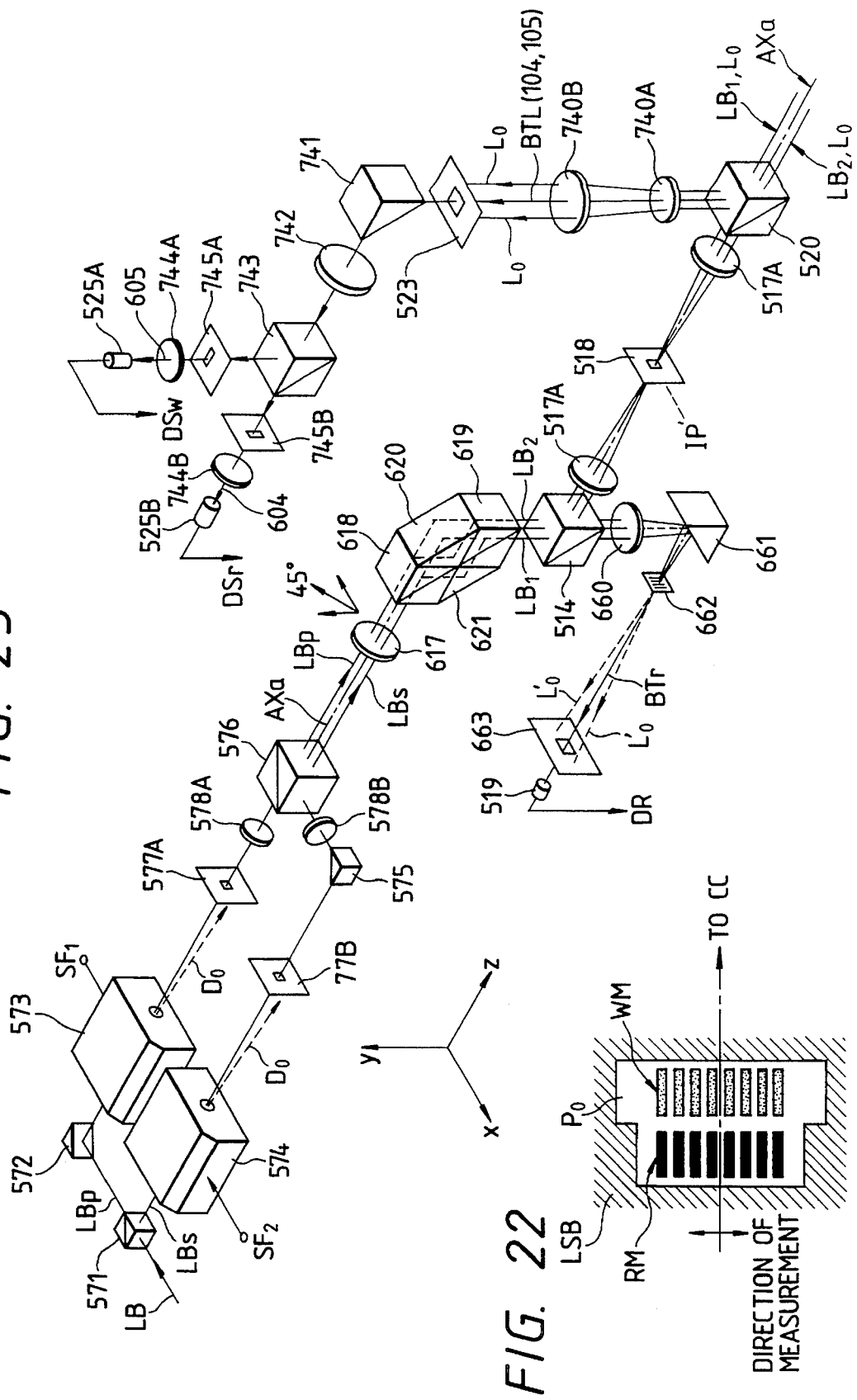

POSITION DETECTING APPARATUS

This is a continuation of application Ser. No. 08/062,727 filed May 18, 1993, which is a continuation of application Ser. No. 07/892,700 filed May 29, 1992, which is a continuation of application Ser. No. 07/483,820 filed Feb. 23, 1990, all now abandoned.

BACKGROUND OF THE INVENTION

1. Field of the Invention

The present invention relates to a position detecting apparatus using a diffraction grating formed on an object such as a semiconductor device, and more particularly to an apparatus which is used in alignment of exposure equipment for lithography to detect the relative positional relationship between a mask having an original pattern and an object onto which the original pattern is transferred.

The present invention further relates to a position detecting apparatus of the grating interference type, and more particularly to a position detecting apparatus suitable for high-precision aligners used in positioning wafers, masks, etc. in semiconductor manufacture apparatus and so forth.

2. Related Background Art

Recently, projection type exposure equipment (steppers) have widely been employed as an apparatus for transferring fine patterns of semiconductor devices and the like onto semiconductor wafers with high resolution. In the art of this type steppers, there has conventionally been known an apparatus which has an alignment system utilizing the TTR (through-the-reticle) technique as one of positioning between a reticle (synonymous with a mask) and one shot area on a wafer, namely, as the so-called alignment technique, the TTR technique being designed to simultaneously detect an alignment mark formed around a circuit pattern on the reticle and an alignment mark formed around the shot area on the wafer.

Such alignment technique comprises the steps of detecting both the mark on the reticle and the mark on the wafer with high precision, determining a shift or deviation in the relative position between the two marks, and moving the reticle or wafer in a fine manner so as to correct the shift. For the purpose of imaging the pattern of the reticle on the wafer with high resolving power, it is the general current state of projection type exposure equipment that a projection optical system is corrected satisfactorily in chromatic aberration only against an illumination light for exposure (e.g., g line of wavelength 436 nm, i line of wavelength 365 nm, or KrF excimer laser beam of wavelength 248 nm). This means that in an alignment optical system for detecting both the mark on the reticle and the mark on the wafer through the projection optical system, the light used in illuminating the marks is limited to the wavelength which is the same as or very close to that of the exposure light.

A resist layer remains formed on the wafer surface in the exposure step, and the mark on the wafer is detected through the resist layer during alignment. The resist layer has been designed to have the multi-layer resist structure or the like which is high in absorptivity and low in transmissivity for the exposure light, in order to permit patterning with higher resolution. This however raises a problem that since the illumination light is attenuated until reaching the mark on the wafer and the reflected light (such as the regularly reflected light, the scattered light and the diffracted light) from the mark is also attenuated, the mark on the wafer cannot be recognized by the alignment optical system with the sufficient intensity of light, resulting in reduced accuracy of detecting the mark.

When the illumination light for alignment is irradiated to the mark on the wafer to perform alignment, the resist layer in that irradiated area is exposed by its very nature and the mark on the wafer is hence destroyed while passing through various processes after development. This raises another problem, though not essential, that the mark can no longer be used for alignment in exposure of superposing the next layer.

Therefore, on the basis of the TTR technique adopting an alignment system of different wavelengths (i.e., the technique using the illumination light for alignment and the exposure light different in wavelength from each other) which has been disclosed in Japanese Patent Laid-Open No. 63-153820, a method of optically sensing a one-dimentional diffraction grating mark formed on the wafer or reticle and detecting the position of the wafer or reticle from the resulting pitch information with high resolution (on the order of a fraction—one of several tens fractions of the pitch) has been proposed in Japanese Patent Laid-Open 63-283129, for example.

A variety of methods have so far been proposed and practiced in detecting the position of the grating mark. Among them, the above method disclosed in Japanese Patent Laid-Open 63-283129 is directed to irradiate substantially parallel laser beams toward the grating mark from two directions simultaneously for forming a one-dimentional interference fringe, and to determine the position of the grating mark from the interference fringe. Because of using an interference fringe, that method is also called an interference fringe alignment technique.

The interference fringe alignment technique is divided into two methods; a heterodyne method in which a certain frequency difference is given between two laser beams irradiated from two directions, and a homodyne method which gives no frequency difference. In the homodyne method, a still interference fringe is formed in parallel to the grating and the grating (or the object) requires to be finely moved in the pitch direction thereof for detecting the position of the grating mark. The grating position is determined on the basis of the interference fringe as a reference. Meanwhile, in the heterodyne method, the frequency difference between the two laser beams (i.e., the beat frequency) causes the interference fringe to flow in the pitch direction thereof at a high speed corresponding to the beat frequency. Accordingly, the grating position can be determined not on the basis of the interference fringe, but solely on the basis of a time element (phase difference) incidental to high-speed movement of the interference fringe.

As a result of the experiment, it has been found in the above-stated position detecting system utilizing the interference fringe alignment method that the symmetry of incident angles of the two beams irradiating the grating from two directions is very important. If the symmetry of incident angles is unsteadily fluctuated even to a small extent, tele-centricity will be deteriorated and the ratio of a degree of detection error to the measurement resolution will present a great problem, in view of an intrinsic high level of the measurement resolution. The higher the measurement resolution, the more accurate will be the alignment. However, if the ratio of an amount of detection error becomes large, the alignment accuracy will eventually be limited dependent on an extent of the error, thereby to cancel out the merit of using the interference fringe alignment method.

Many factors are envisaged which may affect and fluctuate the symmetry of incident angles of the two beams.

Typically, those factors can be divided into one group attributable to the apparatus structure and the other group attributable to the object (grating mark) used in the position detecting process.

The factors attributable to the apparatus structure are as follows. In the exposure equipment and so forth, object lenses, mirrors, etc. of the alignment system are structurally obliged to move corresponding to changes of the mark position. In optical paths extending from the light source to the grating to produce the two beams, there are disposed various optical elements which are all subjected to manufacture errors and assembly errors in greater or lesser degree.

The factors relating to measurement of the object are principally attributable to the symmetry of incident angles. Thus, the partial surface of the grating to be measured is slightly displaced in the direction of the optical axis for each measurement in a region where the two beams intersect. This means, in the case of sequentially measuring a plurality of grating marks on the wafer as practiced in alignment of wafers, that a different sine error is caused for each mark. The error is mainly dependent on flatness of the wafer surface (including warp, curve or the like).

The similar problems have also been encountered in another method of conventional TTR alignment techniques that a laser beam is condensed into a slit shape to relatively scan bar marks or the like on the wafer, thereby for detecting the scattered or diffracted light in an opto-electric manner. However, the resulting effects have hardly been significant because they are small compared with the noise error occurred in detecting the marks and the overall detection accuracy in consideration of waveform distortion and others. Further, in the method of condensing the laser beam into a slit-like spot, the beam cross-section is made narrow or thin in the pupil plane of a projection lens or an alignment object lens in a direction perpendicular to the direction of slit length at the spot on the wafer. Accordingly, the numerical aperture of the beam becomes larger in the direction of detecting the slit-like mark (i.e., in the direction of width of the slit-like spot) compared with the direction perpendicular thereto. Generally, as the numerical aperture of the beam is increased, the diameter (width) of the spot beam can be reduced in proportion to improve the detecting resolution. Corresponding to the increased numerical aperture, however, the width of the beam waist becomes smaller in the direction of the optical axis, eventually resulting in that the stability is affected or lost in the mark detecting process. In an alternative method of condensing the beam into a circle spot, because the wave front of the beam is changed in the direction of the optical axis on both sides of the center of the beam waist, the intrinsic sharp wave-form of an opto-electric signal could not be obtained if the mark is scanned with respect to the beam waist while being displaced in the direction of the optical axis due to effects caused by flatness of the wafer surface, etc.

Meanwhile, it is also required in the TTR alignment system (i.e., the aligner) for implementing the interference fringe alignment method to move both the object lens for alignment and the mirror at the distal end in the direction of the optical axis in afocal relation dependent on changes of the mark position, as disclosed in Japanese Patent Laid-Open No. 57-142612 by way of example. However, Japanese Patent Laid-Open No. 57-142612 can maintain the image conjugate relation of the alignment mark, but cannot maintain the pupil conjugate relation of the alignment system. As a result, various disadvantages occur in each of the light transmitting and receiving systems which constitute the optical system in which a laser beam is passed through the object lens as with the interference fringe alignment method.

Therefore, an alignment optical system arranged in consideration of maintaining the pupil conjugate relation, too, is disclosed in Japanese Patent Laid-Open No. 58-150924 by way of example. This Patent Laid-Open describes a method of moving a part of the optical system for forming an image of an illumination source in the entrance pupil of an object lens for alignment in interlock relation with the object lens when it is moved to change the observing position.

With such arrangement where an optical correction member in a transmitting optical path for the illumination light is moved to maintain the pupil conjugate relation, however, the optical correction member must be interlocked in movement with the object lens and the alignment optical system becomes complicated in the structure. Particularly, in the case of irradiating light beams to the grating mark for measurement from two directions through the object lens to perform the interference fringe alignment, it is very important to retain the symmetry of an intersect angle and incident angles of those light beams. This necessarily requires to take into account the fact that the symmetry conditions are affected or disturbed with movement of the optical correction member. Thus, the structure of the alignment optical system is further complicated.

As mentioned before, projection type exposure equipment, called steppers, have widely been employed in recent years as an apparatus for transferring fine patterns of semiconductor devices and the like onto semiconductor wafers with high resolution. Of late, particularly, it has been required to increase the density of LSI's manufactured by the steppers, and hence transfer still finer patterns onto the wafers. More precise positioning or alignment is essential to cope with such tendency.

Therefore, an apparatus for detecting the position with higher accuracy by the use of the heterodyne interference method is disclosed in Japanese Patent Laid-Open No. 62-261003 by way of example.

In this apparatus, a Zeeman laser which emits a light beam containing both a P-polarized light and an S-polarized light slightly different in frequency from each other by utilizing the Zeeman effect, is employed as a light source for alignment. The light beam from the Zeeman laser is divided by a polarizing beam splitter into the P-polarized light of frequency $f_1$ and the S-polarized light of frequency $f_2$. The polarized light beams thus divided are irradiated through respective reflecting mirrors to a grating mark formed on a reticle (mask) from predetermined two directions. The mask is formed with a window at a position adjacent the grating mark, so that a part of the light beams irradiated to the grating mark passes through the window for irradiating a grating mark formed on a wafer from the predetermined two directions. The diffracted lights produced upon the light beams with different frequencies from each other being irradiated to the respective grating marks from two directions are caused to interfere with each other via polarizing plates in the detection system. Two light beat signals resulted from the interferences of the respective diffracted lights are detected by detectors in an opto-electric manner.

Because a relative phase difference between the two signals corresponds to a shift amount between the substrate and the two light beams intersecting at the grating mark, the mark position can be detected with high accuracy by moving the reticle and the wafer relatively such that the phase difference becomes zero with either one of the detected light beat signals as a reference signal.

In order to perform precise alignment with high accuracy by utilizing the interference method that the diffracted lights produced from each alignment grating mark (RM, WM) upon irradiation of two coherent beams thereto are caused to interfere with each other and the intensity of the resulting interference fringe is detected in an opto-electric manner, the two coherent beams require to be irradiated to the grating mark at a predetermined intersect angle with incident angles set equal to each other.

For instance, assuming that the diffracted lights to be detected are given by diffracted lights ($D_1$, $D_2$) produced in the vertical (normal) direction to each grating mark (RM, WM) as shown in FIG. 37, an intersect angle $\theta$ of two light beams ($L_1$, $L_2$) irradiating the grating mark (WM, RM) from two directions is uniquely given by the following equation, because it is equal to the sum of incident angles ($\alpha$, $\beta$) of the two light beams irradiating the grating mark (WM, RM) from the two directions:

$$\theta = \sin^{-1}(n_1 \lambda/P) - \sin^{-1}(n_2 \lambda/P) \quad (1)$$

Here, the wavelength of a laser source is $\lambda$, the pitch of the grating is P, the order of the diffracted light $D_1$ produced by the light beam $L_1$ irradiating the grating at the incident angle $\alpha$ is $n_1$ ($n_1 > 0$), and the order of the diffracted light $D_2$ produced by the light beam $L_2$ irradiating the grating at the incident angle $\beta$ is $n_2$ ($n_2 < 0$).

As one example, supposing that the diffracted lights to be detected are of ± 1st order lights, the wavelength $\lambda$ of the light beams irradiating the grating mark (WM, RM) is 600 nm (0.6 μm), and the pitch P of the grating mark (WM, RM) is 10 μm, the intersect angle $\theta$ is uniquely determined by:

$$\theta = \sin^{-1}(0.6 \text{ μm}/10 \text{ μm}) - \sin^{-1}(0.6 \text{ μ}/10 \text{ μm}) \approx 6.9° \quad (2)$$

However, if the two coherent lights are irradiated to the grating mark (WM, RM) at an angle different from the predetermined intersect angle due to adjustment errors of the apparatus or the like, and the diffracted lights produced upon the irradiation are caused to interfere with each other for obtaining the light beat signal by the detector, it becomes difficult to detect the mark position precisely and steadily because of not only breakdown or change in regularity of the light beat signal, but only a decrease in the contrast.

For the reason, the apparatus disclosed in the above-mentioned Japanese Patent Laid-Open No. 62-261003 is arranged to be capable of adjusting the incident angles of the respective light beams with respect to the grating mark, i.e., the intersect angle, by varying inclinations of two reflecting members disposed on the reticle so that the light beams always irradiate each of the grating marks formed on the reticle and the wafer from the predetermined two directions.

But, if the intersect angle is adjusted with the above method—the intersect point of the two light beams is moved in the vertical (normal) direction of the grating mark. To keep the grating mark (WM, RM) positioned at the intersect point of the two light beams, therefore, the stages holding the wafer and the reticle must be moved together following the movement of the intersect point. Such movement of the reticle and the wafer is not preferable for high-accurate alignment in the standpoints of complicating the apparatus structure and increasing the number of factors which may cause mechanical drifts.

Further, in the case of using a pair of grating marks (RM, WM) having a different value of the pitch P, the intersect angle required in this case is changed to a large extent and hence the intersect point of the two light beams must be moved to a large extent in the vertical direction of the grating mark. This is still objectionable to high-accurate alignment.

That point will be explained in detail with reference to FIG. 38.

As illustrated, reflecting members ($M_1$, $M_2$) for adjustment of the intersect angle are assumed to be set such that two light beams ($L_1$, $L_2$) having the wavelength of 600 nm can be irradiated to each of grating marks (RM, WM) of the 10 μm pitch disposed in a position A at the intersect angle of 6.9°, as indicated by solid lines.

In the case of using another pair of grating marks (RM, WM) each having the 10 μm pitch different from the 10 μm pitch of the above grating marks (RM, WM), the intersect angle $\theta$ required is now given below from the equation (1):

$$\theta = \sin^{-1}(0.6 \text{ μm}/5 \text{ μm}) - \sin^{-1}(0.6 \text{ μ}/5 \text{ μm}) \approx 13.9° \quad (3)$$

To cope with this, when the reflecting members for adjustment of the intersect angle is inclined in their posture from $M_1$, $M_2$ to $M_1'$, $M_2'$ so as to change the intersect angle from 6.9° to 13.9°, the paths of the light beams ($L_1$, $L_2$) are changed as indicated by broken lines. Since the intersect point of the two light beams is thereby moved by a distance of $\Delta z$ in the vertical (normal) direction of the grating mark, the reticle and the wafer having the grating marks (RM, WM) are each moved from the position A to a position B.

Supposing now that the distance D bisecting the interval or spacing between two pivot shafts of the reflecting members is 10 mm, for example, the moved amount $\Delta z$ of the intersect point is given by:

$$z = \frac{10 \text{ mm}}{\tan(6.9°/2)} - \frac{10 \text{ mm}}{\tan(13.9°/2)} \approx 83.83 \text{ mm} \quad (4)$$

The consequent large moved amount of the intersect point is not preferable.

SUMMARY OF THE INVENTION

One object of the present invention is to keep the symmetry of incident angles of two beams stable in a position detecting apparatus of the 2-beam interference type used in the interference fringe alignment technique.

Another object of the present invention is to keep both an intersect angle of two beams and the symmetry of incident angles of thereof stable concurrently in a position detecting apparatus of the 2-beam interference type used in the interference fringe alignment technique.

Still another object of the present invention is to provide an aligner which is simplified in the structure of an alignment optical system and also adaptable to changes in a mark position like conventionally.

Still another object of the present invention is to provide a position detecting apparatus which can promptly produce stable beat signals superior in contrast and high in reliability at all times with the simple arrangement, thereby permitting high-accurate position detection, and which requires no need of moving a stage holding a reticle or wafer even when grating marks having a different value of the pitch are used in pair.

According to the present invention, with an attention paid to the fact that two beams irradiating a diffraction grating on an object through an object optical system from two directions are spaced from each other by a predetermined distance in the pupil plane of the object optical system, a first optical member adapted to displace both of the two beams passing the pupil plane in the array direction of grating grooves by the same amount in that pupil plane while keeping the spacing between the two beams substantially constant is disposed in an optical path between a light source for producing the beams and the object optical system. The first optical member is to adjust the symmetry of incident angles of the two beams upon the object, and comprises interval adjusting means for translating the interval between the object and the object optical system in the direction of the optical axis, and control means for adjusting the first optical member dependent on a detection signal resulted from opto-electrically detecting via the object optical system the diffracted lights (or the interference light) produced from the grating, thereby for keeping the symmetry of the two beams stable.

The present invention is accomplished in view of the fact that the effective detection range in the direction of the optical axis can be enlarged in a position detecting apparatus of the 2-beam interference type several times to several tens times that in a conventional one of the imaging type or the beam-spot type, namely, that the wave front formed by intersection of two beams is substantially constant at any positions in the direction of the optical axis within the effective detection range.

That point will be explained below with reference to FIG. 2. FIG. 2 shows an arrangement that two parallel beams $LB_1$, $LB_2$ are irradiated to intersect with each other exactly on an imaginary flat plane IP, and a one-dimensional grating WP (duty= 1:1) is arranged on the flat plate IP parallel thereto. Assuming that the wave-length of the two beams $LB_1$, $LB_2$ is $\lambda$, the pitch of the grating WP is P, the optical axis of the object optical system for irradiating the two beams $LB_1$, $LB_2$ is AXa vertical to the flat plane IP, and the incident angles of the beams $LB_1$, $LB_2$ are $\theta a$, $\theta b$ on both sides of the optical axis AXa, respectively, the following equation (5) must be satisfied in order to produce the interference light (or the diffracted lights) BTL parallel to the optical axis AXa from the grating WP:

$$\sin\theta a = \sin\theta b = n \times \frac{\mu}{P} \quad (5)$$
(where $n = 1, 2, \ldots$)

(where n= 1, 2, . . .)

When this equation (5) is satisfied, a one-dimentional interference fringe IFw with the pitch of (½)P is formed in an arbitrary plane parallel to the flat plane IP within a space region where the two beams $LB_1$, $LB_2$ intersect with each other.

Respective light and dark stripes of the interference fringe IFw are set to be parallel to the grating elements (bar pattern). It is essential here that the incident angles $\theta a$, $\theta b$ always keep the symmetry with respect to the optical axis AXa vertical to the flat plane IP. FIG. 2 is shown as meeting $\theta a=\theta b$, which indicates that a pair of interference fringes IFw in the upper and lower spaces of the grating WP have their phases in the pitch direction which are not shifted transversely relative to each other, and that phase information remains identical in any planes in the vertical direction. Stated otherwise, any line lk connecting between the two interference fringes on the upper and lower sides at the same phase points is held vertical to the flat plane IP.

If the symmetry of the incident angles $\theta a$, $\theta b$ is given way or lost, the line lk is inclined by $\Delta\theta$ to exactly bisect the principal rays of the beams $LB_1$, $LB_2$. Therefore, if the grating WP is displaced by $\Delta Z$ in the vertical direction, the same phase points of the interference fringes IFw formed on the grating WP before and after that displacement will relatively be displaced by $\sin\Delta\theta$ in the array direction of the grating grooves, causing an error corresponding to $\sin \Delta\theta$ in detecting the position of the grating WP.

The foregoing has been explained in connection with the case of the homodyne method including no frequency difference $\Delta f$ between the two beams $LB_1$, $LB_2$. Meanwhile, in the case of the heterodyne method including a frequency difference $\Delta f$, the interference fringe IFw is moved in the direction of arrows (i.e., in the array direction of the grating) at a speed V. But, the above explanation relating to importance in retention of the same phase points equally applies to this case as well. Letting the pitch of the interference fringe IFw to be P' (=(½)P), the speed V is expressed by the following equation (6):

$$V=\Delta f \times P' \quad (6)$$

Now, if the symmetry of the incident angles $\theta a$, $\theta b$ is given way and the line lk is inclined by $\Delta\theta$ with respect to the optical axis AXa, the interference light BTL will also be inclined in the producing direction thereof, resulting in a failure in the opto-electric detection. More specifically, the interference light BTL is formed on the basis of that the 1st order component of the higher-order diffracted lights produced from the grating WP upon irradiation of the beam $LB_1$ returns vertically, and the 1st order component of the higher-order diffracted lights produced from the grating WP upon irradiation of the beam $LB_2$ returns vertically. Then, if the incident angles $\theta a$, $\theta b$ become different from each other, the two 1st order lights may lose coaxiality and the interference light BTL could not be produced in the extreme case.

Given the intersect angle of the two beams $LB_1$, $LB_2$ being $\theta$ ($\theta a+\theta b$) and the beam width (diameter) being D, the maximum width Zm of the space region, where the two beams $LB_1$, $LB_2$ intersect with each other, in the direction of the optical axis (Z-axis) is given by the following equation (7):

$$Zm = \frac{D}{\cos(\theta/2) \times \tan(\theta/2)} \quad (7)$$

Then, by using $\sin(\theta/2)= n\times\mu/P$ resulted from the above equation (5), the maximum width Zm can simply be calculated.

By way of example, supposing that the beams $LB_1$, $LB_2$ are He—Ne laser beams with the width of 100 μm and the wavelength of 632.8 nm, the pitch P of the grating WP is 8 μm (4 μm for each pair of line and space), and n= 1 holds, the incident angle $\theta/2$ of each of the two beams $LB_1$, $LB_2$ is given by:

$$\theta/2=\sin^{-1}(0.6328/8) \equiv 4.5368°$$

Thus, the maximum width Zm becomes:

$$Zm = \frac{100 \mu m}{\cos(4.5368°) \times \tan(4.5368°)} \approx 1260 \mu m$$

However, since the grating WP has a certain width in the pitch direction of the grating and the interference fringe IFw is required to occur steadily in that width, the actually effective detection range is limited to a width Zl as shown in FIG. 2. In this respect, it has been found that the width Zl can be estimated to span approximately 300 μm on the foregoing conditions, i.e., approximately 150 μm on each of the upper and lower sides of the flat plane IP. It is also proved that the waveform of the interference IFw is very precisely reproduced at any plane in the width Zl and the wave front remains unchanged.

In comparison with the case of the conventional spot scan type, the effective beam waist retaining distance (focal depth) of a He—Ne laser beam, which is imaged into a spot of 2 μm on the object, amounts to as large as 8 μm even with the reduced numerical aperture of the beam. If the beam is defocused to the extent of ± 150 μm, the spot size on the object will be about 50 μm. Furthermore, because the beam is condensed through an object lens system and a projection lens in the prior art of imaging a spot light, the wave front is gradually varied in the direction of the optical axis.

Thus, taking into account the fact that the 2-beam interference type can provide the very wide, stable detection range (Zl) in the direction of the optical axis, the present invention is directed to detect the symmetry of incident angles of the two beams $LB_1$, $LB_2$ with very high accuracy.

In addition, according to the present invention, a second optical member adapted to displace the positions of two beams in the pupil plane in the array direction of a grating for changing the interval of the two beams is provided in an optical path between a light source and an object optical system. The second optical member is to adjust an intersect angle of the two beams on the surface of the object, and can be controlled automatically by detecting the amplitude (modulation degree) of a detection signal.

Moreover, if the intersect angle θ (θa+θb) of the two beams $LB_1$, $LB_2$ is fluctuated, the pitch of the interference fringe IFw will be varied. This changes linearity relative to the grating pitch to a large extent and hence lowers the accuracy of detecting the grating position. This adverse effect is substantial especially in the case of the homodyne method which detects the static intensity of the interference light BTL.

That point will now be explained with reference to FIG. 14A. In FIG. 14A, WP designates a diffraction grating and IFw indicates the intensity distribution of an interference fringe moving at a speed V. The bottoms of IFw represent the light intensity nearly equal to zero. Diffracted lights Ae indicated by arrows are vertically produced from the edges of respective array elements of the grating WP, and the total amount of the diffracted lights Ae produced from all the element edges represents the intensity (instantaneous value) of the interference light BTL. FIG. 14A shows the case where the pitch of the interference fringe IFw is changed or deviated from the ideal condition that it equals ½ of the pitch of the grating WP (i.e., the case where the linearity is deteriorated). Therefore, the distribution of the diffracted lights Ae becomes not flat in the array direction of the grating, but fluctuated sinusoidally. Since the light receiving element used in opto-electric detection receives the total amount of the diffracted lights Ae produced from all the element edges, the amplitude of a resulting opto-electric signal is reduced as compared with the case of the ideal condition. FIG. 14B shows the signal waveform (signals DSr, DSw) under the ideal condition, while FIG. 14C shows the signal waveform in the case deviated from the ideal condition. As will be apparent from FIGS. 14B and 14C, deviation from the ideal condition not only reduces the signal amplitude (P—P value), but also additionally gives an offset Vof of the DC component.

It is required to suppress such reduction in the signal amplitude and generation of the offset Vof as small as possible. Furthermore, the present invention is intended to hold the intersect angle of the two beams $LB_1$, $LB_2$ steady.

The present invention is premised on an aligner which has an alignment mark formed of a grating, an object optical system (preferably tele-centric) for alignment arranged to be movable dependent on changes in the mark position, and an opto-electric detector for detecting optical information from the alignment mark through the object optical system in an opto-electric manner.

There are also provided a light source (such as a laser source) for irradiating a light beam to the alignment mark through the object optical system, and a beam transmitting optical system for introducing the light beam from the light source to the object optical system. The beam transmitting optical system is arranged such that the principal ray of the light beam from the light source passing the pupil plane of the object optical system is made substantially parallel to the optical axis of the object optical system, and the light beam is converged at a predetermined position on the principal ray within the pupil space. The light beam reaching the alignment mark is thereby become substantially parallel flux. Furthermore, drive means is also provided such that when the 0th order diffracted beam (regularly reflected light) and the higher-order diffracted beam (e.g., 1st order light) among the optical information produced from the alignment mark are led to the opto-electric detector through the object optical system, the drive means moves the object optical system within a range where the th order diffracted beam and the higher order diffracted beam are separated from each other in the vicinity of a waist position of those light beams on the light transmitting side or a position substantially conjugate to the waist position.

The present invention is accomplished by paying an attention to the fact that the alignment mark handled in this type aligner has very small size (e.g., less than 1 mm×1 mm square on the reticle) and hence the parallel light beam irradiated to the alignment mark also has the small diameter, and by utilizing the fact that even if the light beam is converged (or diverged) in the pupil space, the numerical aperture (N. A.) of the beam itself can be made very small.

The principles of the present invention will now be explained with reference to FIGS. 19A and 19B. FIG. 19A shows the arrangement of a tele-centric object lens OBJ and a mirror $M_1$ in an alignment system, and the positional relationship between the alignment system and a transferred region (shot region) $SS_1$, $SS_2$. The size of the shot region on a sensitive substrate or a mask (reticle) is generally changed dependent on the device size to be manufactured. On assumption that an exposure central axis (optical axis) AX vertically passes the center CC of the shot region $SS_1$ and the x-y coordinate system is determined with the center CC being as the origin, a mark $RM_1$ in the form of a diffraction grating is formed on each of the x- and y-axes in the peripheral edges of the shot region $SS_1$. The mark $RM_1$ on the x-axis has its grating elements arrayed in the y-direction and is used for detecting the position of the shot region $SS_1$ in the y-direction, while the mark on the x-axis is used for detecting the position of the shot region $SS_1$ in the x-direction.

An optical axis AXa of the object lens OBJ vertically enters each mark $RM_1$ and is bent by the mirror $M_1$ to extend horizontally. The object lens OBJ and the mirror $M_1$ can be moved together in the direction of arrow A while keeping a condition that they are fixed in the illustrated positional relationship. Since the rearward focal plane of the telecentric object lens OBJ is coincident with the plane of the mark $RM_1$, the forward side (the same side as the mirror $M_1$) of the object lens OBJ becomes an afocal system. For the interference fringe alignment method, two beams $LB_1$, $LB_2$ are irradiated to the mark $RM_1$ through the object lens OBJ. The beams $LB_1$, $LB_2$ are supplied from the beam transmitting system to proceed while keeping the relation of point symmetry with respect to the optical axis AXa, and converged into spot lights $SP_1$, $SP_2$ at a beam waist position BW set in advance on the apparatus, respectively, followed by entering the object lens OBJ with a small divergent angle. The beams $LB_1$, $LB_2$ exiting from the object lens OBJ are each substantially parallel flux and intersect with each other at a predetermined angle. Assuming the array direction of the grating elements of the mark $RM_1$ to be the y-direction, the two beams $LB_1$, $LB_2$ exiting from the object lens OBJ have their principal rays inclined symmetrically with respect to the plane containing both the x-axis and the axis AX.

In FIG. 19A, $EP_1$ designates the forward focal plane (pupil plane) of the object lens OBJ. If the waist position BW and the pupil plane $EP_1$ are largely spaced or shifted from each other in the direction of the optical axis AXa as illustrated, the beams $LB_1$, $LB_2$ reaching the mark $RM_1$ are deteriorated in parallelism dependent on the shift distance, thus resulting in convergent or divergent beams.

Meanwhile, when the shot region $SS_1$ is replaced by the shot region $SS_2$ little larger than the former, the position of the mark $RM_1$ is also changed and a mark $RM_2$ must now be observed. In this case, the mirror $M_1$ and the object lens OBJ are moved together in the direction of arrow A so that the optical axis AXa of the object lens OBJ is displaced from the mark $RM_1$ to the mark $RM_2$. As a result, the interval or distance between the waist position BW and the pupil plane $EP_1$ is also varied.

As will be apparent from the technique disclosed in the above-cited Japanese Patent Laid-Open No. 63-283129 too, the diffracted lights (i.e., the interference beat light resulted from both the 1st order diffracted lights) BTL from the mark $RM_1$ or $RM_2$ are returned along the optical axis AXa of the object lens OBJ and after passing the centers of the pupil plane $EP_1$ and the waist position BW, then reach the opto-electric detector. It is required for the opto-electric detector to detect only the diffracted lights BTL propagating on the optical axis. If the 0th order lights (the regularly reflected components of the beams $LB_1$, $LB_2$) and so forth other than the diffracted lights BTL are mixed and enter the opto-electric detector, the mixed lights will increase a level of noise, which is very objectionable. This necessitates to arrange the opto-electric detector in the space where the 0th order lights and the diffracted lights BTL are completely separated from each other, or to provide a spatial filter. In general, because the opto-electric detector is fixedly arranged, the distance from the opto-electric detector (or the spatial filter) to the pupil plane $EP_1$ is changed upon movement of the object lens OBJ and the mirror $M_1$. Therefore, it may happen that if the observing position of the object lens OBJ is changed to a large extent, the diffracted lights BTL and the 0th order lights are not so separated from each other at the position of the opto-electric detector (or the spatial filter) because of the defocusing system that they are overlapped or superposed in parts.

For the purpose of avoiding the disadvantage as mentioned above, the present invention is intended to limit a moving range of the object lens OBJ under a certain condition.

That point will now be explained in detail with reference to FIG. 19B. In FIG. 19B, let it be assumed that the focal length of the object lens OBJ is f, the principal rays of the beam $LB_1$ ($LB_2$ being omitted) are $LA_1$, $LA_2$, the incident angle of the principal rays $LA_1$, $LA_2$ onto the mark $RM_1$ is θr, the width of the beam $LB_1$ ($LB_2$) (i.e., the width of the irradiation region) reaching the mark $RM_1$ in the plane which contains the principal rays $LA_1$, $LA_2$ and the optical axis AXa is Dr, the interval between the waist position BW of the beam $LB_1$ ($LB_2$) and the pupil plane $EP_1$ is $\Delta Z$, the angle relating to N.A. (numerical aperture) of the beam $LB_1$ ($LB_2$) directed toward the waist position BW is θb, and the distance between the optical axis AXa and the principal ray $LA_1$, $LA_2$ becoming parallel to the optical axis AXa in the pupil space is Da. Further, a relay system is provided to create a plane substantially conjugate to the waist position BW in FIG. 19B, and the spatial filter for extracting only the diffracted lights BTL is arranged in that conjugate plane by way of example.

In order to know whether or not the 0th order light $L_0$ and the diffracted light BTL are separated from each other on the spatial filter, it is just necessary to consider whether or not the 0th order light $L_0$ and the diffracted light BTL are separated from each other at the waist position BW.

First, the following equation (8) must be satisfied for causing the diffracted light (1st order light) BTL to return along the optical axis:

$$\sin\theta r = \frac{n \times \lambda}{Pr} \tag{8}$$

In the equation (8), n is the order (1, 2 ...), λ is the wavelength of the beam $LB_1$, $LB_2$, and Pr is the grating pitch of the mark $RM_1$. Further, the distance Da is expressed by the following equation (9):

$$Da = f \times \sin\theta r \tag{9}$$

Supposing also that the numerical aperture (sinθb) of the transmitted light beam $LB_1$ is essentially retained for both the diffracted light BTL and the 0th order light $L_0$ as well, the following equation (10) holds:

$$Dr/2 = f \times \tan\theta b \tag{10}$$

On assumption that the irradiation width Dr and the mark $RM_1$ are nearly equal in width to each other and the angle θr is small, the diffracted light BTL and the 0th order light $L_0$ present beam waists in a plane BW' located symmetrical to the waist position BW with respect to the pupil plane $EP_1$ from the standpoint of geometrical optics. Given the radius of each beam of the diffracted light BTL and the 0th order light $L_0$ at the waist position BW being DB, therefore, since the interval between the waist position BW and the plane BW' is $2 \times \Delta Z$, the following equation (11) holds:

$$DB = 2 \times \Delta Z \times \tan\theta b \tag{11}$$

Finally, the condition necessary for separating the 0th order light $L_0$ and the diffracted light BTL is expressed by the following equation (12):

$$Da \geq DB \tag{12}$$

The above conditions expressed by the equations (8)–(12) can be collected as follows. By substituting the equation (10) for tan θb in the equation (11), the following equation (13) is obtained:

$$DB = \Delta Z \times (Dr/f) \tag{13}$$

On the other hand, substitution of the equation (8) into the equation (9) results in the equation (14) below:

$$Da = f \times \sin\theta r = \frac{n \times \lambda \times f}{Pr} \tag{14}$$

Then, putting the equations (13) and (14) into the equation (12) results in the condition of the following equation (15), provided n= 1:

$$\Delta Z < \frac{\lambda \times f^2}{Dr \times Pr} \tag{15}$$

As will be apparent from the equation (15), when the incident angles θr of the two beams $LB_1$, $LB_2$ is so set as to return the diffracted lights (1st order lights) BTL, the shift distance Δr of the pupil plane $EP_1$ from the waist position BW allowed for separating the diffracted lights BTL and the 0th order lights $L_0$ can uniquely be determined by only the constants $\lambda$, $f$, $Dr$, $Pr$ preset in the step of design.

In the case where the pupil plane $EP_1$ is positioned on the left side of the waist position BW contrary to the above case of FIG. 19B, an allowable range of $\Delta Z$ exists similarly. Consequently, when the spatial filter is put in the plane conjugate to the waist position BW, an allowable movable range of the object lens OBJ and the mirror $M_1$ in the direction of arrow A is given by $$2\frac{\lambda \times f^2}{Dr \times Pr} .$$

Using the case of a 1/5 reduction projection type exposure equipment (stepper) as a practical example, numerical values are as follows. Assuming that the shot regions $SS_1$, $SS_2$ are each a pattern region on the reticle, the grating pitch Pr of the marks $RM_1$, $RM_2$ is 20 μm (4 μm on the wafer), Dr= 1,000 μm (200 μm on the wafer) is set, the focal length f of the object lens OBJ is 50 mm, and the wavelength $\lambda$ is 0.633 μm of the He—Ne laser, the movable range $\Delta Z$ is given from the equation (15) by; $\Delta Z \leq 79$ mm. Note that because of a diffraction phenomenon of the beams, a limitation in retainability of the numerical aperture (θb) of the 0th order lights $L_0$ and the diffracted lights BTL, occasional incoincidence between the width Dr of the irradiation region and the mark width, setting accuracy of the spatial filter, and other reasons, the actual movable range becomes about 50–60 mm smaller than the above theoretical range. In usual reticles, however, several tens mm on the x-axis in FIG. 19A is found enough for the necessary movement of the mark position and hence effective as movable range values in practical use.

In addition, since the movable range is increased proportionally to the square of f as will be apparent from the equation (15), the greater focal length of the object lens OBJ is more preferable.

Moreover, the angle θb determining the numerical aperture (sinθb) in each pupil space of the two beams $LB_1$, $LB_2$ can approximately be expressed below on a condition that the pupil plane $EP_1$ and the waist position BW coincide with each other:

$$\tan\theta b \simeq \frac{Dr/2}{f} \quad (16)$$

Then, the deviation from parallelism of the beam $LB_1$, $LB_2$ in the image space (extending from the object lens OBJ to the mark $RM_1$, $RM_2$) caused by a shift or spacing between the pupil plane $EP_1$ and the waist position BW is expressed by the following relationship, assuming the numerical aperture of the beam $LB_1$, $LB_2$ to be sin i:

$$\tan\theta i = \frac{\Delta Z}{f} \times \tan\theta b \quad (17)$$

In the case of numerical values exemplified above, tan θb is very small on the order of about 0.01 from the equation (16). Additionally, the movable range is assumed to be $\Delta Z = \pm 25$ mm (the total movable range of 50 mm) with the waist position BW as the center. Thus, as $\Delta Z$ is changed from 0 to ± 25 mm, tan i is changed between 0 and 0.005. The variation of tan θi is proportional to $\Delta Z$, but inversely proportional to f. By setting f longer, therefore, the variation of tan θi can be ignored practically and the beams $LB_1$, $BL_2$ reaching the marks $RM_1$, $RM_2$ can each be regarded substantially parallel flux. Accordingly, as studied before, it is just required for setting the condition to consider mutual separation in the pupil space between the 0th order light $L_0$ and the diffracted light BTL from the mark RM with priority. Even in the case where the spatial filter is not in precisely conjugate relation to the waist position BW, the condition of the foregoing equation (15) equally applies thereto. For instance, if the conjugate plane of the spatial filter is coincident with the plane BW' in FIG. 19B, the 0th order light $L_0$ and the diffracted light BTL each present the beam waist in the plane BW' and, therefore, the object lens OBJ (i.e., the pupil plane $EP_1$) can be moved by ± $\Delta Z$ about the position in FIG. 19B.

Moreover, the present invention is directed to a position detecting apparatus that coherent light beams are irradiated in two directions at a predetermined intersect angle through an alignment optical system to a diffraction grating on a substrate of which position is to be detected, and diffracted lights respectively produced from the two light beams are caused to interfere with each other, followed by detecting the intensity of the interference light in an opto-electric manner, wherein the alignment optical system has a double-refractive or birefringent optical element for dividing an alignment light into two fluxes to provide the above two coherent light beams, and a separation angle of or a distance between the two light beams divided by the double-refractive optical element is changed to be capable of adjusting the intersect angle.

The double-refractive optical element is preferably provided at a substantially conjugate position to the substrate in the alignment optical system, and is arranged to be tiltable with respect to the optical axis for separating the two light beams at a predetermined separation angle.

The double-refractive optical element may comprise a pair of wedge-like double-refractive prisms which are provided at a substantially pupil conjugate position in the alignment optical system such that their slant surfaces face to each other and their incident and exit side faces are substantially parallel to each other, either one of the double-refractive optical elements being movable along the slant surfaces thereof.

Further, the intersect angle varying means is preferably arranged to include an optical correction member for correcting respective incident angles of the two light beams irradiating the grating in two directions so that the incident angles are kept symmetrical with respect to the normal line of the grating, even when the intersect angle is changed by the double-refractive optical element.

With the above arrangement of the present invention, the separation angle of or the distance between the two light beams divided from the alignment light by the double-refractive optical element is changed so as to adjust the intersect angle of the two light beams without moving a stage which holds a reticle or wafer. The above-mentioned problems can be thereby solved to provide a stable beat signal high in both contrast and reliability at all times, making it possible to promptly carry out position detection with high accuracy. The present invention is also sufficiently adaptable for various grating marks for alignment having the different pitches.

BRIEF DESCRIPTION OF THE DRAWINGS

FIG. 3 is a view depicting in more detail a main section of an optical system shown in FIG. 1;

FIGS. 4A to 4C are plan views showing the relationship between grating marks and an aperture plate in FIG. 3;

FIG. 22 is a plan view showing one example of the mark arrangement;

FIG. 23 is a perspective view showing the configuration of the alignment system in FIG. 20;

DESCRIPTION OF THE PREFERRED EMBODIMENTS

First Embodiment

Hereinafter, the configuration of a projection type exposure equipment (stepper), in which a position detecting apparatus according to a first embodiment of the present invention is incorporated, will be described with reference to FIGS. 1, 3, 4, 5, 6 and 7. The basic configuration is similar to that disclosed in the above-cited Japanese Patent Laid-Open No. 63-283129.

Figure 1:
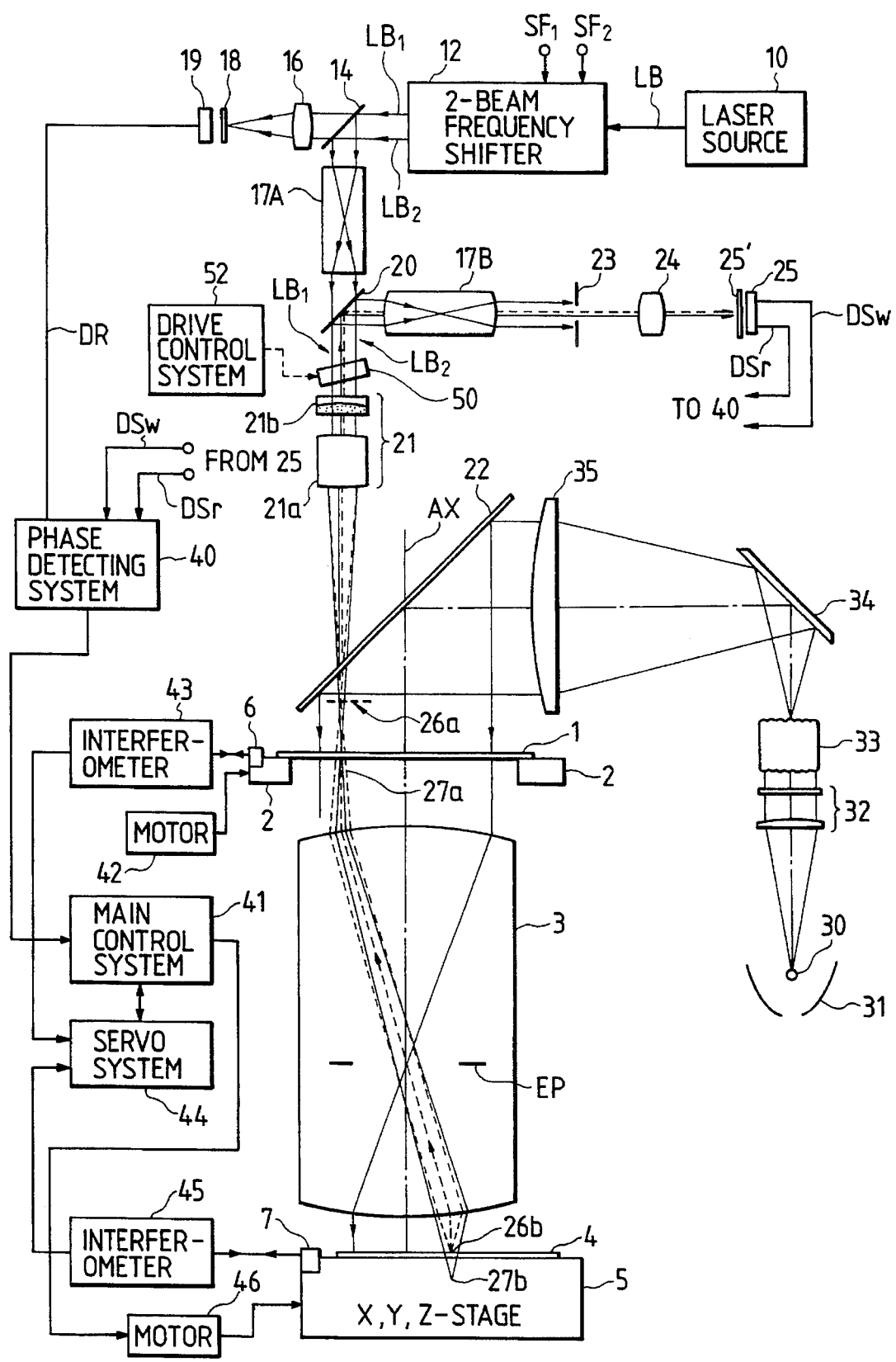
FIG. 1 is a diagrammatic view showing the configuration of a stepper according to a first embodiment of the present invention.

In FIG. 1, a reticle 1 having a predetermined circuit pattern and a grating mark for alignment thereon is held on a reticle stage 2 movable two-dimensionally. Each pattern on the reticle 1 is imaged with an exposure light on a wafer 4 through a projection lens 3 which is tele-centric on both sides. Here, the projection lens 3 is satisfactorily corrected in color aberration with respect to the wavelength of the illumination light (e.g., g line or i line) for exposure, and the reticle 1 and the wafer 4 are arranged in conjugate relation to each other for the wavelength of the exposure light. A grating mark similar to that formed on the reticle 1 is formed on the wafer 4 as well. The wafer 4 is held under suction on a stage 5 which is not only two-dimensionally movable in the x- and y-directions using the step and repeat technique, but also finely movable in the z-direction. When transfer exposure of the reticle 1 to one shot region on the wafer 4 has been completed, the wafer 4 is stepped to a next shot position. Fixed to a portion of the reticle stage 2 is a movable mirror 6 for reflecting a laser beam from laser beams interference type length gauge (hereinafter referred to an interferometer) 43 adapted to detect a relevant position in the horizontal plane of the reticle 1 in the x-, y- and rotating (θ-) directions. Although the interferometer 43 has three laser beams for length measurement to detect the position in the x-, y- and θ-directions independently of each other, a part of the laser beams is omitted on the drawing for simplicity of explanation. The reticle stage 2 has a moving stroke less than several millimeters, and the interferometer 43 is set to have detecting resolution on the order of 0.01 μm, for example. On the other hand, fixed to a portion of the wafer stage 5 is a movable mirror 7 for reflecting laser beams from an interferometer 45 adapted to detect a relevant position in the horizontal plane of the wafer 4 in the x- and y-directions. Likewise, although the interferometer 45 has two laser beams for length measurement to detect the position in the x- and y-directions independently of each other, a part of the laser beams is omitted on the drawing for simplicity of explanation. The reticle stage 2 is driven by a drive motor 42 in the x-, y- and θ-directions, while the wafer stage 5 is moved by a drive motor 46 in the two-dimensional directions and in the z-direction.

An illumination system for exposure comprises a mercury lamp 30, an ellipsoidal lens 31, an input lens group 32 including a condensing lens, an interference filter and others, an optical integrator (fly's-eye lens) 33, a mirror 34, a main condenser lens 35, a dichroic mirror 22, etc. The dichroic mirror 22 is obliquely disposed above the reticle 1 at an inclined angle of 45° so that the exposure light passing through the condenser lens 35 is reflected by the dichroic mirror 22 vertically downward to uniformly irradiate the reticle 1. The dichroic mirror 22 has reflectivity over 90% for the wavelength of the exposure light and transmissivity over 50% for the wavelength of an illumination light (longer than that of the exposure light) for alignment.

An alignment system of the stepper will now be described. An illumination light (beam) LB for alignment is emitted from a laser source 10 and enters a 2-beam frequency shifter 12 including two acoustic optical modulators (AOM's), for conversion to two beams $LB_1$, $LB_2$ which have different frequencies and contain both of linearly polarized lights orthogonal to each other. The resulting frequency difference corresponds to a difference in frequency between high-frequency signals $SF_1$, $SF_2$ for driving the two AOM's. The two parallel beams $LB_1$, $LB_2$ from the frequency shifter 12 are reflected by a beam splitter 14, and pass a pupil relay system 17A, a beam splitter 20 and then a parallel-planar glass 50 (tiltable) as a first optical member according to the present invention in this order, followed by entering a 2-focus optical system 21. The 2-focus optical system 21 comprises an integral combination of a double-refractive material (lens made of quartz, calcite, etc.) 21b and a tele-centric object lens 21a such as one for use in microscopes, which are arranged in conjugate relation to the pupil of the alignment system, i.e., the pupil EP of the projection lens 3. The 2-focus optical system 21 imparts different degrees of power to the beams $LB_1$, $LB_2$ dependent on their polarized components (assuming that the light having the polarized wave front parallel to the drawing sheet with respect to the dichroic mirror 22 is a P-polarized light and the light having the polarized wave front perpendicular thereto is an S-polarized light). The laser source 10 is assumed to oscillate a laser beam linearly polarized in orthogonal relation. Therefore, the beams $LB_1$, $LB_2$ exiting from the 2-focus optical system 21 and consisted of one polarized (e.g., P-polarized) component are imaged (or intersect) at a focus 26a in the space above the reticle 1, while the beams $LB_1$, $LB_2$ consisted of the other polarized (e.g., S-polarized) component are imaged (or intersect) at a focus 27a coincident with the pattern surface on the underside of the reticle 1. Opposite focuses of the 2-focus optical system 21, i.e., the planes respectively conjugate to the focuses 26a, 27a on the same side as the laser source 10, are present within the 2-beam frequency shifter 12. Here, the interval or spacing between the two focuses 26a, 27a of the 2-focus optical system 21 in the direction of the optical axis corresponds to the extent of color aberration of the projection lens 3 on the same side as the reticle 1 at the wavelength of the laser beam for alignment. The focal plane 26a in the space above the reticle 1 is conjugate to the imaged plane 26b coincident with the surface of the wafer 4 through the projection lens 3, while the focal plane 27a (reticle pattern surface) is conjugate to the imaged plane spaced downward from the surface of the wafer 4 through the projection lens 3. The interval between the imaged planes 26b and 27b corresponds to the extent of color aberration of the projection lens 3 on the same side as the wafer 4. Supposing now that the interval distance between the imaged planes 26b and 27b is Dw, the interval distance between the focal planes 26a and 27a are Dr, and the projection magnifying power of the projection lens 3 is 1/M (where M is usually any one of 1, 2.5, 5 and 10), there generally holds the relationship of $Dr=M^2 \times Dw$. As the wavelength of the laser beam for alignment is more remote from the wavelength of the exposure light, the values of Dw and Dr are increased due to an aberration characteristic of the projection lens 3. The focal depth of this type projection lens is very shallow on the order of about ± 1 μm and, though dependent on the illumination light for alignment, the interval distance Dw amounts to several tens μm or thereabout. Although the illumination light (laser beam) for alignment preferably has the wavelength to which the resist coated on the wafer 4 is hardly sensitive, this is not a condition that should be always satisfied in the present invention. The reason is in that some projection lenses may cause very large aberration at the wavelength of the exposure light and the wavelength of the illumination light for alignment, thereby imposing a significant distortion in the optical information itself from the grating mark on the wafer 4, in particular. It is therefore important to set the optimum illumination light for alignment with higher priority applied to proper aberration. Accordingly, in some cases, the illumination light for alignment may have the wavelength exhibiting such a weak sensitivity that the resist would be exposed (namely, the resist film is reduced in thickness after development) if the illumination light is irradiated to the resist for a long period of time (e.g., 1 minute or more). In such cases, a shutter is opened in light transmitting paths of the two beams $LB_1$, $LB_2$ to be opened during the alignment.

Of the laser beams for alignment, the two beams $LB_1$, $LB_2$ in the form of P-polarized lights impinge for imaging onto the grating mark of the reticle 1 in the focal plane 27a from two directions at an angle defined by the beams $LB_1$, $LB_2$. On the other hand, the two beams $LB_1$, $LB_2$ in the form of S-polarized lights passing through a transparent portion of the reticle 1 from the focal plane 26a impinge for imaging onto the grating mark of the wafer 4 in the focal plane 26b through the projection lens 3 from two directions at an angle defined by the beams $LB_1$, $LB_2$. The reflected and diffracted lights (interference light BTL) from the grating mark of the reticle 1 pass through the dichroic mirror 22, the 2-focus optical system 21 and the parallel-planar glass 50 in this order and, after being reflected by the beam splitter 20, further pass through a pupil relay system 17B. Then, only those diffracted lights (BTL) propagating on the axis of a spatial filter 23 arranged in the pupil conjugate plane (Fourier plane) are taken out by filtering and reach an opto-electric detector 25 through a condensing lens 24. Also, the reflected and diffracted lights (interference light BTL) from the grating mark of the wafer 4 reversely returns along the incoming optical path through the projection lens 3 and, after passing through the transparent portion of the reticle 1, further proceeds through the dichroic mirror 22, the 2-focus optical system 21, the parallel-planar glass 50, the beam splitter 20, the pupil relay system 17B, the spatial filter 23 and the condensing lens 24, followed by reaching the opto-electric detector (light receiving element) 25. The spatial filter 23 is arranged at a position substantially conjugate to the pupil plane of the alignment optical system, i.e., at a position essentially conjugate to the pupil (exit pupil) of the projection lens 3 or in the vicinity thereof, such that it cuts off the regularly reflected lights (0th order lights) from the reticle 1 or the wafer 4, but allows passage of only those lights diffracted vertically to the grating (i.e., in the normal direction to the grating surface) of the reticle 1 or the wafer 4. In front of the opto-electric detector 25, there is provided an aperture plate 25' arranged in conjugate relation to the reticle 1 and the wafer 4 through the 2-focus optical system 21, the pupil relay system 17B and the condensing lens 24.

Since the beams $LB_1$, $LB_2$ are irradiated to the reticle 1 or the wafer 4 from two directions such that the interference fringe formed by those beams flows or moves on the grating mark in the pitch direction, an opto-electric signal DSr, DSw obtained from the opto-electric detector 25 becomes a sinusoidal AC signal with a frequency (beat frequency) corresponding to a difference $\Delta f$ between high-frequency drive signals $SF_1$ and $SF_2$. The two beams $LB_1$, $LB_2$ from the 2-beam frequency shifter 12 pass in parts through the beam splitter 14 and are imaged (or intersect) on a reference grating 18 by a lens system for converting the pupil (Fourier plane) to the image plane (inverse Fourier transforming lens) 16. The reference grating 18 is fixed on the apparatus. As with the above alignment system, the beams $LB_1$, $LB_2$ impinges onto the grating 18 from two directions at a predetermined intersect angle. The opto-electric detector 50 (light receiving element) 19 receives the diffracted lights of higher-order other than 0th order (or the interference light) having passed through the reference grating 18, and outputs a sinusoidal opto-electric signal DR. This opto-electric signal DR has the frequency proportional to a difference in frequency between the two beams $LB_1$ and $LB_2$, and becomes a reference beat signal. A phase detecting system 40 receives the opto-electric signal DSr for the reticle and the opto-electric signal DSw for the wafer both from the opto-electric detector 25, as well as the opto-electric signal DR from the opto-electric detector 19, and detects a phase difference between the waveforms of both the signals DSr and DSw with the signal DR as a reference. The detected phase difference ($\pm 180°$) uniquely corresponds to the shift amount in relative position between the grating marks formed on the reticle 1 and the wafer 4 that is within ½ of the grating pitch. A main control system 41 controls drive motors 42, 46 to perform relative positioning (alignment) of the reticle 1 and the wafer 4 based on information of the phase difference (i.e., the shift amount in relative position) thus detected, respective positional information provided from the interferometers 43, 45) via a servo system 44, etc. It is to be noted that although the two beams $LB_1$, $LB_2$ are illustrated so as to intersect with each other on the drawing sheet relating to the explanation of FIG. 1, they are actually inclined in the plane vertical to a flat plane containing the optical axis AX of the projection lens 3. The parallel-planar glass 50 is driven and controlled in its inclination by a drive control system 52 so that the two beams $LB_1$, $LB_2$ are translated in the same direction in the plane containing the optical axis (AXa) of the object lens 21b.

In the entire configuration as mentioned above, a part of the alignment optical system, particularly, the 2-focus optical system 21, is made movable to any desired position dependent on a location of the alignment mark on the reticle 1, thereby permitting mark detection whatever location the alignment mark takes. This point will be described later in detail. Further, since the dichroic mirror 22 obliquely disposed above the reticle 1 allows separation between the exposure light and the illumination light for alignment, the mark detection can be performed even during the exposure operation. This means that if the aligned condition of the reticle 1 and the wafer 4 is affected or failed by some disturbance during exposure, the mark detection can be performed immediately at that time. This also means that the positioning servo control for the reticle stage 2 and the wafer stage 5 can be executed using a closed loop based on the phase difference information from the phase detecting system 50 even during the exposure operation. Therefore, the line width of the exposed resist pattern will not be thicker due to slight image movement. Incidentally, the light source of the exposure light may be an excimer laser source or the like in place of the mercury lamp.

Next, the detailed configuration of only the alignment system and the principles of alignment will schematically explained with reference to FIG. 3. In FIG. 3, the dichroic mirror 22 and the beam splitter 14 are omitted for the sake of simplicity, and the same components as those in FIG. 1 are designated by the same reference symbols. The location of the parallel-planar glass 50 in FIG. 3 is merely for illustrative purpose. The parallel-planar glass 50 may be set in either location of FIGS. 1 and 3. The two beams $LB_1$, $LB_2$ exiting from the 2-beam frequency shifter 12 and entering the pupil relay system 17A each become a parallel beam inside the pupil relay system 17A, and they exit therefrom after once intersecting with each other. At this time, the emergent beams $LB_1$, $LB_2$ have their principal rays $LA_1$, $LA_2$ parallel to the optical axis AXa of the object lens 21a and others, and also become imaging fluxes which are condensed to a spot in the pupil plane.

The polarized directions of the beams $LB_1$, $LB_2$ are adjusted such that when the beams $LB_1$, $LB_2$ are divided by the 2-focus optical system 21 into the P- and S-polarized lights and condensed to the focuses 26a, 27a, the P- and S-polarized lights have their intensities (i.e., the quantities of light) at a predetermined ratio therebetween. Since the lights reaching the wafer 4 are subjected to larger loss, it is usual to set larger the intensity of the lights reaching the wafer 4. To this end, it is just needed that the alignment structure adopts the structure allowing the double focusing element 21b to be rotated about the optical axis AXa by a predetermined angle, or including a λ/2 plate between the laser source 10 and the 2-beam frequency shifter 12 and allowing it to be rotated about the optical axis by a predetermined angle. With such structure, the polarized component reaching the reticle 1 and the polarized component reaching the wafer 4 can be adjusted to the optimum ratio in the light intensity. With the parallel-planar glass 50 arranged perpendicular to the optical axis AXa, the two beams $LB_1$, $LB_2$ enter the 2-focus optical system 21 to be imaged into two spots in point symmetrical relation to each other about the optical axis AXa in the pupil plane of the 2-focus optical system 21, i.e., inside the tele-centric double-refractive material 21b, under the action of the pupil relay system 17A. Then, the beam $LB_1$ is divided by the double-refractive material 21b into two polarized components, i.e., a P-polarized beam $LB_{1P}$ and an S-polarized beam $LB_{1S}$, each of which reaches the reticle 1 in the form of parallel flux inclined at an angle determined dependent on the spot position in the pupil plane with respect to the optical axis AXa of the 2-focus optical system 21. Likewise, the beam $LB_2$ is also divided into a P-polarized beam $LB_{2P}$ and an S-polarized beam $LB_{2S}$, which reach the reticle 1 in the form of parallel fluxes inclined at angles symmetrical to the above beams $LB_{1P}$, $LB_{1S}$, respectively, about the optical axis AXa of the object lens 21a. As to the P-polarized lights, since the focal plane 27a is conjugate to an intersect plane (conjugate image plane) IP' inside the pupil relay system 17A, the P-polarized beams $LB_{1P}$, $LB_{2P}$ are imaged (or intersect) on the grating mark RM in the form of substantially parallel fluxes. In FIG. 3, the array direction of the grating mark RM is in the right and left direction on the drawing sheet, and the directions in which the beams $LB_{1P}$, $LB_{1P}$ are inclined relative to the optical axis AXa are also determined in the drawing sheet of FIG. 3. The reticle 1 is formed with the grating mark RM and a transparent window Po as shown in FIG. 4A. The beams $LB_{1P}$, $LB_{2P}$ are each irradiated to the reticle 1 in such beam size as to cover both the mark RM and the window Po. The mark RM shown in FIG. 4A is used to detect the reticle position in the x-direction (i.e., in the array direction of the grating). The grating mark WM of the wafer 4 is arranged in a similar manner as shown in FIG. 4B. The mark WM is also set to be matched with the position of the window Po in the reticle 1 during alignment (or exposure). The substantially parallel S-polarized beams $LB_{1S}$, $LB_{2S}$ exiting from the 2-focus optical system 21 are once imaged (or intersect) at the focal plane 26a in the space above the reticle 1. After passing through the window Po in the reticle 1, those beams are once condensed as spot lights in the pupil EP of the projection lens 3, followed by imaging so as to impinge onto the grating mark WM of the wafer 4 from two different directions. This is because the focal plane 26a (plane conjugate to the wafer) is conjugate to the intersect plane IP' inside the pupil relay system 17A. Finally, the substantially parallel S-polarized beams $LB_{1P}$, $LB_{2P}$ exiting from the projection lens 3 impinge onto the grating mark WM while being inclined symmetrically about the array direction of the grating mark WM. The angle θ formed by the principal rays of the S-polarized beams $LB_{1P}$, $LB_{2P}$ reaching the wafer 4 will not exceed even at its maximum the numerical aperture of the projection lens 3 on the emergent (wafer) side. Note that the reticle 1 and the wafer 4 are each arranged in conjugate relation to the intersect plane IP' inside the pupil relay system 17A. Therefore, assuming that the beams $LB_1$, $LB_2$ passing the intersect plane IP' are parallel fluxes, the beams $LB_{1S}$, $LB_{2S}$, $LB_{1P}$, $LB_{2P}$ are all parallel fluxes on each of the reticle and the wafer.

When the beams $LB_{1P}$, $LB_{2P}$ are irradiated to the mark RM from two different directions as mentioned above, an interference fringe is formed on the mark RM while moving (or flowing) in the array direction of grating elements of the mark RM dependent on a frequency difference between the two beams $LB_{1P}$, $LB_{2P}$. While diffracted lights 104 are produced from the mark RM along the optical axis AXa of the 2-focus optical system 21, they present the beat wave front cyclically repeating the bright and dark changes with movement of the interference fringe. Accordingly, the signal DSr from the opto-electric detector 25 is given by a sinusoidal AC signal dependent on the cycle of the bright and dark changes.

The foregoing explanation also equally applies to the relationship between the grating mark WM on the wafer 4 and the S-polarized beams $LB_{1S}$, $LB_{2S}$. More specifically, diffracted lights 105 having the beat wave front are vertically produced from the mark WM and proceed along the principal axis of the projection lens 3, followed by reaching the opto-electric detector 25 through the window Po in the reticle 1.

The opto-electric detector 25 has been described as being set conjugate to each of the mark RM and the mark WM through the 2-focus optical system 21. However, the opto-electric detector 25 is actually constituted as shown in FIG. 3. Thus, an aperture plate 25' shown in FIG. 4C is provided at a position which is conjugate to each of the marks RM, WM, and the two sets of diffracted lights 104, 105 respectively passing through apertures Ar, As defined in the aperture plate 25' are separately detected in a opto-electric manner. For example, the aperture Ap takes out a diffraction image formed by the diffracted lights 104 from the mark RM on the reticle 1, and the aperture As takes out a diffraction image formed by the diffracted lights 105 from the mark WM on the wafer 4. Accordingly, by arranging the light receiving surfaces of-the opto-electric detectors 25 just behind the apertures Ar, As separately, it becomes possible to detect the position of the reticle 1 using the mark RM and to detect the position of the wafer 4 using the mark WM independently of each other. But, at the same time as when the mark RM on the reticle 1 irradiated by the P-polarized beams $LB_{1P}$, $LB_{2P}$ is imaged in the aperture Ap, the reflected and diffracted lights of the S-polarized beams $LB_{1S}$, $LB_{2S}$ also enter the aperture Ap as background noise. Therefore, it is preferred that a polarizing plate passing the P-polarized light therethrough is provided in the aperture Ap and a polarizing plate passing the S-polarized light therethrough is provided in the aperture As. This permits to sufficiently reduce a degree of crosstalk that both of the light from the wafer and the light from the reticle may be mixed and impinge onto each light receiving surface of the opto-electric detector 25.

The diffracted lights 104, 105 each present cyclic (sinusoidal) bright and black information, and the resulting opto-electric signal DSr, DSw becomes a sinusoidal AC signal even if the reticle 1 or the wafer 4 is held stationary. In this case, by using the opto-electric signal DR from the opto-electric detector 19 shown in FIG. 1 as a reference signal, the phase detecting system 40 detects a phase difference ør between the reference signal DR and the opto-electric signal DSr given by the diffracted lights 104 from the mark RM. Likewise, the phase detecting system 40 also detects a phase difference øw between the reference signal DR and the opto-electric signal DSw given by the diffracted lights 105 from the mark WM. Then, the shift amount between the reticle 1 and the wafer 4 in the x-direction can be known by determining a difference between both the phase differences ør and øw. This detection method is the so-called heterodyne method by which, if the reticle 1 and the wafer 4 are within a position error range (pre-alignment accuracy) equal to ½ of the grating pitch P, a relative shift in position therebetween can be detected with high resolution, even though they are in a still state. Therefore, this detection method is advantageous for performing position servo control in a closed loop so that no minute position shift will occur during the time the pattern of the reticle 1 is being exposed to the resist on the wafer 4. This detection method further enables, after completing alignment by moving the reticle 1 or the wafer 4 until ør–øw becomes zero (or a predetermined value), to effect a servo lock in the alignment position successively so as to prevent relative movement between the reticle 1 and the wafer 4.

Moreover, this embodiment makes it possible in the exposure process of the step and repeat type to first move the wafer stage into each of shot regions on the wafer based on the measured value of the interferometer 45, and after the mark WM is positioned in the irradiated region of the two beams $LB_{1S}$, $LB_{2S}$ at the accuracy within ± ½ pitch, then to perform servo control of the reticle stage or a wafer stage based on only the information from the phase detecting system 40. At this time, it is also possible to drive the reticle stage or the wafer stage using a DC motor, create an analog voltage corresponding to the phase difference ør–øw by a D/A converter or the like, and directly apply the analog voltage, as a deviation voltage, to a servo circuit of the DC motor. That servo control is continued until completion of the exposure of each shot region.

By so doing, because of no servo control dependent on the measured value of the interferometer, minute fluctuations of the stage due to fluctuations of air density in optical beam paths of the interferometer, etc. can be reduced. To this end, at the time when the phase difference information enough able to start the servo control is provided from the phase detecting system 40, the measured value of the interferometer associated with the wafer stage is disconnected from a servo system associated with the wafer stage, and the voltage applied to the motor of the wafer stage is made zero, while applying the above analog voltage to a servo system associated with the reticle stage.

With the above process, it becomes possible during the exposure operation to restrain minute fluctuations occurred on the wafer stage side, in particular, to such a degree of gentle drift-like minute motion, and to move the reticle stage at a high speed in a following fashion, thereby keeping the relative position shift between the reticle and the wafer substantially zero. As a result, high-fidelity transfer can be achieved with neither increasing a line thickness of the exposed pattern nor reducing resolution.

Hereinafter, the configuration of the 2-beam frequency shifter 12 will be described with reference to FIGS. 5, 6 and 7A.

Figure 5:
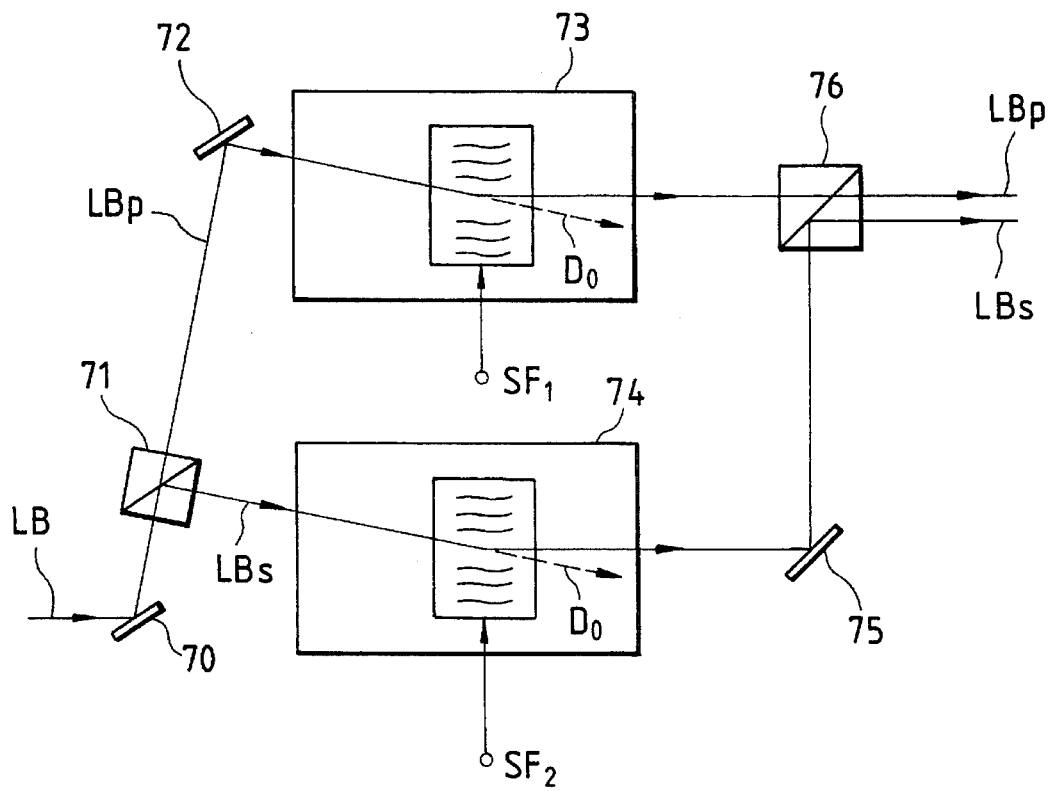
FIGS. 5, 6 and 7A are views showing the detailed configuration of a frequency shifter in FIG. 1.

As shown in FIG. 5, the parallel beam LB (orthogonally and linearly polarized light) from the laser source 10 is reflected by a mirror 70 and, thereafter, divided by a polarizing beam splitter 71 into a beam $LB_P$ consisted of the P-polarized component and a beam $LB_S$ consisted of the S-polarized component. The beam $LB_P$ is reflected by a mirror 72 to enter an AOM (acoustic optical modulator) 73, while the beam $LB_S$ is reflected by the polarizing beam splitter 71 to enter an AOM 74. The AOM 73 is driven by a high-frequency signal $SF_1$ of frequency $f_1$ to output the 1st order light, as the beam $LB_P$, which is deflected through a diffraction angle determined by the frequency $f_1$. The AOM 74 is driven by a high-frequency signal $SF_2$ of frequency $f_2$ ($f_2=f_1-\Delta f$) to output the 1st order light, as the beam $LB_S$, which is deflected through a diffraction angle determined by the frequency $f_2$. The 0th order light $D_0$ of the beam incident on each AOM is shielded by a slit or the like disposed at an appropriate position. The relationship between the drive frequencies $f_1$, $f_2$ and the frequency difference $\Delta f$ is preferably to be $f_1 \gg \Delta f$ and $f_2 \gg \Delta f$. An upper limit of $\Delta f$ is determined by responsivity of the opto-electric detectors 19, 25. The beam $LB_S$ from the AOM 74 is reflected by a mirror 75 to enter the polarizing beam splitter 76, while the beam $LB_P$ from the AOM 73 enters the polarizing beam splitter 76 in the direction perpendicular to the beam $LB_S$. Here, the polarizing beam splitter 76 functions not to synthesize the two beams $LB_P$, $LB_S$ in a completely coaxial state, but to synthesize them in a state parallel to each other with a certain interval or spacing therebetween. In the case of this embodiment, that interval specifies the intersect angle θ between the two beams $LB_1$, $LB_2$ irradiating the reticle 1 and the wafer 4.

Figure 6:
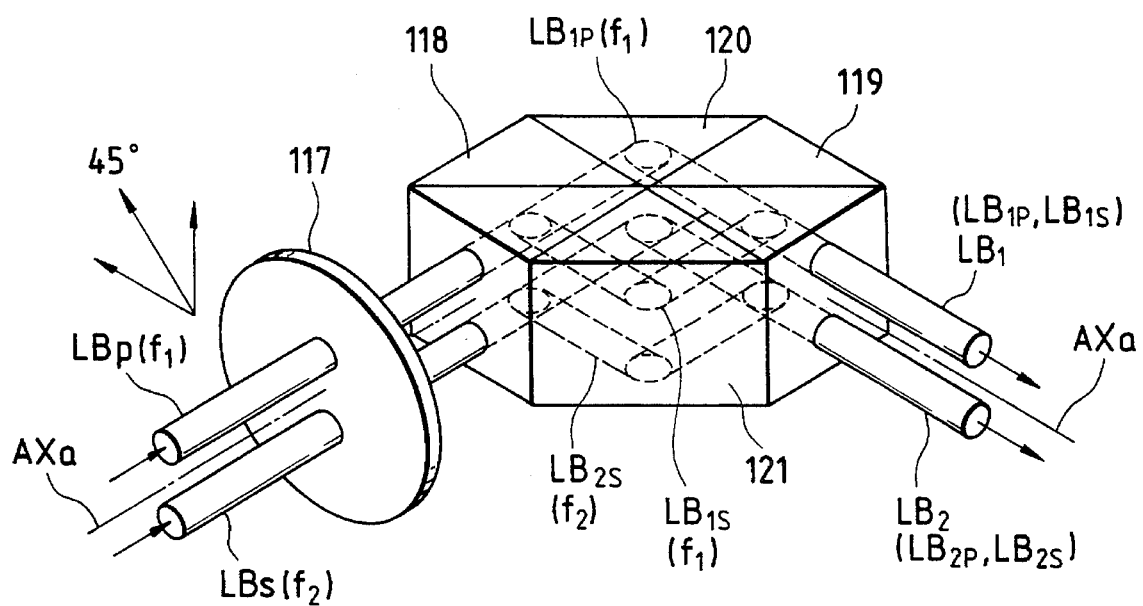

The two parallel beams $LB_P$, $LB_S$ then enter an optical system shown in FIG. 6. Although the beams $LB_P$ (P-polarized light) and $LB_S$ (S-polarized light) have the frequency difference $\Delta f$, this embodiment requires to irradiate two P-polarized beams having a frequency difference therebetween onto the reticle, and to irradiate two S-polarized beams having a frequency difference therebetween onto the wafer. In other words, the optical system of FIG. 6 functions to create four beams $LB_{1P}$, $LB_{2P}$, $LB_{1S}$, $LB_{2S}$ from the above two beams, i.e., one S-polarized beam $LB_S$ of frequency $f_1$ and one P-polarized beam $LB_P$ of frequency $f_2$.

By passing through a ½ wavelength plate 117 with the polarizing direction of 45° and polarizing beam splitters 118, 119, etc. shown in FIG. 6, the two beams $LB_S$, $LB_P$ are turned to the four beams such that the P-polarized beam $LB_{1P}$ and the S-polarized beam $LB_{1S}$ of frequency $f_1$ are synthesized in a coaxial state to become the beam $LB_1$, while the P-polarized beam $LB_{2P}$ and the S-polarized beam $LB_{2S}$ of frequency $f_2$ ($f_1-\Delta f$) are synthesized in a coaxial state to become the beam $LB_2$, these two beams $LB_1$ and $LB_2$ exiting from the polarizing beam splitter 119.

More specifically, as shown in FIG. 6, when the S-polarized beam $LB_S$ (frequency $f_2$) enters the ½ wavelength plate 117, the polarizing direction thereof is rotated through 45°. Therefore, the polarizing beam splitter 118 divides the incident beam $LB_S$ into the P-polarized beam $LB_{2P}$ and the S-polarized beam $LB_{2S}$. Likewise, because the P-polarized beam $LB_P$ (frequency $f_1$) having passed through the ½ wavelength plate 117 is rotated in the polarizing direction through 45°, the polarizing beam splitter 118 also divides the incident beam $LB_P$ into the P-polarized beam $LB_{1P}$ and the S-polarized beam $LB_{1S}$. Two pairs of divided beams are synthesized by the polarizing beam splitter 119 via right-angled prisms 120, 121 having metallic reflecting surfaces, respectively, followed by exiting from the polarizing beam splitter 119 as the two parallel beams $LB_1$, $LB_2$ again. The two beams $LB_1$, $LB_2$ are positioned symmetrically about the optical axis AXa of the alignment optical system.

Next, the two beams $LB_1$, $LB_2$ enter an optical system as shown in FIG. 7 by way of example. This optical system includes a prism 122 which causes the two incident beams $LB_1$, $LB_2$ to intersect with each other in a plane (image conjugate plane) IPm at a predetermined angle, and a lens 123 which has its forward focal plane coincident with the plane IPm. The two parallel beams $LB_1$, $LB_2$ having intersected with each in the plane IPm are condensed in the rearward focal plane (pupil conjugate plane) of the lens 123 as spots $SP_1$, $SP_2$, respectively, and then diverged to enter the pupil relay system 17A. Assuming that the principal ray of the beam $LB_1$ is $LA_1$ and the principal ray of the beam $LB_2$ is $LA_2$ as shown in FIG. 3, these principal rays $LA_1$, $LA_2$ are parallel to the optical axis AXa even between the lens 123 and the pupil relay system 17A in this embodiment.

Figure 7A:
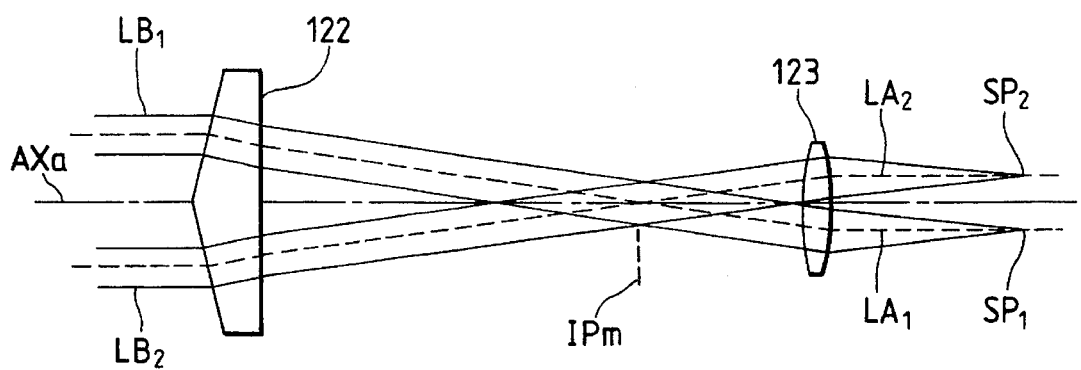

Further, since the forward focal plane of the pupil relay system 17A is made coincident with the plane containing the spots (beam waist positions) $SP_1$, $SP_2$, the spots $SP_1$, $SP_2$ shown in FIG. 7A are relayed by the pupil relay system 17A to the pupil plane at which the double-refractive material 21b is positioned, as illustrated in FIG. 3.

Figure 8:
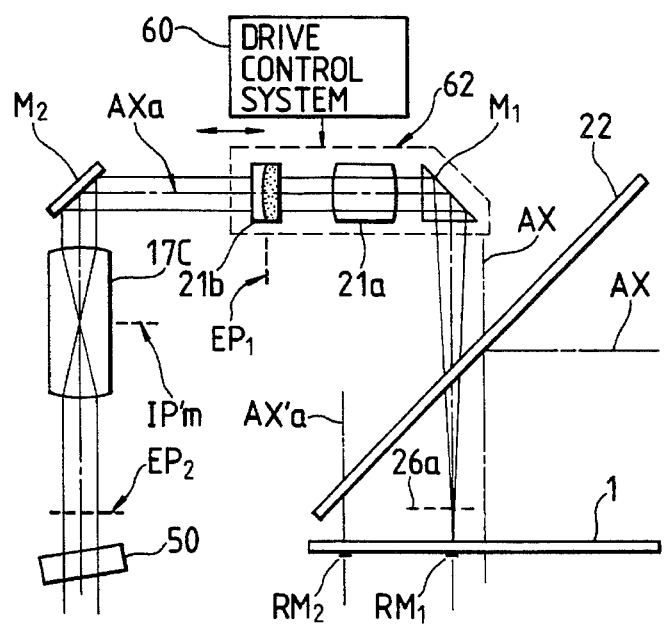
FIG. 8 is a view showing the practical structure of an alignment system in FIG. 1.

Operation of this embodiment will further be described below with reference to FIG. 8. FIG. 8 shows the configuration in which a part of the alignment optical system is made movable to be adaptable for changes in the mark position. The same components in FIG. 8 as those explained above in connection with FIGS. 1 and 3 are designated by the same reference symbols. Marks $RM_1$, $RM_2$ on the reticle 1 are different in position dependent on the kind of reticle. Usually, either one mark is formed on the same reticle. In the practical alignment optical system., the 2-focus optical system 21 comprising the object lens 21a and the double-refractive material 21b is arranged horizontally, and a mirror $M_1$ for bending the optical axis AXa at a right angle is provided in front of the object lens 21a. The mirror $M_1$, the object lens 21a and the double-refractive material 21b are fixed to a metal holder 62 in such a manner as to horizontally move together in the direction of the optical axis AXa, as the holder 62 is horizontally moved by a drive control system 60. FIG. 8 is different from FIGS. 1 and 3 in that a mirror $M_2$ and a relay system 17C are provided between the double-refractive material 21b and the parallel-planar glass 50. The relay system 17C functions to relay the pupil plane $EP_1$, in which the double-refractive material 21b is positioned, to a plane $EP_2$ near the parallel-planar glass 50. Note that IPm' designates an image conjugate plane which is conjugate to each of the reticle 1, the wafer 4 and the first intersect plane IPm of the two beams $LB_1$, $LB_2$. The mirror $M_2$ and the relay system 17C are fixed to the apparatus body, and the physical optical length between the double-refractive material 21b and the relay system 17C is changed dependent on the position of the mark RM. However, since the optical path therebetween is an afocal system, the image conjugate plane IPm' formed inside the relay system 17C is always conjugate to the reticle 1 and the wafer 4.

Now, when the mark position is changed from $RM_1$ to $RM_2$ (having the optical axis AXa') upon replacement of the reticle, the drive control system 60 moves the holder 62 horizontally to make the optical axis AXa coincident with the optical axis AXa'.

Figure 9:
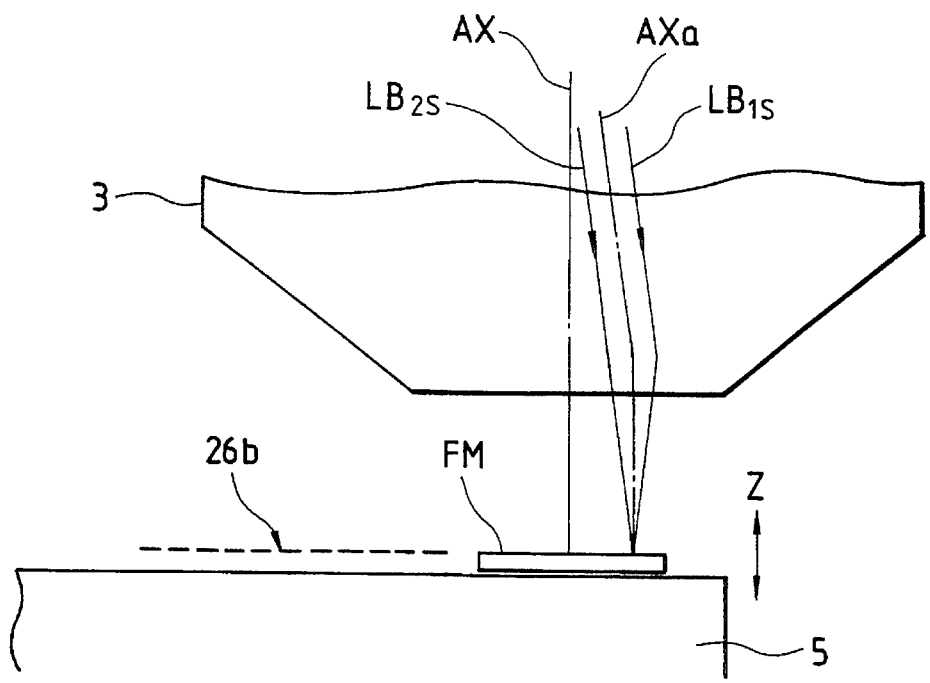
FIG. 9 is a view for explaining the manner of measuring tele-centricity on the image side of a projection lens.

At this time, a required degree of the coincidence between the two optical axes is not so strict and may be to such an extent that the two beams $LB_1$, $LB_2$ are positioned to cover the mark $RM_2$ and the adjacent window Po. Accordingly, the hardware 62 can be moved satisfactorily under control using an inexpensive position monitoring system comprised of an encoder, a position sensor and others. After the new reticle has been set and the observing position of the alignment optical system has been set as mentioned above, a reference mark plate FM having substantially the same height as that of the wafer 4 is placed on a part of the wafer stage 5 at the projected position of the mark $RM_2$ on the reticle, as shown in FIG. 9. On the reference mark plate FM, there is formed a grating mark exactly the same as the grating mark WM on the wafer 4. Therefore, the former mark is referred to as a fiducial mark hereinafter.

Since the grating elements at the center of the mark $RM_2$ on the reticle are extended linearly in the y-direction vertical to the optical axis AX of the projection lens 3 as shown in FIGS. 4A and 4B, the fiducial mark having the grating elements parallel to those of the mark $RM_2$ is positioned just below the mark $RM_2$ (i.e., below the window Po).

Under such a condition, a servo lock is effected using the interferometer 45, the motor 46 and others so that the wafer stage 5 is fixed at least in the x-directional position thereof.

Figure 2:
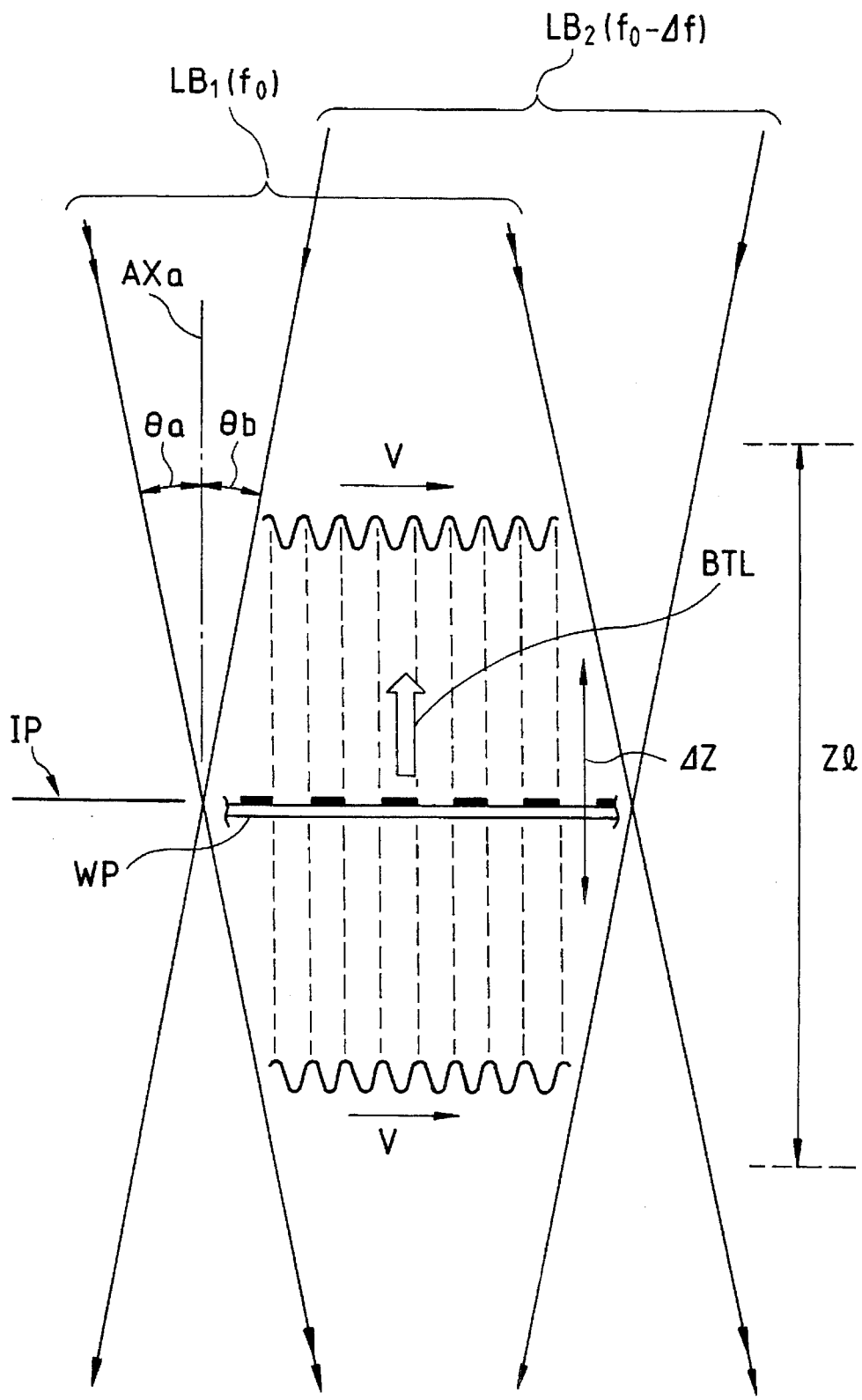
FIG. 2 is a principle view of the present invention for explaining the state of an interference fringe and a diffraction grating.
Figure 10:
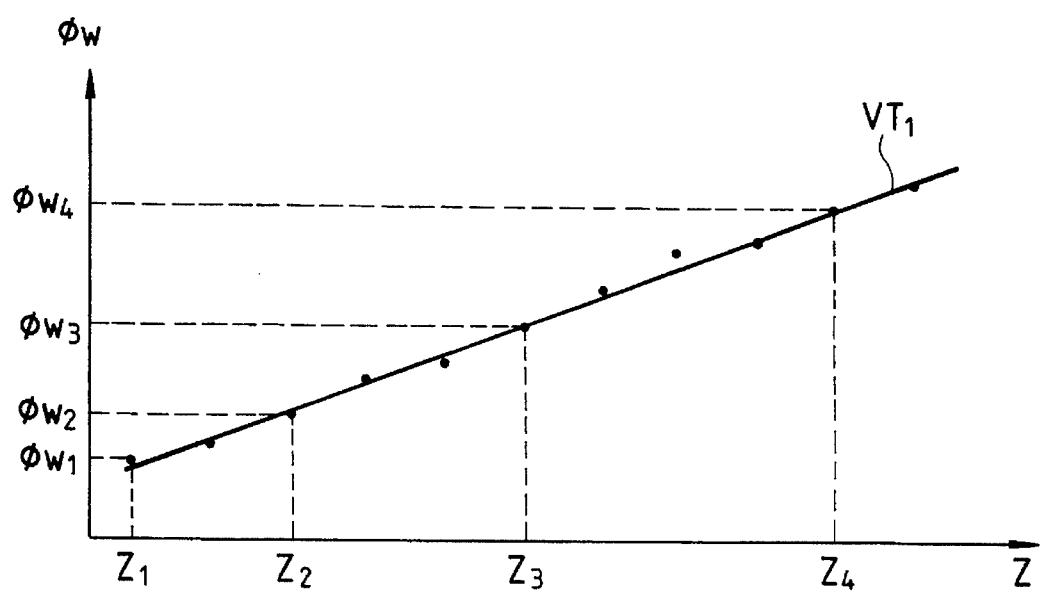
FIG. 10 is a graph plotting measured values of the tele-centricity.

Then, while vertically moving a Z-stage (not shown) included in the wafer stage 5 within a predetermined range in the z-direction (i.e., in the direction of the optical axis AX), the resulting changes of the phase difference øw between the signals DSw and the signal DR detected by the phase detecting system 40 are successively sampled for each minute displacement of the Z-stage in the z-direction. This sampling is performed by the main control system 41. At this time, though not shown in FIG. 9, the interval or spacing between the projection lens 3 and the reference mark plate FM in the z-direction is also monitored for each sampling in parallel by a known focus detecting system of the oblique incident type. Note that although the two beams $LB_{1S}$, $LB_{2S}$ are inclined in the drawing sheet with respect to the optical axis AXa of the alignment optical system upon impinging onto the reference mark plate FM in FIG. 9, they are actually inclined in a plane vertical to the drawing sheet. Monitoring the phase difference øw for each z-directional position of the Z-stage as mentioned above results in a characteristic line $VT_1$ as shown in FIG. 10. In FIG. 10, the horizontal axis represents the z-directional position of the reference mark plate FM and the vertical axis represents the phase difference øw. It is also assumed that the reference mark plate FM gradually approaches the projection lens 3 in the order of positions $Z_1$, $Z_2$, $Z_3$, $Z_4$. As has been explained before in connection with FIG. 2, because the z-directional width Zl of the detection region amounts to as large as 300 µm, the interval between the positions $Z_1$ and $Z_4$ can be set on the order of 300 µm. Further, in the case of this embodiment, because the phase difference øw can be detected continuously within a range of ± 180°, the position shift, i.e., the displacement in the x-direction, can be measured within a range of ± ½ of the grating pitch correspondingly. Supposing that the fiducial mark has the grating pitch of 8 µm and the phase detecting system 40 has resolution of 0.2°, the resolution of measuring the position shift becomes as small as 0.0022 µm. In practice, due to the effect of noise, the practical resolution is on the order of 0.01 µm (0.8° in phase). Given the interval between the positions $Z_1$ and $Z_4$ being 300 µm and the difference Δøw between the phase differences $øw_1$ and $øw_4$ at the respective positions being 1.6° (about 0.02 µm in lateral shift amount), therefore, an inclination of the characteristic line $VT_1$, i.e., an inclination of the line bisecting the two beams $LB_{1S}$ and $LB_{2S}$ or the principal rays of the two beams relative to the normal line (namely, a tele-centric inclination in the plane containing the optical axis AX of the projection lens 3) is determined as follows, supposing that the lateral shift amount corresponding to the difference Δøw is ΔX:

$$\Delta X/|Z_1-Z_4|=0.02/300 \cong 6.7\times10^{-5}$$

This numerical value represents tele-centricity of the line bisecting the two beams $LB_{1S}$, $LB_{2S}$ for alignment (i.e., parallelism between the optical axis AX and the optical axis AXa on the wafer side), and indicates superior tele-centricity with its smaller value. If the phase differences $øw_1$ and $øw_4$ are changed relatively through just 180° (corresponding to ½ of the pitch) between the positions $Z_1$ and $Z_4$, then tele-centricity would be given by:

$|\Delta X/|Z_1-Z_4|| \cong 4/300 \cong 1333 \times 10^{-5}$

After the tele-centricity has been determined in this manner, the main control system 41 judges whether or not that tele-centricity is within an allowable range. When the tele-centricity is deteriorated, the main control system 41 computes a tilt amount of the parallel-planar glass 50 based on a difference between the target tele-centricity and the measured tele-centricity, and outputs a command to the drive control system 52 for inclining the parallel-planar glass 50 by that tilt amount.

The inclination of the parallel-planar glass 50 is adjusted and set such that the positions of spot lights of the beams $LB_1$, $LB_2$ produced in each pupil plane in the alignment optical system and the projection lens 3 can be shifted or translated by the same distance in the pitch direction of the grating (or the interference fringe) while keeping the interval between the two beams constant.

With such adjustment, the incident angles θa and θb of the two beams $LB_{1S}$, $LB_{2S}$ upon the object are made coincident with each other very precisely to maintain symmetry of the incident angles on the wafer side of the projection lens 3.

The manner of manually adjusting the inclination of the parallel-planar glass 50 will be described below with reference to FIG. 11.

Figure 11:
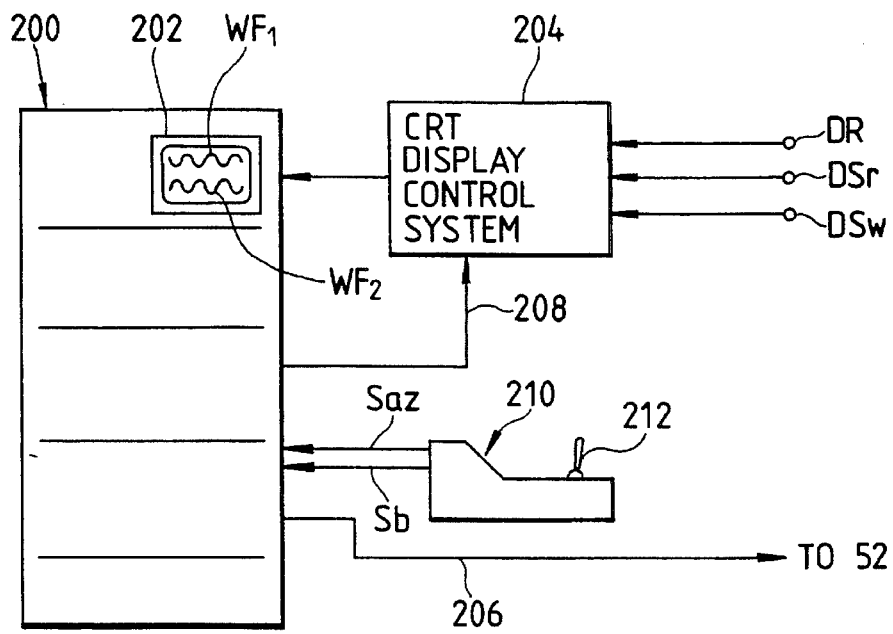
FIG. 11 is a block diagram showing one example of a stepper control system suitable for adjusting the telecentricity.

FIG. 11 shows an operation console 210 which is provided in association with the stepper shown in FIG. 1 and includes a control rack 200 and an input keyboard. A CRT (cathode-ray tube) 202 is incorporated in the control rack 200 to display mark images observed in the respective alignment systems of the stepper. Therefore, a CRT display control system 204 is given with a changing-over function such that display signals (video signals, etc.) for the mark images and the like are usually applied to the CRT 202. When adjusting the inclination of the parallel-planar glass 50, the CRT display control system 204 is changed over to receive at least one of the signals DR and DSr and the signal DSw for displaying the waveforms of those signals on the CRT 202. In other words, the changing-over is made to cause the CRT 202 to exhibit a function of two-phenomenon oscilloscope in which the vertical axis represents a voltage of DR, DSr, DSw and the horizontal axis represents a real time. In a condition that the reticle is under alignment, for example, the waveform $WF_1$ of the signal DSr and the waveform $WF_2$ of the signal DSw are displayed on the CRT 202.

Then, by bringing a joystick 212 of the console 210 down forwardly and rearwardly, the reference mark plate FM on the wafer stage 5 is moved over a predetermined range (e.g., ± 20 μm) in the vertical direction. When the joystick 212 is brought down forwardly and rearwardly, a command Saz for moving the Z-stage in the vertical direction is sent from the console 210 to the rack 200 for controlling the motor of the Z-stage via the rack 200.

Afterward, an operator then checks whether or not the phase relationship between the two waveforms $WF_1$ and $WF_2$ displayed on the CRT 202 is displaced during the vertical movement of the Z-stage.

At this time, since the waveform $WF_1$ will not be displaced in the direction of the time base or axis, the waveform $WF_2$ is displaced in the lateral direction upon the vertical movement of the Z-stage. The operator then brings the joystick 212 down to the right or left for adjusting the inclination of the parallel-planar glass 50. Upon the joystick 212 being brought down to the right or left, a command Sb corresponding to both the direction and the degree of inclination of the parallel-planar glass 50 is sent from the console 210 to the rack 200, and a prescribed drive signal 206 is sent to the drive control system 52 via the rack 200. The above process is continued until the phase relationship between the signals DSr and DSw will not change significantly during the vertical movement of the Z-stage through ± 20 μm, for example. Thereafter, the vertical movement range of the Z-stage is enlarged (e.g., up to ± 100 μm) and the similar adjustment is performed. With the above operation, the inclination of the parallel-planar glass 50 can be adjusted to an optimum degree.

Although the similar adjustment has also been performed in a conventional alignment system for projecting a beam spot onto the wafer surface, this type adjustment is called optical adjustment and a special, skilled maintenance operator has had to take a longer period of time to complete the adjustment. With this embodiment, however, since the optical adjustment is replaced by very simple operation of checking the phase relationship (possibly, the Lissajous' figure) between the beat signal waveforms displayed on the CRT 202, even ordinary stepper operators can easily accomplish the adjustment.

It is to be noted that the equivalent effect can also be obtained in this embodiment by checking the phase relationship between the signal DR and the signal DSw as with the foregoing embodiment.

As a modification of this embodiment, there will now be described the manner of adjusting the tele-centricity using the amount of vertical movement of the Z-stage and the measured value of the interferometer 45 under the alignment servo control effected through the phase detecting system 40 shown in FIG. 1. Because the phase difference between the two beat signal waveforms is checked, the above-mentioned methods are not so problematic in the manual system. But, in the case of automatic check, the phase difference may happen to jump over a range of ± 180° upon movement of the Z-stage. In this case, the measured data of tele-centricity (FIG. 10) becomes discontinuous at points just exceeding the boundary of ± 180°. This requires computational operation of giving an offset of nπ (n= 1, 2, . . . ) so as to make the measured data continuous. Meanwhile, the alignment servo control performed for the reference mark plate FM using the phase detecting system 40 enables to measure the tele-centricity dependent on only two parameters, i.e., the amount of vertical movement of the Z-stage (the measured value of a micro-sense potentiometer or the like) and the measured value of the interferometer 45.

Operation of such alignment servo control will briefly be explained below.

Initially, the Z-stage is moved to the uppermost or lowermost position. At either position, the two beams $LB_{1S}$, $LB_{2S}$ are irradiated to the reference mark plate FM and adjustment is performed so as to obtain the normal signal DSw. Then, the phase detecting system 40 determines a phase difference Δø between the two signals as given by either Δøt=DR−DSw or Δøt=DSr−DSw, and the wafer stage 5 is driven under the alignment servo control so that the phase difference Δøt becomes zero. Afterward, the servo lock keeps working on the wafer stage 5 so as to maintain the phase difference Δøt at zero.

Then, the Z-stage is moved in one direction through a predetermined detection range (e.g., 20 μm). During the movement, the measured value of the interferometer 45 is sampled for each constant interval of the Z-position (e.g., for each 5 μm). It is preferable to repeat the above operation by moving the Z-stage through the predetermined detection range upwardly and downwardly several times.

The resulting sampling data have a tendency similar to that in FIG. 10. What is different from FIG. 10 is only in that the vertical axis represents the measured value of the interferometer 45. The subsequent adjustment of the parallel-planar glass 50 may be performed either automatically or manually.

Since the above method is to measure the amount by which the reference mark plate FM is laterally shifted along the wave front of the interference fringe distributed in the z-direction, there is no need of considering a jump of the phase and so forth. This leads to an advantage that regardless of any degree of tele-centricity, the Z-stage can be moved vertically over a wide range without preliminary check.

With the above embodiment using the stepper of FIG. 1, by providing several sets of similar alignment systems, though illustrated only one set, it becomes possible to make alignment and measure the error in magnification or scaling factor between the reticle 1 and the wafer 4 in the x-, y- and rotational directions. Furthermore, since the phase detection is performed in this embodiment with the reference signal DR as a base, the reticle stage can be brought under the servo lock at the time of exposing a first layer to the wafer 4 (i.e., first printing), for example, so that the phase difference between the signal DSr obtained from the mark RM on the reticle 1 and the reference signal DR always takes a constant value during the exposure operation.

Next, the configuration of a stepper according to a modified embodiment of the present invention will be described below with reference to FIGS. 12A and 12B.

Figure 12A:
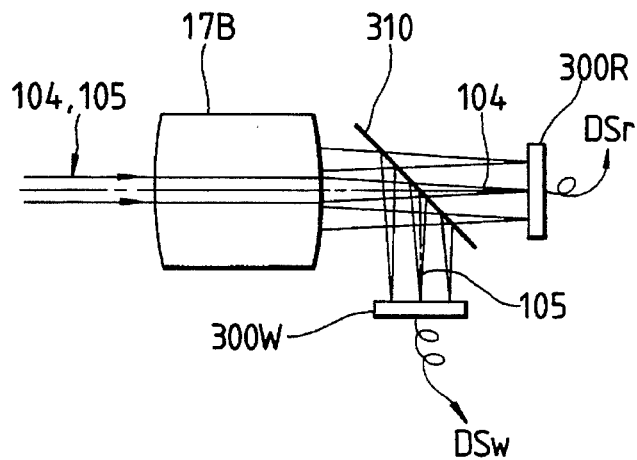
FIGS. 12A and 12B are views showing the structure of a light receiving system according to a modification of the first embodiment.
Figure 12B:
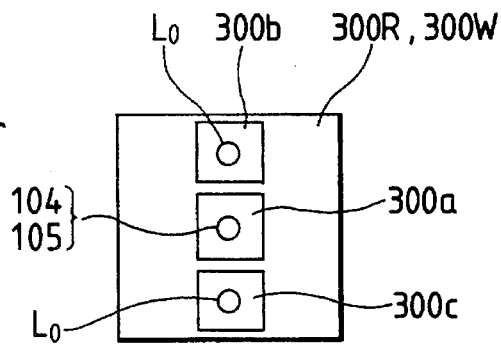

FIGS. 12A and 12B show only a rear portion of the pupil relay system 17B shown in FIG. 3. The remaining configuration is the same as that of FIG. 3. In this modification, a pair of divided light receiving elements 300R, 300W are directly disposed at the position where the spatial filter 23 was disposed behind the pupil relay system 17B, thereby to receive the diffracted lights (beat signals) 104, 105 in the pupil plane of the system. More specifically, as shown in FIG. 12A, a polarizing beam splitter 310 is obliquely provided behind the pupil relay system 17B so that the diffracted lights 105 from the wafer 4 are reflected by the beam splitter 310 to reach the light receiving element 300W because of the S-polarized components thereof. On the other hand, the diffracted lights 104 from the reticle 1 pass through the beam splitter 310 and reach the light receiving element 300R because of the P-polarized components thereof. The light receiving elements 300R, 300W each have light receiving surfaces as shown in FIG. 12B which comprise a surface 300 at the center for receiving the diffracted lights 104 or 105, and a pair of surfaces 300b, 300c above and below (or on the right and left sides) for receiving the 0th order lights $L_0$, respectively. These three light receiving surfaces 300a, 300b, 300c are electrically insulated from one another and output respective opto-electric signals separately. Also, the three light receiving surfaces 300a, 300b, 300c are arranged to be substantially conjugate to the pupil plane of the system, i.e., the pupil EP of the projection lens 3.

Accordingly, the opto-electric signal from the light receiving surface 300a of the light receiving element 300R provides the signal DSr, and the opto-electric signal from the light receiving surface 300a of the light receiving element 300W provides the signal DSw. Then, the phase detection can be performed in exactly the same manner as that in the foregoing embodiment.

As will be apparent from the optical paths shown in FIG. 3, the diffracted lights 104, 105 (and the 0th order lights $L_0$) are all condensed to minute spots (beam waists) in the pupil plane of the system. Therefore, the area of each light receiving surface 300a, 300b, 300c can be set vary small, which is advantageous in improving response to the light receiving element. Further, since the numerical apertures (N.A.) of the diffracted lights 104, 105 in the pupil plane are so small (e.g., 0.01 or less) that by selecting the area of each light receiving surface 300a slightly larger than the precise spot size of the diffracted lights 104, 105, the position setting accuracy for the light receiving elements 300R, 300W in the direction of the optical axis is not required to be so strict, thereby facilitating manufacture of the apparatus. This means that the system is also adaptable for a shift in the pupil conjugate relation caused by a change in position of the object lens 21a during alignment. Moreover, since the parallel-planar glass 50 is provided in the region where the light transmitting paths for the two beams $LB_1$, $LB_2$ and the light receiving paths for the diffracted lights 104, 105 are coexistent, the relative positional relationship between the diffracted lights 104, 105 and the light receiving surfaces 300a will not vary irrespective of any inclination of the parallel-planar glass 50.

In the above-explained first embodiment and the modified embodiment of the present invention, the parallel-planar glass 50 for adjusting tele-centricity is arranged at a position slightly nearer to the light source side than the pupil $EP_1$ of the object lens 21a. But, the parallel-planar glass 50 may be arranged between the pupil $EP_1$ and the object lens 21a. More preferably, it is arranged to be coincident with the pupil $EP_1$ or the plane conjugate to the pupil $EP_1$. Therefore, where the double-refractive material (2-focus element) 21b is entirely formed into a parallel-planar shape as shown in FIGS. 1, 3 and 8, the element 21b may be set tiltable to be used for adjusting tele-centricity.

Note that the position of the parallel-planar glass 50 is different between FIG. 1 and FIG. 3. Where opto-electric detection is performed in the pupil space as the case of FIG. 12, the glass 50 should be disposed in the common optical paths for the transmitted light beams $LB_1$, $LB_2$ and the diffracted lights 104, 105. Meanwhile, where opto-electric detection is performed in the image space as the case of FIG. 3, the glass 50 may be located at either position of FIG. 1 and FIG. 3.

Another modified embodiment of the present invention will be described below with reference to FIG. 13 along with FIGS. 5 and 6.

While the parallel-planar glass 50 has been employed for adjusting tele-centricity in the foregoing embodiments, this modified embodiment permits adjustment of tele-centricity with higher accuracy without resorting to mechanical drive. However, the adjustable range of telecentricity is limited to be smaller than that in the case of using the parallel-planar glass. Accordingly, the method of adjusting tele-centricity with this modified embodiment is effective for fine adjustment to be made after coarse adjustment using the parallel-planar glass.

As shown in FIG. 5, the two beams $LB_P$, $LB_S$ are diffracted lights of 1st order exiting from the AOM's 73, 74, respectively. The two beams $LB_P$, $LB_S$ are usually set to be positioned in point symmetry relation about the optical axis AXa. Drive signals $SF_1$, $SF_2$ for the two AOM's 73, 74 are selected to have their frequencies of 80.025 MHz and 80.000 MHz, respectively, for example.

With the frequency difference being as low as 25 KHz, diffraction angles of the 1st order diffracted lights from the two AOM's 73, 74 are equal to each other. Therefore, by aligning the directions of those diffraction angles at the two AOM's 73, 74 in the same one in the plane which contains the optical axis AXa and the beams $LB_P$, $LB_S$, and then increasing or decreasing the frequencies of the drive signals $SF_1$, $SF_2$ by the same amount, the point symmetry relation about the optical axis AXa can be changed while keeping substantially constant the interval between the beams $LB_P$ and $LB_S$ after they have been synthesized by a beam splitter 106 (76 in FIG. 5).

Figure 7B:
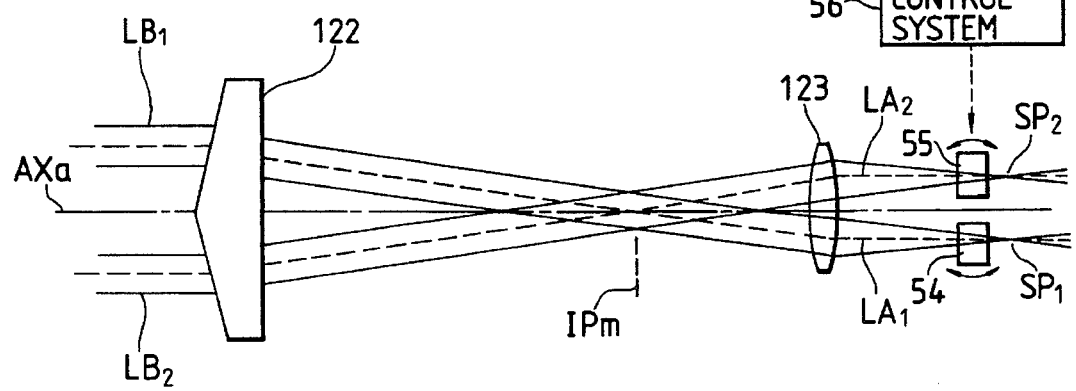
FIG. 7B is a view showing a frequency shifter according to another embodiment.
Figure 13A:
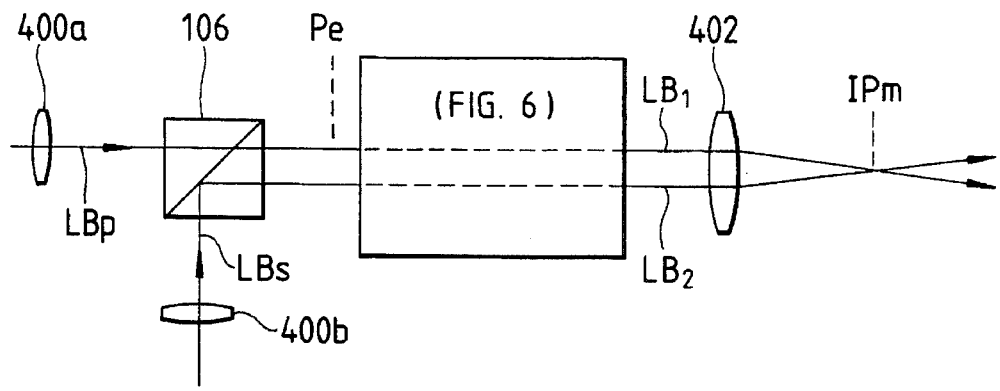
FIGS. 13A and 13C are views showing optical systems according to other embodiments of the present invention, respectively.

In addition, this modified embodiment can be implemented effectively by providing convex lenses between the AOM 73 and the beam splitter 76 and between the AOM 74 and the beam splitter 76, respectively, in FIG. 5 and replacing the prism 122 in FIG. 7 by a convex lens. These convex lenses are all coupled with one another to meet the predetermined relationship among their focal lengths. It is also desired that the diffraction points on the AOM's 73, 74 and the image conjugate plane IPm in FIG. 7B are conjugate to each other. FIG. 13A schematically illustrates the configuration mentioned above, by showing the optical paths from the beam splitter 76 in FIG. 5 to the image conjugate plane IPm in FIG. 7. Convex lenses 400a, 400b, 402 are newly provided in the configuration of FIG. 13A. The remaining configuration (in particular, that of FIG. 6) may be of the same. Pe designates a pupil conjugate plane in which the two beams $LB_P$, $LB_S$ are condensed to spots under the action of the convex lenses 400a, 400b, respectively. The beams $LB_1$, $LB_2$ exiting from the convex lens 402 each become a parallel flux and intersect with each other in the plane IPm similarly to the above embodiment of FIGS. 5 and 7.

Figure 13B:
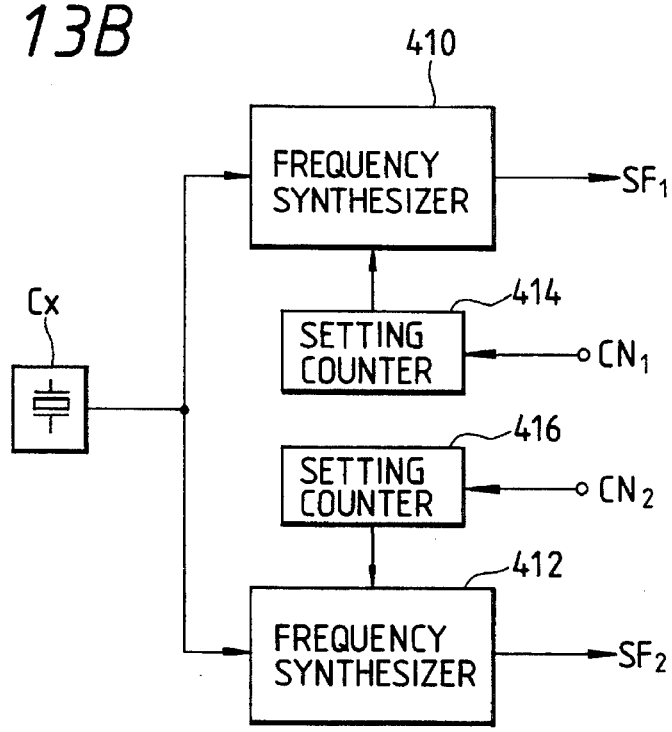
FIG. 13B is a block diagram showing one example of a drive circuit for a frequency shifter used in cooperation with the optical system of FIG. 13A.

FIG. 13B is a block diagram schematically showing the configuration of a circuit for generating the drive signals $SF_1$, $SF_2$. The drive signals $SF_1$, $SF_2$ are created by frequency synthesizers 410, 412, respectively, both sharing a crystal oscillator Cx. Output frequencies are set by counters 414, 416 for selecting the frequency dividing ratios or the like, and the setting values $CN_1$, $CN_2$ are provided from the main control system 41 (FIG. 1), etc. The setting values $CN_1$, $CN_2$ are decided such that the frequency difference between the drive signals $SF_1$, $SF_2$ becomes 25 KHz.

When the setting values $CN_1$, $CN_2$ are increased or decreased by the same amount to change the frequencies of the signals $SF_1$, $SF_2$ on the order of about 10% relative to the original values, the diffraction angles of the two beams $LB_P$, $LB_S$ are also changed on the order of about 10% relative to the original values when exiting from the AOM's 73, 74. Since the diffraction points at the AOM's 73, 74 are substantially in image conjugate relation, the inclinations (incident angles) of the two beams $LB_1$, $LB_2$ reaching the reticle 1 or the wafer 4 are varied in the same direction by the same amount. In other words, as the incident angle of the beam $LB_1$ is increased by 10% from the original value, the incident angle of the beam $LB_2$ is decreased by 10% from the original value. As a result, only tele-centricity can be adjusted without varying the intersect angle of the two beams $LB_1$, $LB_2$.

With this modified embodiment including no mechanical moving part, a period of time necessary for adjustment is remarkably shortened. Therefore, when the position of the mark RM is changed upon replacement of the reticle 1 as shown in FIG. 8, a tele-centricity adjusting time required after setting the holder 62 can be reduced to improve the availability factor of the apparatus.

Thus, in this modified embodiment, the two AOM's 73, 74 have a function corresponding to the first optical member of the present invention. In the case of adjusting tele-centricity by the use of the AOM's 73, 74 as mentioned above, the tele-centricity is corrected only on the side of light transmitting paths for the two beams $LB_1$, $LB_2$ and hence the light receiving paths, i.e., the diffracted lights 104, 105, are changed in position to some extent in the pupil plane. However, if the adjustment using the AOM's 73, 74 is limited to a small range in application, the positional changes of the diffracted lights can sufficiently be accommodated just by setting the size of each light receiving surface 300a in FIG. 12B in anticipation of such positional changes. It should be understood that in the system of providing the aperture plate 25' in the image conjugate plane and receiving the beat signals by the opto-electric detectors 25 as shown in FIG. 3, the system is not affected at all even when changing tele-centricity of the beams $LB_1$, $LB_2$ by the AOM's 73, 74.

Other modified embodiments are as follows.

(1) The two beams $LB_1$, $LB_2$ irradiated to the grating mark RM or WM may be different in their polarizing directions. Supposing that the beam $LB_1$ is given by a P-polarized light and the beam $LB_2$ is given by an S-polarized light, for example, no interference fringe is produced on the grating mark, but the beat signals can be obtained in a like manner by placing a polarizing plate (analyzer) such as a double-refractive element before each of the light receiving elements 19, 25, 300.

(2) The laser source 10 may be constituted by a Zeeman laser in order to provide the frequency difference between the beams $LB_1$ and $LB_2$. In this case, the AOM's 73, 74 can be omitted.

(3) In the case of a homodyne mode in which the frequency difference between the beams $LB_1$ and $LB_2$ is set zero, the adjustment of both tele-centricity and intersect angle can also be performed in a like manner.

(4) Since use of the AOM's makes it possible to simply change over between a homodyne mode and a heterodyne mode just by changing frequencies of the respective drive signals, the alignment sequence for scanning the wafer stage 5 under the homodyne mode and the servo lock of the wafer stage during exposure under the heterodyne mode can be handled selectively at a high changing-over speed.

(5) In the alignment system of the TTR, TTL type, the 2-focus element 21a may be omitted by selecting the wavelength of the two beams $LB_1$, $LB_2$ approximate to that of the exposure light.

In this case, an illumination field diaphragm is disposed in the image conjugate plane IPm along the light transmitting paths for the beams $LB_1$, $LB_2$, so that an irradiated region of the resist layer on the wafer is limited to the area of the mark WM.

(6) When the diffraction angles of the beams are drifted upon heating of the AOM's 73, 74, a degree of the heating may be monitored by a temperature sensor and the frequencies of the drive signals $SF_1$, $SF_2$ may be automatically adjusted dependent on a rise of the monitored temperature so as to hold the symmetry of incident angles of the beams $LB_1$, $LB_2$ constant.

According to the above embodiments of the present invention, as described above, in the alignment optical system or the like for irradiating two beams in such a manner is to intersect with each other on a grating, the first optical member is provided which can shift positions of the two beams in the pupil plane of an object optical system (projection optical system) by the same amount in the array direction of the grating, with the result that tele-centricity between the two beams can easily be adjusted.

This leads to an advantageous effect that the accuracy resulted in position detection using the grating and the interference fringe can steadily be assured while keeping the intrinsic benefit of high resolution.

Another particular effect is in that even when the interference fringe and the grating are relatively displaced to a large extent in the direction of the optical axis, very high tele-centricity can be maintained, thereby causing no trouble in the process of position detection.

This permits to eliminate the focusing (AF) operation during alignment, which has been implemented in the conventional steppers and the like, thus resulting in an advantage that the throughput can be improved in the sequence combined with the E. G. A. (enhancement global alignment) method. Further, in proximity exposure equipment (e.g., X-ray steppers using SOR's) where the setting accuracy of a gap and the interval setting accuracy between a light source and a mask are relatively low, it becomes possible to immediately enter the process of alignment and exposure after just setting the mask and the wafer substantially in a mechanical manner. As a result, an increase in the throughput can be expected similarly.

The configuration of a 2-beam frequency shifter 12' according to another modified embodiment will be described below with reference to FIGS. 5, 6 and 7B. However, explanation of the-same configuration as that in the foregoing embodiments is omitted here. In FIG. 7B, parallel-planar glasses 54, 55 are arranged near the spots $SP_1$, $SP_2$ to be tiltable independently of each other, respectively, thereby constituting the second optical member of the present invention. In the case of FIG. 7B, the parallel-planar glasses 54, 55 have their centers of rotation normal to the drawing sheet.

Further, in order to make the foreard focal plane of the pupil relay system 17A coincident with the plane containing the spots $SP_1$, $SP_2$, the spots $SP_1$, $SP_2$ shown in FIG. 7B are relayed by the pupil relay system 17A to the pupil plane in which the double-refractive material 21b is positioned, as shown in FIG. 3.

The parallel-planar glasses 54, 55 are disposed in the pupil spaces of the two beams $LB_1$, $LB_2$ (i.e., in the portions where the beams are converged and diverged), respectively, and separately controlled in their inclinations by a drive control system 56. This permits the distances of the two spot lights $SP_1$, $SP_2$ from the optical axis AXa to be adjusted independently of each other. Although the parallel-planar glasses 54, 55 are provided for the two beams $LB_1$, $LB_2$ in this modified embodiment, respectively, only one of the parallel-planar glasses 54, 55 may be set tiltable and the other one may by set stationary, because of the presence of the parallel-planar glass 50 for adjusting tele-centricity.

Figure 15:
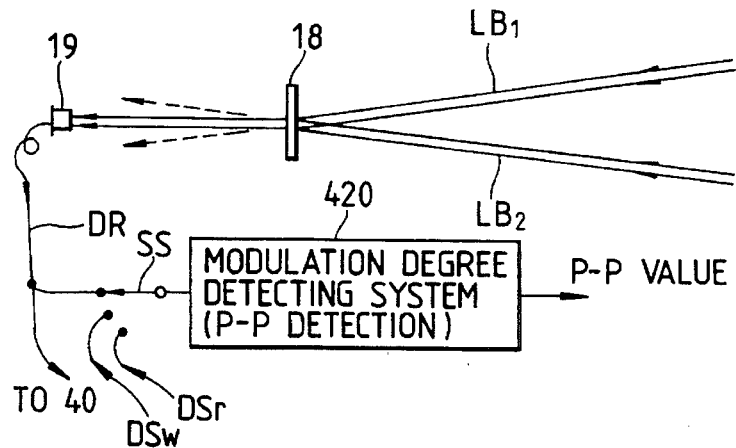
FIG. 15 is a view showing the connection manner for a modulation degree detecting system.

FIG. 15 shows the state in the vicinity of the reference grating plate 18 shown in FIG. 1 for producing the reference signal DR. The reference grating plate 18 is disposed at a focal position of the lens 16 in FIG. 1, and the two beams $LB_1$, $LB_2$ enters the reference grating plate 18 at a predetermined intersect angle. The diffracted lights of 1st order (i.e., a beat signal) vertically passing through the reference grating plate 18 impinge onto the light receiving element 19. The reference signal DR is sent to the phase detecting system 40 and also to a modulation degree detecting system 420 via a switch SS. The modulation degree detecting system 420 (hereinafter referred to as a P—P detecting system 420) is to detect a peak-to-peak value (P—P value) of the beat signal (25 KHz). The switch SS functions to alternatively select one of the measured signals DSr, DSw as well as the reference signal DR for detecting the P—P value in a switching manner. But, the P—P detecting system 420 may separately be provided for each of all the signals DR, DSr, DSw so as to detect the P—P values of the respective signals at the same time.

The P—P detecting system 420 is employed to detect a modulation degree (amplitude) of each signal DR, DSr, DSw for determining fluctuations in the intersect angle of the two beams $LB_1$, $LB_2$. As explained before in connection with FIG. 2, if the intersect angle of the two beams $LB_1$, $LB_2$ on the grating is minutely fluctuated, the pitch of the interference fringe on the grating is also minutely changed correspondingly.

Therefore, when inclining the parallel-planar glass 50 to adjust tele-centricity, the P—P detecting system 420 monitors the P—P value of the signal DSw (or DSr) concurrently, thereby confirming that the P—P value will not change to a large extent.

During the adjustment of tele-centricity, the reference mark plate FM on the wafer stage is used and hence unstable factors (such as the resist layer or deformation of the mark) as encountered in the mark WM on the wafer are not present. It is therefore expected that the P—P value of the signal DSw has good reproducibility for a long term as long as the light intensity of the laser beams $LB_1$, $LB_2$ will not fluctuates. In view of the above, under a condition that the signal DSw is obtained using the reference mark plate FM, the P—P value of the signal DSw is detected by the P—P detecting system 420. If the P—P value is reduced below a predetermined value, the parallel-planar glasses 54, 55 are adjusted via the drive control system 56 shown in FIG. 7B to minutely change the interval between the two beams $LB_1$, $LB_2$ in the pupil plane so that the predetermined P—P value may be resulted. Such a change of the interval between the beams $LB_1$, $LB_2$ in the pupil plane varies the intersect angle of the two beams $LB_1$, $LB_2$ on the object surface (grating) and also the pitch of the interference fringe IFw.

That fine adjustment of the intersect angle is more efficient when implemented in combination with the adjustment of tele-centricity. The fine adjustment of the intersect angle can simply be performed by, for example, the so-called mountain climbing method which comprises the steps of continuously tilting the parallel-planar glasses 54, 55 as the second optical member over a certain range and finding the point in the range at which the P—P values becomes maximum.

Furthermore, the P—P detecting system 420 may be changed over in its mode by shifting the switch SS to monitor the signal DSw during the alignment operation of the wafer, thereby determining reliability of the detected mark position on the basis of the P—P value at the time of mark detection. The marks WM associated with the plural shot regions of the wafer may heavily be damaged due to the preceding process dependent on their positions over the wafer (particularly, in the peripheral portions). The above use of the P—P detecting system 420 is also effective in previously finding such damage of any mark. Accordingly, in the enhancement global alignment (E. G. A.) method of measuring the positions of the marks WM (for x- and y-directions) associated with the 3–9 shot regions on the wafer and estimating the positions of all the shot regions on the wafer by a static technique in advance, it becomes possible to employ those position values among the measured marks WM, of which P—P values at the time of detection are within a certain range, for the static processing.

With the above embodiments using the stepper of FIG. 1, by providing several sets of similar alignment systems, though illustrated only one set, it becomes possible to make alignment between the reticle 1 and the wafer 4 in the x-, y- and rotational directions. Further, since the phase detection is performed in the embodiments with the reference signal DR as a base, the reticle stage can be brought under the servo lock at the time of exposing a first layer to the wafer 4 (i.e., first printing), for example, so that the phase difference between the signal DSr obtained from the mark RM on the reticle 1 and the reference signal DR always takes a constant value during the exposure operation.

Next, another modified embodiment of the present invention will be described with reference to FIG. 13C along with FIGS. 5 and 6.

Figure 13C:
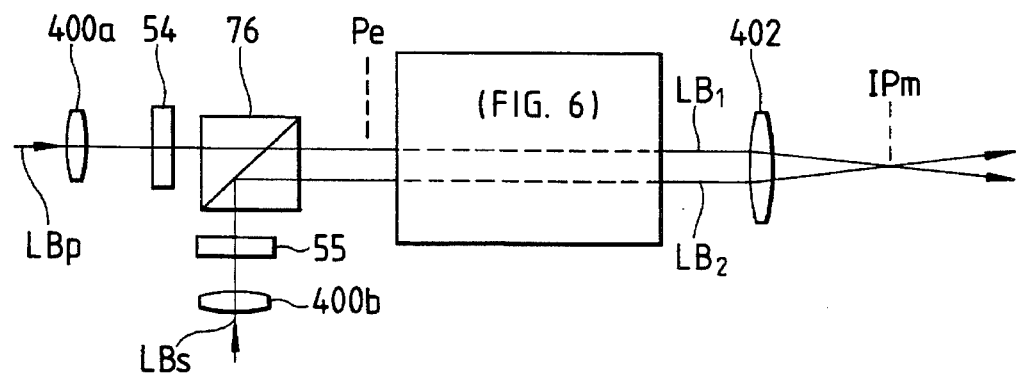

FIG. 13C shows a modification of the arrangement of the parallel-planar glasses 54, 55 for adjusting the intersect angle of the two beams $LB_1$, $LB_2$. More specifically, convex lenses 400a, 400b are provided between the AOM 73 and the beam splitter 76 and between the AOM 74 and the beam splitter 76, respectively, and the parallel-planar glasses 54, 55 are provided between those convex lenses 400a, 400b and the beam splitter 76, respectively. Then, the parallel-planar glasses shown in FIG. 7B are omitted, and the prism 122 shown in FIG. 7B is replaced by a convex lens 402.

These convex lenses 400a, 400b, 402 are all coupled with one another to meet the predetermined relationship among their focal lengths, and the diffraction points (deflecting origins) on the AOM's 73, 74 are set substantially conjugate to the image conjugate plane IPm in FIG. 13C (FIG. 7B). Between the beam splitter 76 and the convex lens 402, there is similarly disposed the optical system as shown in FIG. 6. Pe designates a pupil conjugate plane in which the two beams $LB_P$, $LB_S$ are condensed to spots under the action of the convex lenses 400a, 400b, respectively. Hence, the beams $LB_1$, $LB_2$ exiting from the convex lens 402 each become a parallel flux and intersect with each other in the plane IPm.

In this modified embodiment, because the parallel-planar glasses 54, 55 can also be disposed in the pupil space, the interval between the two beams $LB_1$ and $LB_2$ in the pupil $EP_1$ can be changed arbitrarily to adjust the intersect angle thereof.

Moreover, in the case where the diffraction points on the SOM's 73, 74 are conjugate to the image conjugate plane IPm and the arrangement of FIG. 5 is adopted like this modified embodiment, when frequencies of the drive signals $SF_1$, $SF_2$ applied to the AOM's 73, 74 are increased or decreased by the same amount (10%– several 10's%) while keeping the frequency difference $\Delta f$ between the two drive signals constant, the positions of the two beams $LB_S$, $SF_P$ in the plane Pe are shifted by the same distance in the same direction. This means that the fine adjustment of tele-centricity can be made by the AOM's 73, 74 similarly to the parallel-planar glass 50. It is therefore possible to perform the adjustment of tele-centricity by increasing or decreasing the drive signals $SF_1$, $SF_2$ for the two AOM's 73, 74, and to perform the adjustment of the intersect angle by correcting the inclination(s) of both (or either one) of the parallel-planar glasses 54, 55. Either adjustment employs information (phase information and amplitude information) of the signal DSw from the opto-electric detector 25.

Next, another modified embodiment of the present invention will be described with reference to FIGS. 16A and 16B. This embodiment is directed to utilize the 0th order lights $L_0$ which are not used in the intrinsic or correct detection of the grating mark.

Figure 16A:
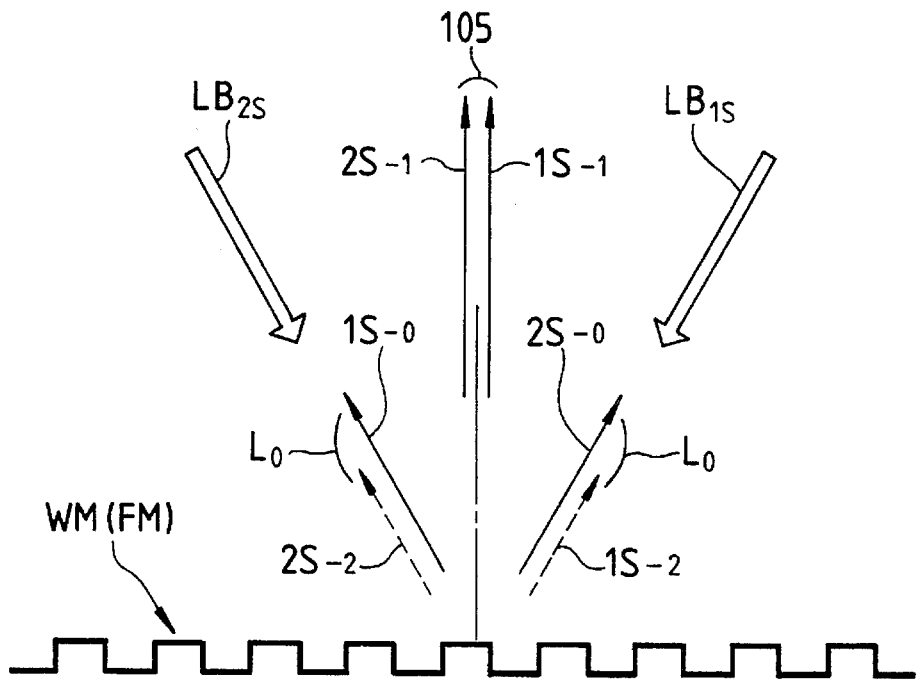
FIGS. 16A and 16B are explanatory principle views of another embodiment of the present invention, showing the state of producing the diffracted lights and the waveform of a beat signal of a 0th order beam.

FIG. 16A is a view showing the state of the 0th order beams $L_0$ produced from the mark WM (or the reference mark FM) on the wafer. The diffracted lights 105 vertically reflecting from the grating comprise a +1 order diffracted light $1S_{-1}$ produced upon irradiation of the beam $LB_{1S}$ of frequency $f_1$ and a −1 order diffracted light $2S_{-1}$ produced upon irradiation of the beam $LB_{2S}$ of frequency $f_2$, these 1st order diffracted lights interfering with each other. On the other hand, the 0th order beam $L_0$ proceeding exactly in opposite relation to the beam $LB_{1S}$ comprises a regularly reflected light $2S_{-0}$ of the beam $LB_{2S}$ and a 2nd order diffracted light $1S_{-2}$ produced upon irradiation of the beam $LB_{1S}$, these reflected and diffracted lights interfering with each other. The 0th order beam $L_0$ proceeding exactly in opposite relation to the beam $LB_{2S}$ comprises a regularly reflected light $1S_{-0}$ of the beam $LB_{1S}$ and a 2nd order diffracted light $2S_{-2}$ produced upon irradiation of the beam $LB_{2S}$, these reflected and diffracted lights interfering with each other.

Figure 14A:
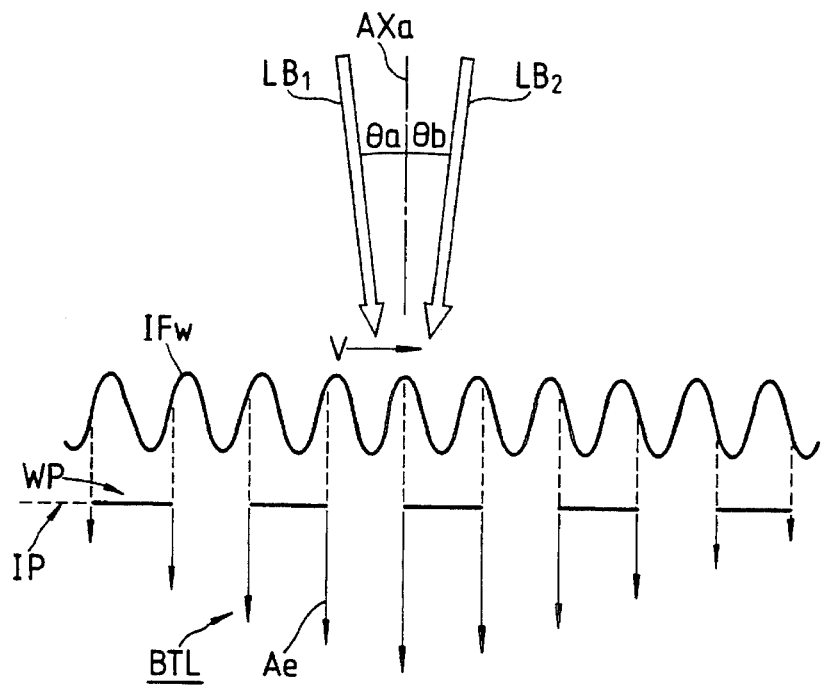
FIG. 14A is a principle view of the present invention for explaining the state of the interference fringe and the grating.
Figure 14B:
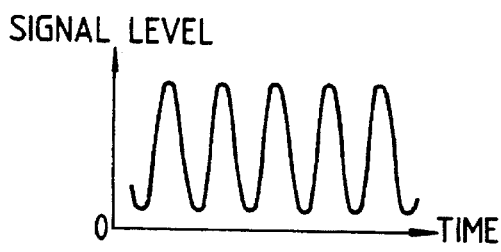
FIGS. 14B and 14C are principle views showing examples of the signal waveform, respectively.
Figure 14C:
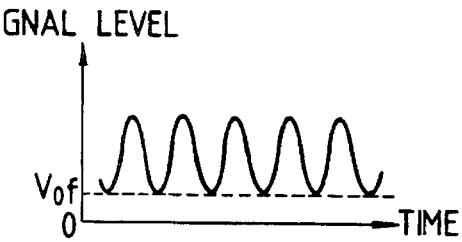
Figure 16B:
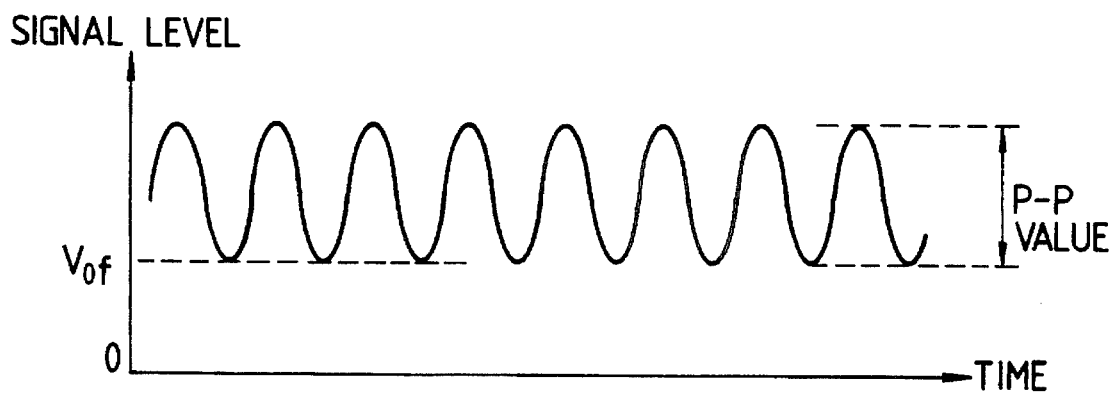

Accordingly, when the grating is placed in the intersecting region of the two beams $LB_{1S}$, $LB_{2S}$, the opto-electric signal from the light receiving surface 300b and the opto-electric signal from the light receiving surface 300c, these surfaces receiving the 0th order beams $L_0$, each become an AC signal having a beat frequency as shown in FIG. 16B. Because of a large difference in intensity between the regularly reflected light and the 2nd diffracted light, the AC signal has the waveform with a relatively great offset Vof. This waveform can be regarded as one having a low degree of modulation similarly to the waveform shown in FIG. 14C.

Therefore, the light intensity ratio between the regularly reflected light $2S_{-0}$ ($1S_{-0}$) and the 2nd order diffracted light $1S_{-2}$ ($2S_{-2}$) can be estimated by applying each of the opto-electric signals from the light receiving surfaces 300c, 300b to the modulation degree detecting system 420 shown in FIG. 11, and determining the P—P value and the offset value Vof (or an average peak value). Based on the two opto-electric signals, it becomes also possible to judge that any irregularity or failure occurs in the mark WM, if the resulting light intensity ratios are different from each other. In this case, it is further guessed that a difference in light intensity occurs between the 1st order diffracted lights $1S_{-1}$ and $2S_{-1}$ constituting the diffracted lights 105, whereby a modulation degree of the output signal DSw is also changed.

When estimating irregularity of the mark WM, the two 0th order beams $L_0$ are preferably used because utilization of the lower-order diffracted lights is advantageous from the standpoint of available energy.

Figure 17:
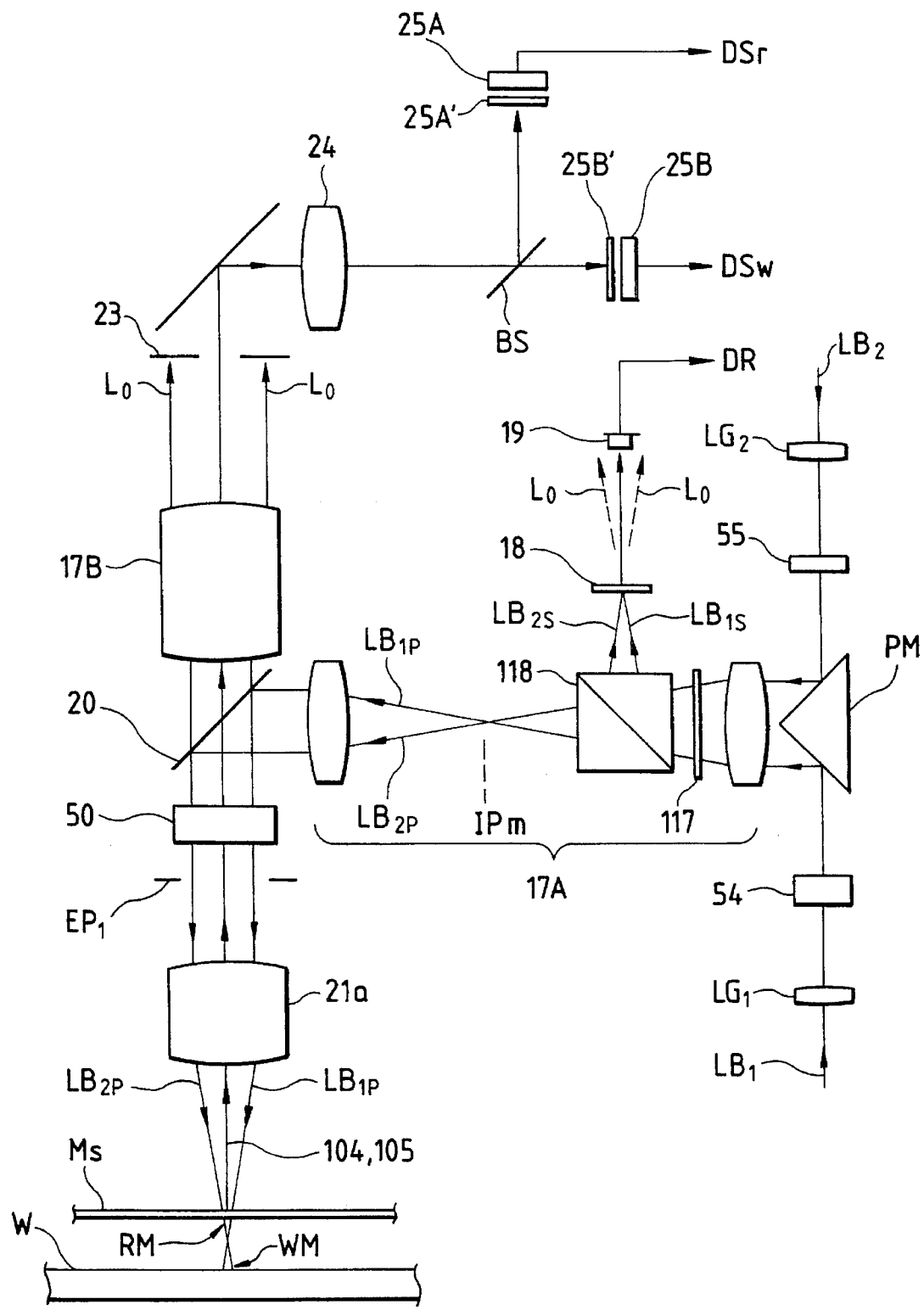
FIG. 17 is a view showing the configuration of an aligner according to another modified embodiment.

Another modified embodiment of the present invention will be described below with reference to FIG. 17. This modified embodiment is related to a position detecting apparatus (alignment system) suitable for proximity equipment in which a mask Ms and a wafer W are arranged close to each other. Two parallel beams $LB_1$, $LB_2$ having different frequencies from each other and the same polarized component are condensed into the pupil conjugate planes via lenses $LG_{1S}$, $LG_{2S}$, respectively. Parallel-planar glasses 54, 55 are provided near the respective pupil conjugate planes in a tiltable manner. The parallel-planar glasses 54, 55 are different in thickness and serve as the second optical member of the present invention. The two beams $LB_1$, $LB_2$ are then reflected by a right-angled prism mirror PM to be synthesized with their principal rays being parallel to and spaced from each other by a certain interval, followed by entering a relay system 17A. In the interior (image space) of the relay system 17A, there are disposed a ½ wavelength plate 117 and a polarizing beam splitter 118 which are similar to those shown in FIG. 6. S-polarized beams $LB_{1S}$, $LB_{2S}$ reflected by the polarizing beam splitter 118 each become a parallel flux and enter a reference grating plate 18 at a predetermined intersect angle. A light receiving element 19 is arranged to receive only a beat signal of ± 1st order diffracted lights ($1S_{-1}$, $2S_{-2}$) passing through the reference grating plate 18, but not to receive the 0th order beams $L_0$. P-polarized beams $LB_{1P}$, $LB_{2P}$ passing through the polarizing beam splitter 118 each become a parallel flux and intersect in the image conjugate plane IPm. After exiting from the relay system 17A, the beams $LB_{1P}$, $LB_{2P}$ are reflected by a beam splitter 20 to enter a tele-centric object lens 21a for alignment via a parallel-planar glass 50 (first optical member) for adjusting tele-centricity. On this occasion, the beams $LB_{1P}$, $LB_{2P}$ each become a spot light (beam waist) in the pupil plane $EP_1$ of the object lens 21a or in the vicinity thereof, and then proceeds from the object lens 21a to the mask Ms in the form of a parallel flux. In this modified embodiment, the beams $LB_{1P}$, $LB_{2P}$ exiting from the object lens 21a are set to have their principal rays which intersect with each other about a middle point of the proximity gap between the mask Ms and the wafer W. It is known that dependent on the kind of a light source, an irradiation system for exposure energy and other factors in exposure equipment, the proximity gap is generally selected to be in a range of 10 μm to 500 μm. In the case where the proximity gap is small, a grating mark RM on the mask Ms and a grating mark WM on the wafer W are certainly present in the intersecting region of the two beams $LB_{1P}$, $LB_{2P}$ (in the direction of the optical axis), whereby no problem arises practically. In the case of the proximity gap being set wide, there arises a problem as to whether or not the marks RM and WM are certainly present in the intersecting region. However, this problem can easily be solved just by increasing the diameters of the beams $LB_{1P}$, $LB_{2P}$ reaching the mask Ms. Therefore, a length of the intersecting region in the direction of the optical axis can be set with a relatively large degree of freedom. In this modified embodiment too, the positional relationship between the marks RM and WM is set similarly to that shown in FIG. 4, and both the marks have the same grating pitch.

Diffracted lights (beat signals) 104, 105 from the marks RM, WM reach a spatial filter 23 positioned in pupil conjugate relation via the object lens 21a, the parallel-planar glass 50, the beam splitter 20 and a relay system 17B. The spatial filter 23 cuts off the 0th beams $L_0$, allowing only the diffracted lights 104, 105 to enter a beam splitter BS through a lens system (reverse Fourier transforming lens) 24. The diffracted lights 104, 105 are divided in light intensity and branched into two paths by the beam splitter BS, followed by reaching light receiving elements 25A, 25B via aperture plates 25A', 25B' as view field diaphragms, respectively, in a like manner to the arrangement shown in FIG. 3.

Here, the aperture plate 25A' is arranged to be conjugate to the mark RM on the mask Ms for passing only an image of the mark RM therethrough, while the aperture plate 25B' is arranged to be conjugate to the mark WM on the wafer W for passing only an image of the mark WM therethrough. The reason why the aperture plate 25 is divided into separate plates for the mask Ms and the wafer W is in that in the case where the gap between the mask Ms and the wafer W is large and the object lens has large magnifying power, it is difficult to form two images of both the marks in the same plane with the focal depth of the object lens 21a alone. Of course, if the 2-focus optical system is adopted as with FIGS. 1 and 3, both the marks can be imaged in the same plane. In the case of the gap being small, the aperture plates 25A', 25B' may be formed by a single common plate.

In the modified embodiment too, tele-centricity can be adjusted using the reference mark plate FM in place of the mask Ms or the wafer W in exactly the same manner as that in the foregoing embodiments. However, it is also possible to use the mark RM on the mask Ms rather than the reference mark plate FM. To this end, a mask holder for holding the mask Ms is only required to be movable vertically, i.e., in the z-direction.

Further, the intersect angle of the two beams $LB_{1P}$, $LB_{2P}$ can finely be adjusted by appropriately adjusting inclinations of the parallel-planar glasses 54, 55. In this case, it is preferable to use the thicker parallel-planar glass 54 for coarse adjustment, and use the thinner parallel-planar glass 55 for fine adjustment.

In addition, the parallel-planar glass 50 may be provided between the prism mirror PM and the relay system 17A. Since this is equivalent to that the parallel-planar glass 50 is provided in the pupil space between the lens system $LG_1$, $LB_2$ and the relay system 17A, the similar effect can be obtained. This equally applies to the case of FIGS. 1 and 3. Moreover, since the light receiving elements 25A, 25B are arranged substantially in image conjugate relation, the diffracted lights 104, 105 reaching the light receiving elements 25A, 25B are subjected to no lateral shift even if the parallel-planar glass 50 is not provided in the common optical paths for the transmitted light beams $LB_{1P}$, $LB_{2P}$ and the diffracted lights 104, 105.

As with the case of FIG. 1, the parallel-planar glass 50 is preferably located in the pupil conjugate plane as far as possible or in the vicinity thereof. It is needless to say that this modified embodiment can also be arranged so as to make the object lens 21a movable in the direction of the optical path together with a fore end reflecting mirror within a region of the afocal system dependent on changes in position of observing the marks RM, WM, as with the case of FIG. 8.

Figure 18A:
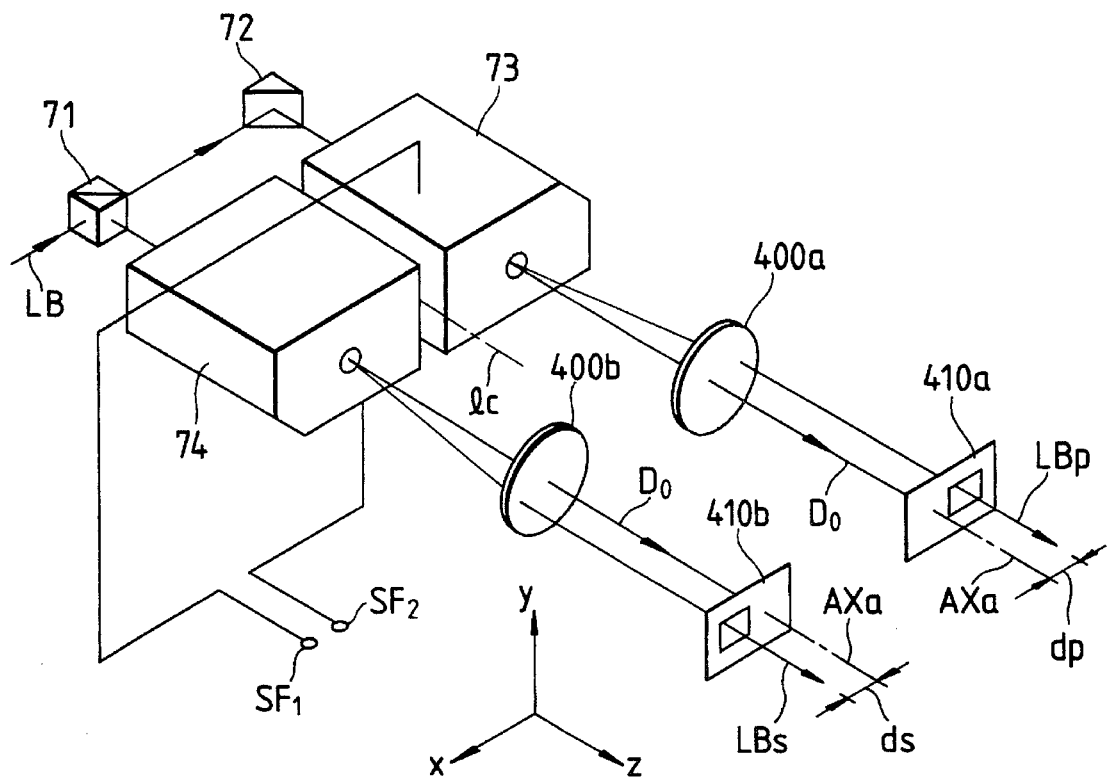
FIG. 18A is a perspective view showing the configuration of a frequency shifter according to still another embodiment.

Next, another modified embodiment of the present invention will be described with reference to FIGS. 18A and 18B. This modified embodiment is arranged to finely adjust the intersect angle of the two beams $LB_1$, $LB_2$ impinging onto the grating by the use of two AOM's 73, 74 in the 2-beam frequency shifter 12. In FIG. 18A, basic arrangement of the AOM's 73, 74 and others are similar to that shown in FIG. 5. Herein, however, the AOM's 73, 74 are arranged to be symmetrical, i.e., in 180°-rotated relation, about the center line lc parallel to the z-axis. Accordingly, if drive signals $SF_1$, $SF_2$ applied to the AOM's 73, 74 are substantially the same in frequency, the 1st order lights (beams $LB_P$, $LB_S$) are deflected with respect to respective 0th order lights $D_0$ symmetrically about the center line lc in the x-z plane shown in FIG. 18A.

The beams exiting from the AOM's 73, 74 pass through lens systems 400a, 400b and reach spatial filters 410a, 410b, respectively. The forward focuses of the lens systems 400a, 400b are substantially coincident with the diffraction points (deflecting points) on the AOM's 73, 74, respectively, and the optical axes AXa of the lens systems 400a, 400b (which axes become matched with the optical axis of the object lens system 21 by later synthesization) are set coincident with the associated 0th order lights $D_0$. The spatial filters 410a, 410b are arranged in the rearward focal planes (corresponding to the plane Pe in FIG. 13C) and pass only the beams $LB_P$, $LB_S$ as 1st order diffracted lights therethrough while cutting off the 0th order lights $L_0$, respectively. After the lens systems 400a, 400b, the principal rays of the beams $LB_P$, $LB_S$ become parallel to the optical axes AXa, and the beam waists of the beams $LB_P$, $LB_S$ are positioned in openings of the spatial filters 410a, 410b, respectively. Therefore, by setting the spatial filters 410a, 410b substantially conjugate to the pupil $EP_1$ of the object lens system 21, or conjugate to the waist positions of the two beams $LB_1$, $LB_2$ as determined from the theory of optics, the two beams $LB_1$, $LB_2$ reaching the grating can each be made an essentially parallel flux. Further, the openings of the spatial filters 410a, 410b are formed to have a relatively large width in the x-direction for accommodating slight changes of respective intervals dp, ds between the principal rays of the beams $LB_P$, $LB_S$ and their optical axes AXa.

Figure 18B:
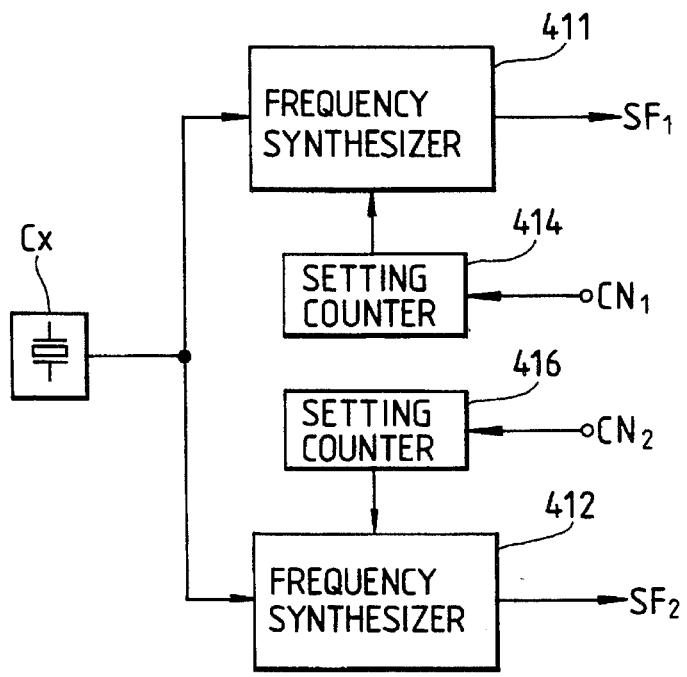
FIG. 18B is a block diagram showing one example of a drive circuit for the frequency shifter of FIG. 18A.

FIG. 18B is a block diagram schematically showing one example of a circuit for generating the drive signals $SF_1$, $SF_2$. The drive signals $SF_1$, $SF_2$ are created by frequency synthesizers 410, 412, respectively, both sharing a crystal oscillator Cx. Output frequencies are set by counters 414, 416 for selecting the frequency dividing ratios or the like, and the setting values $CN_1$, $CN_2$ are provided from the main control system 41 (FIG. 1), etc. The setting values $CN_1$, $CN_2$ are decided such that the frequency difference between the drive signals $SF_1$, $SF_2$ becomes 25 KHz. When high frequencies of 80,000 MHz, 80,025 MHz are applied as the drive signals $SF_1$, $SF_2$ to the AOM's 73, 74, respectively, the intervals dp and ds take the same design value. In this connection, when the frequencies of the signals $SF_1$, $SF_2$ are both increased or decreased on the order of several % to several tens % (or two times dependent on cases), the intervals dp, ds are also changed by the same amount from the design value but in the opposite directions from the optical axes AXa. Accordingly, the principal rays of the two beams $LB_1$, $LB_2$ are changed in position symmetrically about the optical axis on the pupil plane within the alignment system or the projection lens 3, while keeping parallel relation. As a result, the incident angles of the two beams $LB_{1S}$, $LB_{2S}$ or beams $LB_{1P}$, $LB_{2P}$ reaching the marks RM, WM are varied symmetrically to enable fine adjustment of the intersect angle.

In the case of adopting the configuration of FIG. 18A, therefore, it is preferable to combine the modulation degree detecting system 420 shown in FIG. 11 with the drive circuit shown in FIG. 18B, and to perform automatic adjustment (or self-check) of the intersect angle of the two beams $LB_1$, $LB_2$ using the reference mark plate FM, the mark RM on the reticle, etc.

In this case, since the intersect angle is adjusted not in a mechanical manner, but in an electrical manner of simply changing the frequencies of the drive signals $SF_1$, $SF_2$, the adjustment can be achieved very steadily and at a high speed.

Thus, in this modified embodiment, the AOM's 73, 74 in the 2-beam frequency shifter 12 function as the second optical member of the present invention. Moreover, since the intersect angle is finely adjusted using the AOM's 73, 74, this embodiment is easily adaptable to fluctuations of the diffraction characteristics incidental to heating or time-dependent changes of the AOM's 73, 74.

Other modified embodiments are as follows.

(1) The two beams $LB_1$, $LB_2$ irradiated to the grating mark RM or WM may be different in their polarizing directions. Supposing that the beam $LB_1$ is given by a left-handed circularly polarized light and the beam $LB_2$ is given by a right-handed circularly polarized light, for example, no interference fringe is produced on the grating mark, but the beat signals can be obtained in a like manner by placing a double-refractive element or the like before each of the light receiving elements 19, 25, 300.

(2) The laser source 10 may be constituted by a Zeeman laser in order to provide the frequency difference between the beams $LB_1$ and $LB_2$.

(3) In the case of a homodyne mode in which the frequency difference between the beams $LB_1$ and $LB_2$ is set zero, the adjustment of both tele-centricity and intersect angle can also be performed in a like manner.

(4) Since use of the AOM's makes it possible to simply change over between a homodyne mode and a heterodyne mode just by changing frequencies of the respective drive signals, i.e., dependent on the presence or absence of the frequency difference between the drive signals, the alignment sequence for scanning the wafer stage 5 under the homodyne mode and the servo lock of the wafer stage during exposure under the heterodyne mode can be handled selectively at a high changing-over speed.

(5) In the alignment system of the TTR, TTL type, the 2-focus element (double-refractive material) 21a may be omitted by selecting the wavelength of the two beams $LB_1$, $LB_2$ approximate to that of the exposure light.

In this case, an illumination field diaphragm is disposed in the image conjugate plane along the light transmitting paths for the beams $LB_1$, $LB_2$, so that an irradiated region of the resist layer on the wafer is limited to the area of the mark WM.

(6) In the configuration of FIG. 18A, when the diffraction angles of the beams are drifted upon heating of the AOM's 73, 74, a degree of the heating may be monitored by a temperature sensor and the frequencies of the drive signals $SF_1$, $SF_2$ may be automatically adjusted dependent on a rise of the monitored temperature so as to hold the symmetry of incident angles of the beams $LB_1$, $LB_2$ constant.

According to the above embodiments of the present invention, as described above, in the alignment optical system or the like for irradiating two beams in such a manner as to intersect with each other on a grating, the first optical member is provided which can shift positions of the two beams in the pupil plane of an object optical system (projection optical system) by the same amount in the array direction of the grating, with the result that tele-centricity between the two beams can be adjusted. Further, since the second optical member for changing the interval between the two beams in the pupil plane is provided, the intersect angle of the two beams on the grating can be adjusted to an optimum value.

This leads to an advantageous effect that the accuracy resulted in position detection using the grating and the interference fringe can steadily be assured while keeping the intrinsic benefit of high resolution.

Another particular effect is in that even when the interference fringe and the grating are relatively displaced to a large extent in the direction of the optical axis, no trouble occurs in the process of position detection because very high tele-centricity is maintained.

This permits to eliminate the focusing (AF) operation during alignment, which has been implemented in the conventional steppers and the like, thus resulting in an advantage that the throughput can be improved in the sequence combined with the E. G. A. (enhancement global alignment) method. Further, in proximity exposure equipment (e.g., X-ray steppers using SOR's) where the setting accuracy of a gap and the interval setting accuracy between a light source and a mask are relatively low, it becomes possible to immediately enter the process of alignment and exposure after just setting the mask and the wafer substantially in a mechanical manner. As a result, an increase in the throughput can be expected similarly.

In addition, since the first optical member and the second optical member can be adjusted based on one detection signal (e.g., DSw), there is no need of providing separate detecting systems for the measurement of tele-centricity and intersect angle, resulting in the very simple structure.

Second Embodiment

Figure 20:
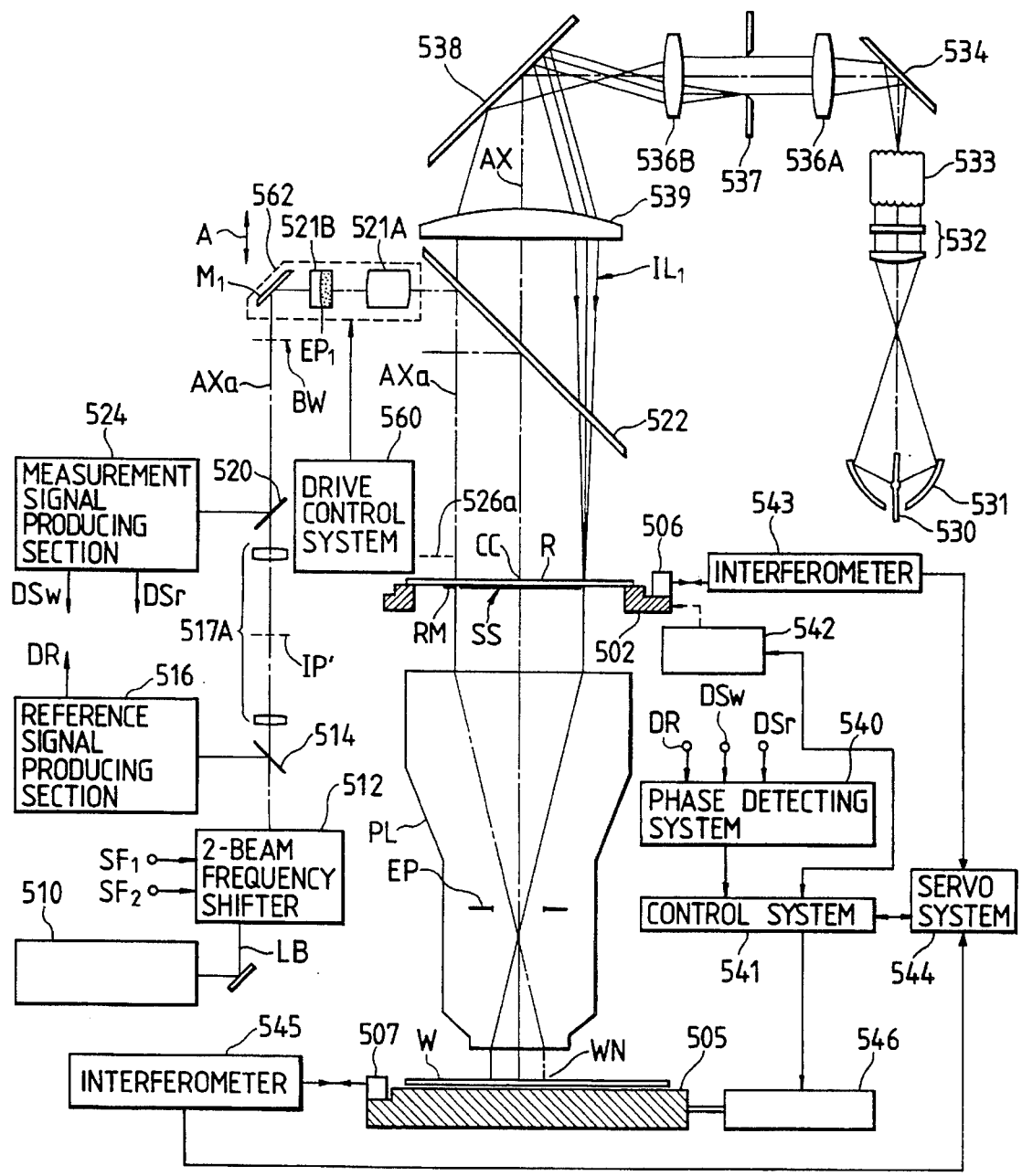
FIG. 20 is a diagrammatic view showing the configuration of a projection type exposure equipment (stepper) according to a second embodiment of the present invention.

Hereinafter, a second embodiment of the present invention, which adopts the identical configuration to that of a projection type exposure equipment disclosed in the above-cited Japanese Patent Laid-Open No. 63 -283129, will be described with reference to FIGS. 20, 21, 22 and 23. In FIG. 20, a reticle R having a predetermined circuit pattern region SS and a grating mark RM for alignment thereon is held on a reticle stage 2 movable two-dimensionally. Each pattern on the reticle R is imaged with an exposure light (first illumination light) on a wafer W through a projection lens PL which is tele-centric on both sides. Here, the projection lens PL is satisfactorily corrected in color aberration with respect to the wavelength of the illumination light $IL_1$ for exposure (e.g., g line, i line or KrF excimer laser), and the reticle R and the wafer W are arranged in conjugate relation to each other for the wavelength of the exposure light. A grating mark WM similar to that formed on the reticle R is formed on the wafer 4 as well. The wafer R is held under suction on a state 505 which is two-dimensionally movable using the step and repeat technique. When transfer exposure of the reticle R to one shot region SA on the wafer W has been completed, the wafer W is stepped to a next shot position. Fixed to a portion of the reticle stage 502 is a movable mirror 506 for reflecting laser beams from a laser beam interference type length gauge (hereinafter referred to an interferometer) 543 adapted to detect a relevant position in the horizontal plane of the reticle R in the x-, y- and rotating (θ-) directions. Although the interferometer 543 has three laser beams for length measurement to detect the position in the x-, y- and θ-directions independently of each other, a part of the laser beams is omitted on the drawing for simplicity of explanation. The reticle stage 502 has a moving stroke less than several millimeters, and the interferometer 543 is set to have detecting resolution on the order of 0.01 μm, for example. On the other hand, fixed to a portion of the wafer stage 505 is a movable mirror 507 for reflecting laser beams from an interferometer 545 adapted to detect a relevant position in the horizontal plane of the wafer W in the x- and y-directions. Likewise, although the interferometer 545 has two laser beams for length measurement to detect the position in the x- and y-directions independently of each other, a part of the laser beams is omitted on the drawing for simplicity of explanation. The reticle stage 502 is driven by a drive motor 542 in the x-, y- and θ-directions, while the wafer stage 505 is moved by a drive motor 546 two-dimensionally.

An illumination system for exposure comprises a mercury lamp 530, an ellipsoidal lens 531, an input lens group 532 including a condensing lens, an interference filter and others, an optical integrator (fly's-eye lens) 533, a mirror 534, a relay system lens group 536A, 536B, a variable reticle blind 537, a mirror 538, a main condenser lens 539, a dichroic mirror 522, etc. The dichroic mirror 522 is obliquely disposed above the reticle R at an inclined angle of 45° so that the exposure light $IL_1$ exiting from the condenser lens 539 passes through the dichroic mirror 522 vertically downward to uniformly irradiate the reticle R. The dichroic mirror 522 has reflectivity over 90% for the wavelength of the exposure light $IL_1$ and transmissivity over 50% for the wavelength of an illumination light for alignment (longer than that of the exposure light). The reticle blind 537 serves as an illumination field diaphragm to define an illumination region on the reticle R, and is arranged in conjugate relation to the reticle R through the lens group 536B and the condenser lens 539.

An alignment system of this embodiment will now be described. An illumination light (second illumination light) LB for alignment is emitted from a laser source 510 and enters a 2-beam frequency shifter 512 including two acoustic optical modulators (AOM's) respectively modulated by drive signals $SF_1$, $SF_2$ with a frequency difference Δf therebetween, polarizing beam splitters, etc., for conversion to two beams $LB_1$, $LB_2$ which contain both of linearly polarized components (P-polarized light, S-polarized light) and are given with the frequency difference Δf therebetween. These beams $LB_1$, $LB_2$ have their principal rays off-centered symmetrically about an optical axis AXa. In FIG. 20, the two beams $LB_1$, $LB_2$ exiting from the frequency shifter 512 are positioned in a plane vertical to the drawing sheet containing the optical axis AXa.

A part of the two beams $LB_1$, $LB_2$ exiting from the frequency shifter 512 is reflected by a beam splitter 514 to enter a reference signal producing section 516. The remaining beams $LB_1$, $LB_2$ having passed through the beam splitter 514 proceed through a relay system 517A and a beam splitter 520, and after being reflected by a mirror $M_1$, horizontally impinge to the dichroic mirror 522 through a 2-focus element 521B formed of a double-refractive or birefringent material and a tele-centric object lens 521A. The beams $LB_1$, $LB_2$ reflected by the dichroic mirror 522 then irradiate a predetermined region of the reticle R including the mark RM. The 2-focus element 521B comprises a plano-convex lens made of a double-refractive material and a plano-concave lens made of glass, these lenses being bonded to each other at their convex and concave surfaces. The 2-focus element 521B is disposed in a pupil plane $EP_1$ of the object lens 521A. Assuming the principal rays of the beams $LB_1$, $LB_2$ to be $LA_1$, $LA_2$, respectively, the principal rays $LA_1$, $LA_2$ are parallel to the optical axis AXa between the frequency shifter 512 and the relay system 517A and between the relay system 517A and the 2-focus element 521B in this embodiment. Inside the relay system 517A, the beams $LB_1$, $LB_2$ are each a parallel flux, and the principal rays $LA_1$, $LA_2$ intersect with each other at a predetermined angle in an image conjugate plane (plane conjugate to the reticle R or the wafer W) IP'. Thereafter, two spots $SP_1$, $SP_2$ are formed by the relay system 517A at a beam waist position BW. Accordingly, after passing through both the 2-focus element 521B and the object lens 521A, the beams $LB_1$, $LB_2$ each become a substantially parallel flux, and intersect with each other on the mark RM of the reticle R for one polarized (e.g., P-polarized) component and in a plane 526a spaced above the reticle R for the other polarized (e.g., S-polarized) component. The plane 526a is conjugate to the wafer mark WM at the wavelength of the beam LB and corresponds to the extent of color aberration of the projection lens PL. Incidentally, the rearward focal plane of the object lens 521A is coincident with either one of the plane 526a and the pattern surface of the reticle R at the wavelength of the illumination light (beam LB) for alignment.

Upon entering the 2-focus element 521B, the beam $LB_1$ is subjected to different values of refractivity for its components of S- and P-polarized lights under the action of the double-refractive material, whereby it is divided into a P-polarized beam $LB_{1P}$ and an S-polarized beam $LB_{1S}$, followed by obliquely exiting from the object lens 521A. Likewise, under the action of the 2-focus element 521B, the beam $LB_2$ is also divided into a P-polarized beam $LB_{2P}$ and an S-polarized beam $LB_{2S}$, followed by obliquely exiting from the object lens 521A.

The respective principal rays of the beams $LB_{1S}$, $LB_{2S}$ proceed to intersect with each other in the plane 526a, while the beams $LB_{1P}$, $LB_{2P}$ proceed to intersect with each other on the mark RM of the reticle R. The beams $LB_1$ ($LB_{1P}$, $LB_{1S}$) and $LB_2$ ($LB_{2P}$, $LB_{2S}$) are set to be inclined symmetrically about the optical axis AXa, and their inclined angles are uniquely defined dependent on the grating constant of the grating mark WM on the wafer W or the grating mark RM on the reticle R. The beams $LB_{1S}$, $LB_{2S}$ having intersected with each other in the plane 526a pass through a transparent window Po formed in the reticle R and enter the projection lens PL, followed by intersecting with each other again on the mark WM.

Meanwhile, inclined angles of the beams $LB_{1P}$, $LB_{2P}$ are also uniquely defined by the grating mark RM provided in a part of the window Po of the reticle R, so that the beams $LB_{1P}$, $LB_2P$ intersect with each other on the mark RM.

When the beams $LB_{1S}$, $LB_{2S}$ are irradiated to the wafer mark WM from two directions as mentioned above, a one-dimensional interference fringe is produced on the grating mark WM with a predetermined pitch, and this interference fringe flows at a speed corresponding to the frequency difference $\Delta f$ between the beams $LB_{1S}$ and $LB_{2S}$ in a direction perpendicular to the direction in which the fringe stripes are extending. On the mark RM in the window Po of the reticle R, a similar interference fringe is also produced by the beams $LB_{1P}$, $LB_{2P}$ and flows at a speed corresponding to the frequency difference $\Delta f$ therebetween.

Here, the pitch of the interference fringe formed by the beams $LB_{1P}$, $LB_{2P}$ on the reticle R is set to be exactly ½ of the grating pitch of the mark RM in the y-direction. Therefore, a diffracted light of 1st order produced from the mark RM upon irradiation of the beam $LB_{1P}$ and a diffracted light of 1st order produced from the mark RM upon irradiation of the beam $LB_{2P}$ are coaxially synthesized to become a light beat BTL of which light intensity changes at the frequency $\Delta f$. The light beat BTL reversely proceeds along the optical axis AXa via the object lens 521A, the 2-focus element 521B and the mirror $M_1$, and after being reflected by the beam splitter 520, enters a measurement signal producing section 524 where a signal DSr corresponding to the light beat BTL from the mark RM is produced.

The beams $LB_{1S}$, $LB_{2S}$ having passed through the window Po of the reticle R enter the projection lens PL to be condensed to substantially beam waists in the pupil EP, followed by intersecting on the wafer W in the form of parallel beams. This is because the plane 526a in the space above the reticle R is in conjugate relation to the wafer W at the wavelength of the beams $LB_{1S}$, $LB_{2S}$.

On the wafer mark WM, another one-dimensional interference fringe is formed and flows at a speed corresponding to the frequency difference $\Delta f$. Likewise, the pitch of this interference fringe in the y-direction is set to be exactly ½ of the grating pitch of the mark WM. This means that the grating pitch of the mark RM on the reticle R and the grating pitch of the mark WM on the wafer W are related to through the relationship of projection magnifying power.

Therefore, a diffracted light of 1st order produced from the wafer mark WM upon irradiation of the beam $LB_{1S}$ and a diffracted light of 1st order produced from the wafer mark WM upon irradiation of the beam $LB_{2S}$ are coaxially synthesized and reversely proceed while passing through the center of the pupil EP of the projection lens PL. Because of the same polarized component, those two diffracted lights of 1st order interfere with each other to become a light beat, and after passing through the transparent window of the reticle R, enter the measurement signal producing section 524 via the object lens 521A, the 2-focus element 521B, the mirror $M_1$ and the beam splitter 520 along the optical axis AXa. In the measurement signal producing section 524, a signal DSw corresponding to the light beat BTL from the mark WM is produced.

A phase detecting system 540 detects respective phase differences between the reference signal DR produced by the reference signal producing section 516 and the signals DSr, DSw produced by the measurement signal producing section 524, for measuring a relative shift in position between the mark RM and the mark WM within a range of ± ½ of the grating pitch with high precision.

A control system 541 collectively control a servo system 544 serving as an interface for both the interferometers 543, 545, the drive motors 542, 546, and the phase detecting system 540.

Of the alignment system in FIG. 20, the object lens 521A, the 2-focus element 521B and the mirror $M_1$ are fixed together in a metal holder 562 which is movable by a drive control system 560 vertically in the direction of arrow A. This movement of the holder 562 allows an observing position of the object lens 521A to be freely varied over the reticle R along a radial line passing the center CC thereof.

Figure 21:
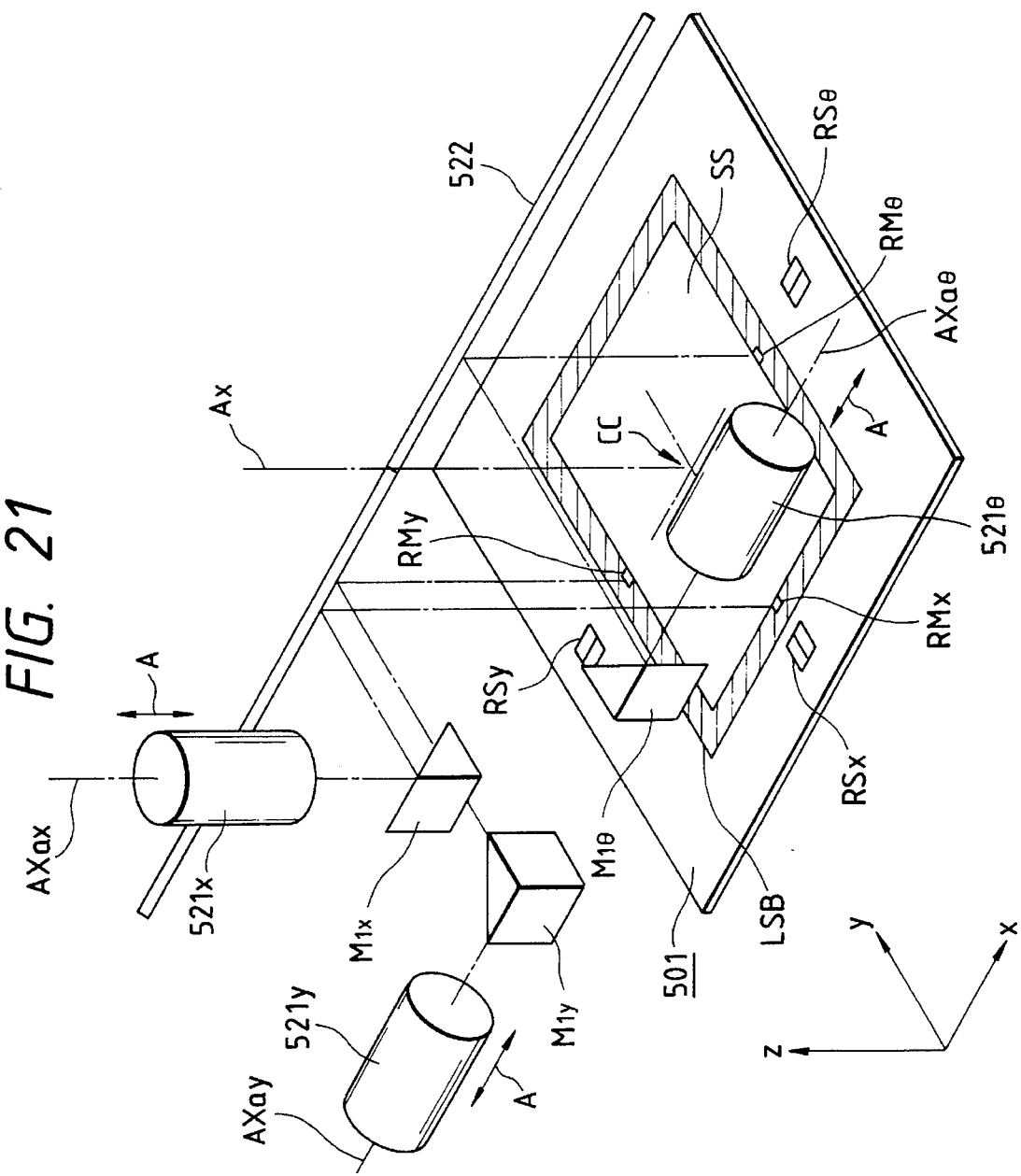
FIG. 21 is a perspective view showing the detailed configuration in the vicinity of an object lens in the alignment system in FIG. 20.

Although FIG. 20 shows only the alignment system for detecting one mark, it is preferable as a matter of practice to arrange the alignment system to be capable of detecting 2 or more marks, as shown in FIG. 21 by way of example. FIG. 21 is a perspective view showing the practical arrangement of the reticle R, the dichroic mirror 522, and object lenses 521x, 521y, 521θ of three alignment systems. The optical axis AX passes the center CC of the reticle R, and grating marks RMx, RMy, RMθ are provided in respective transparent windows at three locations around the pattern region SS away from the center CC in the x- and y-directions. Outside the windows, there is formed a frame-like light shielding band LSB which surrounds the pattern region SS and has a certain width. Furthermore, reticle alignment marks $RS_x$, $RS_y$, $RS_θ$ are provided at three locations outside the light shielding band LSB.

Mirrors $M_{1x}$, $M_{1y}$, $M_{1θ}$ are provided at the fore ends of the object lenses 521x, 521y, 521θ of the three alignment systems integrally with the corresponding object lenses, respectively. The object lenses 521x, 521y, 521θ are arranged to have their optical axes $AX_{ax}$, $AX_{ay}$, $AX_{aθ}$ parallel to the x-z plane.

A pair of object lens 521x and the mirror $M_{1x}$ for detecting the mark $RM_x$ for the x-direction can be moved in parallel or translated in both the z-direction (i.e., the direction along the optical axis AX) and the x-direction. A pair of object lens 521y and the mirror $M_{1y}$ for detecting the mark $RM_y$ for the y-direction and a pair of object lens 521θ and the mirror $M_{1θ}$ for detecting the mark $RM_θ$ for the y-direction can be moved in parallel in both the x-direction and the z-direction independently of each other. Note that although FIG. 21 shows only the object lenses 521x, 521y, 521θ, the respective 2-focus elements are also provided integrally and the optical paths led from the 2-focus elements (on the side near the illumination source for alignment) present an afocal system. In addition, the three mirrors $M_{1x}$, $M_{1y}$, $M_{1θ}$ are arranged such that they will not penetrate into the space below the dichroic mirror 522. Placing the mirrors $M_{1x}$, $M_{1y}$, $M_{1θ}$ at the fore ends of the object lenses 521x, 521y, 521θ, respectively, results in an advantage that dependent on changes in size of the pattern region SS on the reticle R, i.e., dependent on changes in position of the marks $RM_x$, $RM_y$, $RM_θ$ with respect to the reticle center CC, the movements of positions observed by the object lenses 521x, 521y, 521θ will not cause spatial interference and can be allowed over a relatively large range.

FIG. 22 shows the positional relationship between the above mark RM and the mark WM on the wafer W. The window Po is provided in the light shielding band LSB of the reticle R, and the mark RM is formed about half the region of the window Po. The wafer mark WM is positioned in the remaining half region of the window Po. FIG. 22 shows a state that the two marks RM, WM are aligned with each other, and the line passing the centers of the marks RM, WM in the pitch direction thereof is directed substantially toward the center CC of the reticle R. Thus, the direction of measurement of the marks WM, RM is given by a direction perpendicular to that line. Note that the half region of the window Po in which the wafer mark WM is to be located is relatively enlarged in the direction of measurement. This is because the two beams $LB_{1S}$, $LB_{2S}$ directing toward the wafer W are divergent to widen in the plane of the window Po.

Hereinafter, the configuration of the 2-beam frequency shifter 512, the reference signal producing section 516 and the measurement signal producing section 524 will be described with reference to FIG. 23. As shown in FIG. 23, the parallel beam LB (linearly polarized lights orthogonal to each other) from the laser source 510 is divided by a polarizing beam splitter 571 into a beam $LB_P$ consisted of the P-polarized component and a beam $LB_S$ consisted of the S-polarized component. The beam $LB_P$ is reflected by a mirror 572 to enter an AOM (acoustic optical modulator) 573, while the beam $LB_S$ is reflected by the polarizing beam splitter 571 to enter an AOM 574. The AOM 573 is driven by a high-frequency signal $SF_1$ of frequency $f_1$ to output the 1st order light, as the beam $LB_P$, which is deflected through a diffraction angle determined by the frequency $f_1$. The AOM 574 is driven by a high-frequency signal $SF_2$ of frequency $f_2$ ($f_2=f_1-\Delta f$) to output the 1st order light, as the beam $LB_S$, which is deflected through a diffraction angle determined by the frequency $f_2$. The 0th order light $D_0$ of the beam incident on each AOM is shielded by a slit plate 577A, 577B disposed at an appropriate position. The relationship between the drive frequencies $f_1$, $f_2$ and the frequency difference $\Delta f$ is preferably to be $f_1 \gg \Delta f$ and $f_2 \gg \Delta f$. An upper limit of $\Delta f$ is determined by responsivity of optoelectric detectors receiving the corresponding light beats. The beam $LB_S$ from the AOM 574 is reflected by a mirror 575 to enter a polarizing beam splitter 576 via a lens 578B, while the beam $LB_P$ from the AOM 573 enters the polarizing beam splitter 576 via lens 578A in the direction perpendicular to the beam $LB_S$. Here, the polarizing beam splitter 576 functions not to synthesize the principal rays $LA_1$, $LA_2$ of the two beams $LB_P$, $LB_S$ in a completely coaxial state, but to synthesize them in a state parallel to each other with a certain interval or spacing therebetween. In the case of this embodiment, that interval specifies the intersect angle $\theta$ between the two beams $LB_1$, $LB_2$ irradiating the reticle and the wafer. The lenses 578A, 578B converge the beams $LB_P$, $LB_S$ into beam waists in an appropriate plane.

Although the two beams $LB_P$, $LB_S$ have the frequency difference $\Delta f$, this embodiment requires to irradiate two P-polarized beams having a frequency difference therebetween onto the reticle, and to irradiate two S-polarized beams having a frequency difference therebetween onto the wafer. In other words, it is required to create four beams $LB_{1P}$, $LB_{1S}$, $LB_{2S}$ from the above two beams, i.e., one S-polarized beam $LB_S$ of frequency $f_1$ and one P-polarized beam $LB_P$ of frequency $f_2$. A system for this purpose comprises a ½ wavelength plate 617, two polarizing beam splitters 618, 619 and two mirrors 620, 621.

By passing through the ½ wavelength plate 617 with the polarizing direction of 45° and polarizing beam splitters 118, 119, etc., the two beams $LB_S$, $LB_P$ are turned to the four beams such that the P-polarized beam $LB_{1P}$ and the S-polarized beam $LB_{1S}$ of frequency $f_1$ are synthesized in a coaxial state to become the beam $LB_1$, while the P-polarized beam $LB_{2P}$ and the S-polarized beam $LB_{2S}$ of frequency $f_2$ ($f_1-\Delta f$) are synthesized in a coaxial state to become the beam $LB_2$, these two beams $LB_1$ and $LB_2$ exiting from the polarizing beam splitter 619.

More specifically, as shown in FIG. 23, when the S-polarized beam $LB_S$ (frequency $f_2$) enters the ½ wavelength plate 617, the polarizing direction thereof is rotated through 45°. Therefore, the polarizing beam splitter 618 divides the incident beam $LB_S$ into the P-polarized beam $LB_{2P}$ and the S-polarized beam $LB_{2S}$ in a like manner to vector analysis. Likewise, because the P-polarized beam $LB_P$ (frequency $f_1$) having passed through the ½ wavelength plate 617 is rotated in the polarizing direction through 45°, the polarizing beam splitter 618 also divides the incident beam $LB_P$ into the P-polarized beam $LB_{1P}$ and the S-polarized beam $LB_{1S}$. Two pairs of divided beams are synthesized by the polarizing beam splitter 619 via right-angled prisms 620, 621 having metallic reflecting surfaces, respectively, followed by exiting from the polarizing beam splitter 619 as the two parallel beams $LB_1$, $LB_2$ again. The two beams $LB_1$, $LB_2$ are positioned symmetrically about the optical axis AXa of the alignment optical system. The system so far explained constitutes the 2-beam frequency shifter 512.

Next, the two beams $LB_1$ ($LB_{1S}$, $LB_{1P}$) and $LB_2$ ($LB_{2S}$, $LB_{2P}$) are each divided by the beam splitter 514 into two paths. One path of the two beams $LB_1$, $LB_2$ enters the reference signal producing section 516 comprised of a lens 660, a mirror 661, a transparent type reference grating plate 662, a spatial filter 663 and a light receiving element 519. Here, since the forward focal plane of the lens 660 is arranged to be coincident with the rearward focal planes of the lenses 578A, 578B, the two beams $LB_1$, $LB_2$ are irradiated to the reference grating plate 662 in the form of parallel fluxes while intersecting there at a predetermined angle. Hence, a one-dimensional interference fringe is produced on the reference grating plate 662 in a state of flowing in the pitch direction of the grating, and a light beat BTr (parallel flux) generated on the optical axis is received by the light receiving element 519 via an aperture 663. 0th order lights $L_0$' from the reference grating plate 662 are shielded by the aperture 663. The output signal DR of the light receiving element 519 becomes an AC signal having its frequency equal to the frequency difference $\Delta f$ and is used as a reference signal. In this embodiment, the reticle and the wafer are relatively aligned with each other by separately measuring a shift in position of the reticle mark RM relative to the reference grating plate 662 and a shift in position of the wafer mark WM relative to the reference grating plate 662.

Meanwhile, the two beams $LB_1$, $LB_2$ reflected by the beam splitter 514 pass through the relay system 517A as shown in FIG. 20 in which the principal rays of the two beams $LB_1$, $LB_2$ intersect with each other in the image conjugate plane IP' at a predetermined angle. In the image conjugate plane IP', a view field diaphragm 518 is disposed to limit the intersecting illumination region (corresponding to the width Dr in FIG. 19B) of the two beams $LB_1$, $LB_2$ on the reticle R (or the wafer W). After exiting from the relay system 517A, each of the beams $LB_1$, $LB_2$ passes through the beam splitter 520 and is converged to the minimum beam diameter at the waist position BW in FIG. 20.

The reflected lights from the mark RM on the reticle R or the mark WM on the wafer W are returned through the object lens 521A up to the beam splitter 520 and reflected thereby. Of the reflected lights, the 0th order lights $L_0$ are returned exactly in coaxial relation to the principal rays of the beams $LB_1$, $LB_2$, and principal rays of the 1st order diffracted lights BTL are returned in coaxial relation to the optical axis AXa of the alignment system. These 0th order lights $L_0$ and diffracted lights BTL are reflected by the beam splitter 520 to reach a spatial filter 523 through afocal magnifying relay systems 740A, 740B. The spatial filter 523 cuts off the 0th order lights $L_0$, while extracting the diffracted lights BTL, and is disposed to be substantially conjugate to the waist position BW. Note that the diffracted lights BTL from both the reticle mark RM and the wafer mark WM exist at the position of the spatial filter coaxially in their polarized states complementary to each other. For simplicity of the following explanation, the diffracted lights from the reticle mark RM are designated by 604 and the diffracted lights from the wafer mark WM are designated by 605 hereinafter. The afocal magnifying relay systems 740A, 740B function to widen the intervals between the principal rays of the diffracted lights 604, 605 and the principal rays of the two 0th order lights $L_0$ all reaching the spatial filter 523, for making it easier to extract the diffracted lights 604, 605. Such enlargement of the intervals is however not necessarily required. The diffracted lights 604, 605 thus extracted are then reflected by a mirror 741 to reach a polarizing beam splitter 743 through an imaging lens (reverse Fourier transforming lens) 742. The diffracted lights 605 of the S-polarized component are reflected by the polarizing beam splitter 743 and received by a light receiving element 525A via a view field diaphragm 745A disposed in the image conjugate plane and a condensing lens 744A. On the other hand, the diffracted lights 604 of the P-polarized component having passed through the polarizing beam splitter 743 reaches a light receiving element 525B via a view field diaphragm 745B disposed in the image conjugate plane and a condensing lens 744B. The view field diaphragm 745A has an opening in match with the size and position of the mark WM shown in FIG. 22, and the view field diaphragm 745B has an opening in match with the size and position of the mark RM shown in FIG. 22. Because the optical paths from the imaging lenses 742 to the relay system 740B and the optical paths from the relay system 740A to the object lens 521A present an afocal system, the conjugate relation between the view field diaphragm 745A and the wafer mark WM and the conjugate relation between the view field diaphragm 745B and the reticle mark RM are both maintained even if the object lens 521A (the holder 562) is moved due to changes of the observing position. Then, the light receiving element 525A outputs the measurement signal DSw having its frequency equal to the frequency difference $\Delta f$, and the light receiving element 525B outputs the measurement signal DSr having its frequency equal to the frequency difference $\Delta f$.

The conjugate relation of the beams $LB_1$, $LB_2$ and the relation in position of their beam waists in FIG. 23 will now be explained. First, the beams $LB_1$, $LB_2$ exiting from the relay system 517A each become a parallel flux so that the optical paths from the relay system 517A to the lenses 578A, 578B or the optical paths from the lens 660 to the lenses 578A, 578B present an afocal system, with the beams $LB_1$, $LB_2$ having their principal rays parallel to the optical axis AXa. Then, the position which is conjugate to the waist position BW between the beam splitter 520 and the mirror $M_1$ in FIG. 20 exists at an appropriate location between the lenses 578A, 578B and the relay system 517A (or the lens 660). The beams $LB_1$, $LB_2$ are converged to the minimum beam diameter at that location.

Further, the lenses 578A, 578B and one lens of the relay system 517A provide a conjugate position to the view field diaphragm 518 on the side of the AOM's 573, 574. In this embodiment, that conjugate position is made substantially conjugate the diffraction centers of the AOM's 573, 574. Accordingly, the diffraction centers of the AOM's 573, 574 become conjugate to the reticle mark RM and the wafer mark WM, respectively, because of the presence of the 2-focus element 521B.

In this embodiment, a moving stroke of the object lens 521A (holder 562) is set so as to prevent the 0th order lights $L_0$ from mixing into the diffracted lights BTL (604, 605) which pass through the spatial filter 523 in FIG. 23. The optimum condition is that when the holder 562 is positioned at the center of the moving stroke for observation, the pupil plane $EP_1$ of the object lens 521A is coincident with the waist position BW, namely, the pupil plane $EP_1$ is conjugate to the spatial filter 523. In the state of meeting this condition, the spatial filter 523 is set such that the beam waists of the diffracted lights BTL (604, 605) pass through exactly the center of its opening.

Of course, the spatial filter 523 may be set conjugate to the pupil plane $EP_1$ in the state that the holder 562 is out of the center position of the moving stroke. In this case, however, due care should be paid to the opening size of the spatial filter 523, the magnification of the afocal magnifying relay systems 740A, 740B, and other factors in order to prevent mixing of the 0th order lights $L_0$ throughout the moving stroke. The practical condition setting can be performed using the equation (15) explained before in connection with FIG. 19B.

In the case of installing two or more alignment systems as shown in FIG. 21, a set of the beam splitter 14, the reference signal producing section 516, the relay system 517A, the beam splitter 520 and the measurement signal producing section 524 is provided for each of the object lenses $521x$, $521y$, $521\theta$. In this case, however, there may leave a fear in integrity of reference because the reference grating plate 662 is also provided separately for each of the plural marks. To cope with this, it is conceivable to provide three sets of systems subsequent to the relay system 517A in FIG. 23 for the object lenses $521x$, $521y$, $521\theta$, respectively, divide the beams $LB_1$, $LB_2$ from the beam splitter 514 into three paths for supplying them to the corresponding systems, and employ the reference signal DR obtained by the single reference grating plate 662 as a reference for measuring the marks $RM_x$, $RM_y$, $RM_\theta$ and so forth.

Further, because of mainly adopting the die-by-die alignment process in the case of this embodiment, a phase detecting system may be provided which directly measures a phase difference between the measurement signals DSr and DSw. In this modification, the reference signal DR is not required.

In the foregoing second embodiment of the present invention, the diffracted lights 604 from the reticle mark RM and the diffracted lights 605 from the wafer mark WM have been explained as being different in the polarized state from each other. This relies on an assumption that the interference fringe produced on the reticle mark RM is attributable to only the P-polarized light (interference of the two beams $LB_{1P}$, $LB_{2P}$), and the interference fringe produced on the wafer mark WM is attributable to only the S-polarized light (interference of the two beams $LB_{1S}$, $LB_{2S}$). Dependent on the extent of color aberration of the projection lens PL along the optical axis, and other factors, however, the interference fringes attributable to both the polarized components may produce on each of the reticle mark RM and the wafer mark WM concurrently. This make it difficult to separate the polarized components between the diffracted lights 604 and 605, thereby causing a crosstalk. The crosstalk distorts the waveforms of the measurement signals DSw, DSr and brings about errors in detecting the phase difference.

Figure 24:
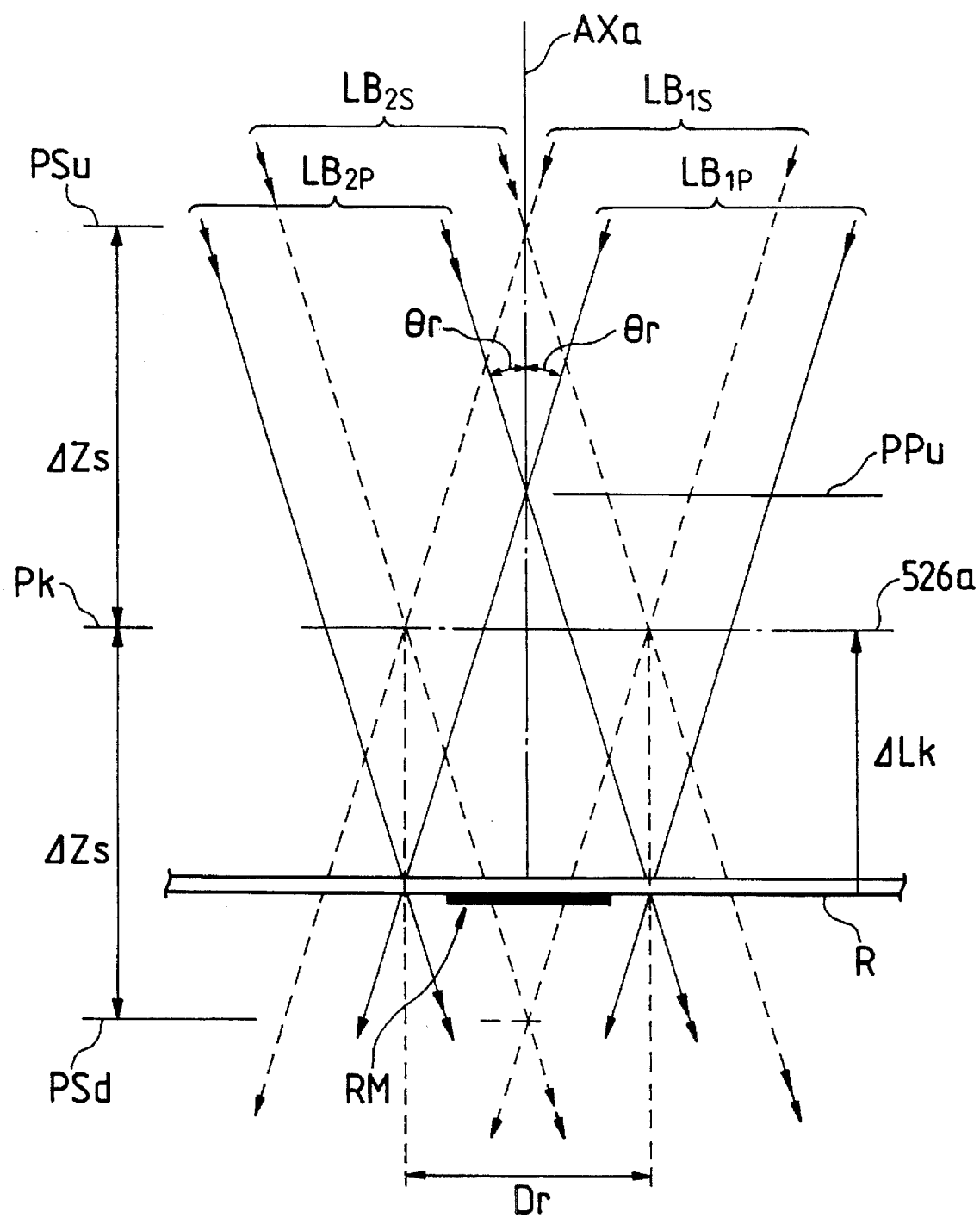
FIG. 24 is a view for explaining the state of two beams irradiated toward a reticle.

That point will now be explained with reference to FIG. 24. FIG. 24 shows the state of the incident beams in the vicinity of the reticle R. The beams irradiating the mark RM on the reticle R are P-polarized beams $LB_{1P}$, $LB_{2P}$ having the frequency difference $\Delta f$, and the beams irradiating the mark WM on the wafer W are S-polarized beams $LB_{1S}$, $LB_{2S}$ having the frequency difference $\Delta f$. The plane 526a is a wafer conjugate plane corresponding to the color aberration produced by the projection lens PL at the wavelength $\lambda$ of the beam LB, and the extent of the color aberration along the optical axis is given by $\Delta Lk$. The principal rays of the S-polarized beams $LB_{1S}$, $LB_{2S}$ intersect with each other in the plane 526a, while the principal rays of the P-polarized beams $LB_{1P}$, $LB_{2P}$ intersect with each other in the plane of the reticle mark RM. The above action results from the 2-focus element 521B shown in FIG. 20.

The size Dr of the intersecting region of the P-polarized beams $LB_{1P}$, $LB_{2P}$ on the reticle R or the intersecting region of the S-polarized beams $LB_{1S}$, $LB_{2S}$ in the plane 526a is uniquely determined by the opening size of the illumination field diaphragm 518 in FIG. 23. It can be regarded for side of the wafer W that the wafer mark WM is disposed in the plane 526a, but the size Dr and other dimensions are reduced at a ratio corresponding to the magnifying power of the projection lens PL.

Since the beams $LB_{1S}$, $LB_{2S}$ intersecting on the wafer W (or the plane 526a) each have the certain beam diameter, the distance $2 \times \Delta Zs$ of a three-dimensional region, where the beams $LB_{1S}$, $LB_{2S}$ intersect with each other, in the direction f the optical axis AXa can be set relatively large, though dependent on the incident angle $\theta r$ of the beams $LB_{1S}$, $LB_{2S}$. In the case of FIG. 24, the interference fringe of P-polarized light occurs in an arbitrary plane between a plane PSd spaced downwardly from the plane 526a through $\Delta Zs$ and a plane PSu spaced upwardly from the plane 526a through $\Delta Zs$. Unfortunately, however, the reticle mark RM is present between the planes PSd and PSu. This causes the interference fringe of S-polarized light to appear as a noise component on the reticle mark RM, in addition to the correct interference fringe due to the beams $LB_{1P}$, $LB_{2P}$ of P-polarized light. Therefore, the diffracted lights 604 from the reticle mark RM may contain a beat signal of S-polarized light in addition to a correct beat signal of P-polarized light. In the case of the light receiving system shown in FIG. 23, the intrinsic P-polarized beat signal is directed by the polarizing beam splitter 743 toward the light receiving element 525B, but the S-polarized beat signal as noise is reflected thereby toward the view field diaphragm 745A. The view field diaphragm 745A is set so as to pass only an image of the wafer mark WM therethrough. In the alignment process of the reticle R and the wafer W, however, the view field diaphragm 745A is not always aligned with the wafer mark WM and a part of the reticle mark RM may penetrate into the opening of the view field diaphragm 745A. As a result, the S-polarized beat signal from the reticle mark RM may mix as noise into the light receiving element 525A which should correctly receive only the diffracted lights 605 from the wafer mark WM. Of course, even if the view field diaphragm 745A and the mark WM are precisely aligned with each other, the noise component of S-polarized light is superposed, though a low level, on the correct beat signal. The above equally applies to the side of the light receiving element 525B and the view field diaphragm 745B.

Therefore, it is desired to set such a condition that the mark RM on the reticle R will not be present between the planes PSu and PSd shown in FIG. 24. This merely requires to make a plane PPu at which the beams $LB_{1P}$, $LB_{2P}$ for irradiating the reticle R begins to intersect with each other, relatively nearer to the reticle R rather than the plane 526a. In other words, the interval (extent of color aberration) $\Delta Lk$ between the plane 526a and the reticle R in the direction of the optical axis AXa and the interval $\Delta Zs$ between an intermediate plane Pk (the same as the plane 526a) equally spaced from the planes PSu, PSd and the plane PSd are just required to meet the relationship of $\Delta Zs \leq \Delta Lk$.

In FIG. 24, assuming that the beams $LB_{1S}$, $LB_{2S}$, $LB_{1P}$, $LB_{2P}$ each have the same size of beam cross-section and the intersecting region of the beams $LB_{1S}$, $LB_{2S}$ has the lateral size of Dr in the plane Pk (plane 526a), the following relation holds for $\theta r$ is small:

$$\Delta Zs \approx \frac{Dr/2}{\sin\theta r} \leq \Delta Lk \qquad (18)$$

Note that the incident angle $\theta r$ is equal for the P- and S-polarized lights on the reticle.

On the other hand, since the incident angle $\theta r$ of the beams $LB_{1S}$, $LB_{2S}$ is determined by the foregoing equation (8) and the wavelength $\lambda$ is a sufficiently small value relative to the grating pitch (pitch value of the wafer mark WM calculated on the reticle side) Pr, the equation (18) can be written to the following approximate equation on assumption of n= 1:

$$\Delta Zs \approx \frac{Dr \times Pr}{2 \times \lambda} \leq \Delta Lk \qquad (19)$$

Generally, the extent of color aberration $\Delta Lk$ of the projection lens PL is increased with the wavelength $\lambda$ being larger. Therefore, as the wavelength is more away from the wavelength of the exposure light, the condition of the equation (19) becomes easier to hold. This is partly because the change rate of the extent of color aberration $\Delta Lk$ is larger than the change rate of the wavelength $\lambda$. In Contrast, the size Dr and the pitch Pr are subject to a certain measure of optimum relationship. Particularly, the pitch Pr is of course uniquely determined by the condition of the equation (8). Also, given the number of grating elements minimally necessary for the wafer mark WM being m, the wafer mark WM requires the region size of about m×Pr in the direction of measurement and hence the size Dr of the intersecting region must satisfies the condition of Dr> m×Pr. Then, assuming that the ratio of the size of the mark WM to the irradiation region is h which is a constant on the order of 1 to 3, the equation of Dr= h×m×Pr holds.

Therefore, the equation (19) can be rewritten below:

$$\Delta Zs \approx \frac{h \times m \times Pr^2}{2 \times \lambda} \leq \Delta Lk \qquad (20)$$

In addition, the size Dr of intersecting region of the beams $LB_{1S}$, $LB_{2S}$ in the plane 526a is also uniquely determined by the opening size of the illumination field diaphragm 518 in FIG. 23.

The relay systems 740A, 740B can be replaced with the relay system 17B shown in FIG. 12A.

Figure 19A:
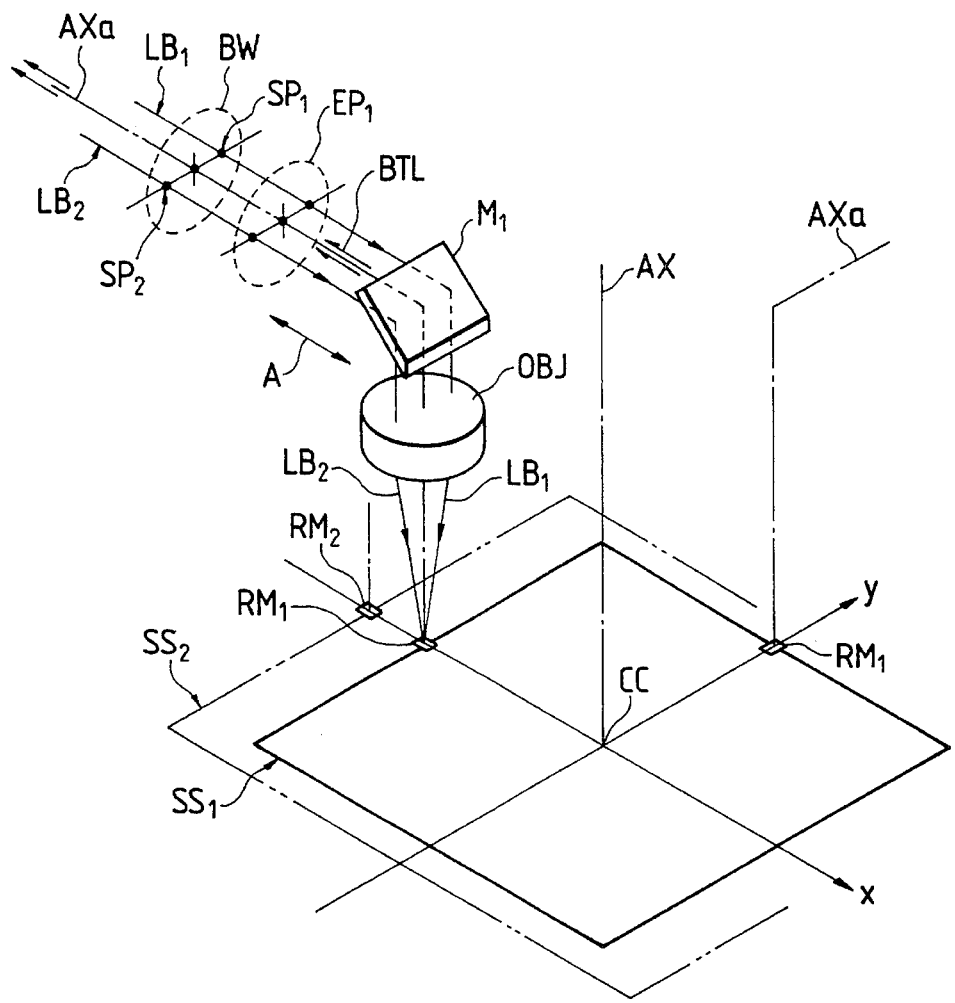
FIG. 19A is a perspective view for explaining the basic configuration of the present invention.
Figure 19B:
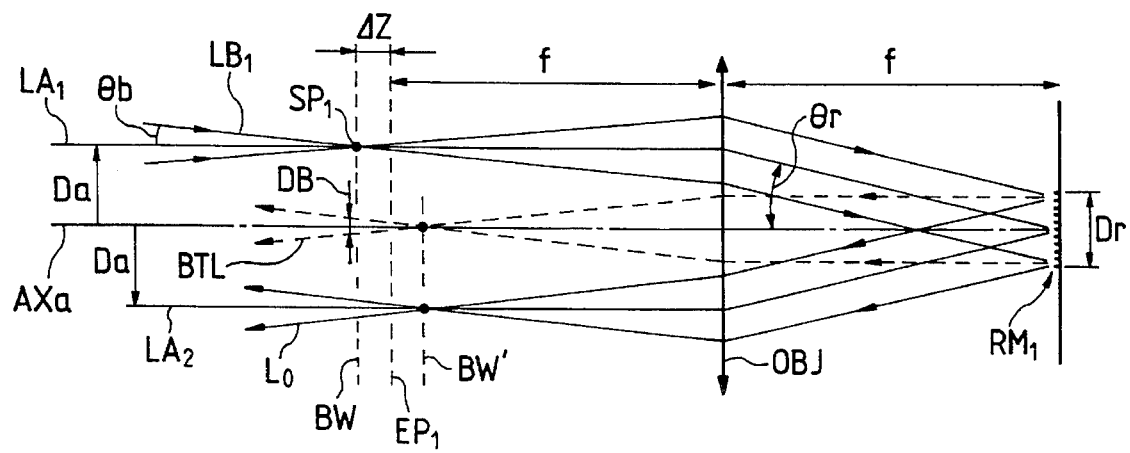
FIG. 19B is a view schematically showing the state of the various diffracted lights in the pupil plane of an alignment system.

As will be apparent from the principles illustrated in FIG. 19A, the diffracted lights 604, 605 (and the 0th order lights $L_0$) are all condensed to minute spots (beam waists) at the pupil (or in the pupil space) of the system. In FIG. 12B, therefore, the area of each light receiving surface 300a, 300b, 300c can be set vary small, which is advantageous in improving response of the light receiving element. Further, since the numerical apertures (N. A.) of the diffracted lights 604, 605 in the pupil space are so small that by selecting the area of each light receiving surface 300a slightly larger than the precise spot size of the diffracted lights 604, 605, the position setting accuracy for the light receiving elements 300R, 300W in the direction of the optical axis is not required to be so strict, thereby facilitating manufacture of the apparatus.

Considering now the spot diameter of the beams $LB_1$, $LB_2$, BTL, $L_0$ at the beam waist position, the minimum beam diameter r is approximately given by:

$$r \approx 1.22 \frac{f \times \lambda}{Dr} \qquad (21)$$

Here, f is the focal length of the object lens 521A. Given f= 100 mm, λ= 0.63 μm and Dr= 500 μm (on the reticle), r≈ 0.15 mm is resulted.

Moreover, the interval Da between the principal rays of the diffracted lights 604, 605 and the principal rays of the 0th order lights $L_0$ in the pupil space (see FIG. 19) is given by Da≈f×sin θr. Given λ= 0.63 μm and Pr= 20 μm (4 μm pitch on the wafer), θr≈1.8° is derived from the equation (8). This results in a small value of Da≈3.15 mm.

Accordingly, the mutual positional relationship among the light receiving surfaces 300a, 300b and 300c shown in FIG. 12B, as well as the relative spatial relationship among the diffracted lights 604 (or 605), the 0th order lights $L_0$ and the light receiving element 300R (300W) are required to be defined precisely. Although the respective light receiving surfaces of the light receiving element 300R (300W) has been explained as being conjugate to the beam waist position BW, they may be located at any position within a range insofar as the condition of the foregoing equation (15) is satisfied.

Figure 25A:
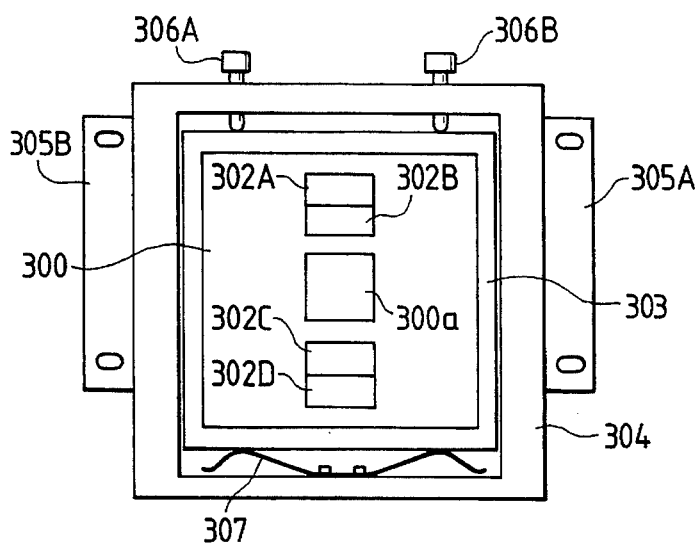
FIGS. 25A and 25B are views showing the configuration of a light receiving system according to a modified embodiment of the present invention.

FIG. 25A shows the structure of a light receiving system block according to another modified embodiment of the present invention suitable for the case of arranging light receiving elements in the pupil space. As with the embodiment of FIG. 12B, a light receiving element 300 is provided with light receiving surface 300a for receiving spot lights of the diffracted lights 604, 605 and light receiving surfaces 302A, 302B, 302C, 302D for receiving the 0th order-lights $L_0$. The upper and lower two light receiving surfaces for receiving the 0th order lights $L_0$ are each divided into two surfaces. Thus, the light receiving surfaces 302A and 302B are electrically insulated from each other by a separation zone of several μm–several tens μm, and the light receiving surfaces 302C and 302D are also electrically insulated from each other by a separation zone of several μm–several tens μm. The light receiving element 300 is fixed to a mount member 303 which is attached inside a frame 304 in a vertically movable manner. A leaf spring 307 is fixed on the inner surface of a bottom beam of the frame 304 to urge the mount member 303 upwardly by a relatively large force. Two screws 306A, 306B are screwed through a top beam of the frame 304 and have their distal ends held abutted against the upper end of the mount member 303. The frame 304 is provided around itself, i.e., on both lateral outer sides with attachment tabs 305A, 305B used for fixing the light receiving system block to the apparatus.

Figure 25B:
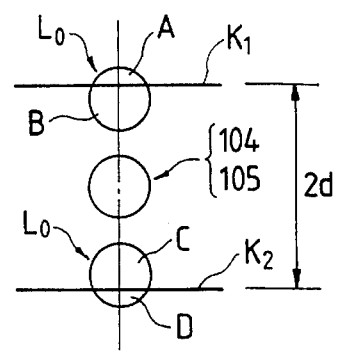

The light receiving system block is adjusted in a manner shown in FIG. 25B. In FIG. 25B, $K_1$ indicates the separation zone between the light receiving surfaces 302A and 302B, and $K_2$ indicates the separation zone between the light receiving surfaces 302C and 302D. These separation zones $K_1$, $K_2$ are set to have the interval therebetween as close as equal to that between the principal rays of the two 0th order lights $L_0$ in the pupil plane. The spot of the diffracted lights 604 (605) for measurement should always be positioned at the middle between the two 0th order lights $L_0$. In adjustment, therefore, the two screws 306A, 306B are turned to finely move the position of the light receiving element 300 so that the two 0th order lights $L_0$ and the separation zones $K_1$, $K_2$ have symmetrical relation in their positions. During such adjustment, a mirror surface member (chromium surface of the reticle or chromium surface of the reference mark plate FM) is disposed in the reticle plane or the wafer plane on which the two beams $LB_1$, $LB_2$ intersect with each other. Because the two 0th order lights $L_0$ are thereby made free from any influence (modulation) due to the grating, the light receiving surfaces 302A, 302B and the light receiving surfaces 302C, 302D receive the simple light intensity of the 0th order lights $L_0$, and opto-electric signal from each light receiving surface has only the DC component (though including small ripple due to a beat signal). Assuming now that the opto-electric signals from the light receiving surfaces 302A, 302B, 302C, 302D have their levels of A, B, C, D, respectively, the light receiving element 300 is finely moved using a differential arithmetic circuit and others so that the following voltage value ΔV becomes zero:

$$\Delta V = (A+C)-(B+D)$$

With such adjustment, as shown in FIG. 25B, the two 0th order lights $L_0$ are positioned symmetrically about the separation zones $K_1$, $K_2$, respectively, and hence the middle between the two 0th order lights $L_0$, i.e., the spot center of the diffracted lights 604, 605, is positioned just at the middle between the separation zones $K_1$, $K_2$. This also ensures that the spot center of the diffracted lights 604, 605 is coincident with the center of the light receiving surface 300a.

Figure 26:
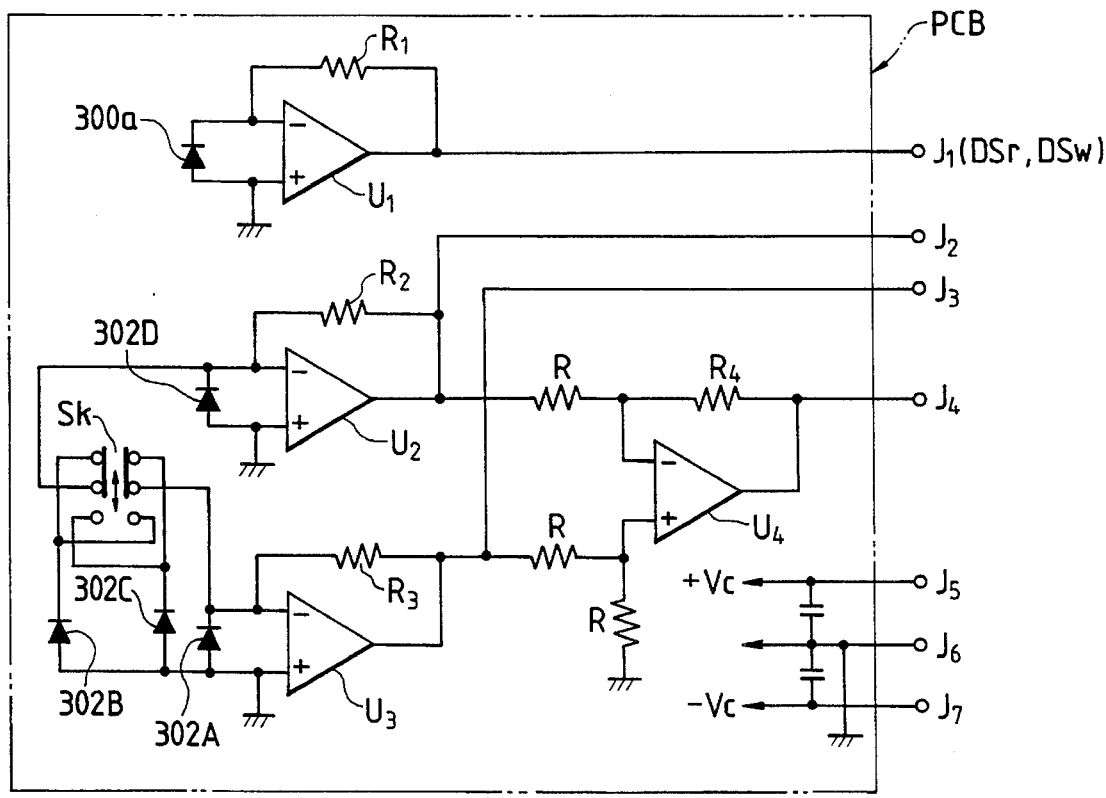
FIG. 26 is a circuit diagram showing the configuration of preamplifiers for signals of respective light receiving elements.

FIG. 26 shows one example of a preamplifier circuit in a printed circuit board PCB fixed to the back side of the mount member 303 or the frame 304. The light receiving surfaces are all formed of photodiodes (or phototransistors). Operational amplifiers $U_1$, $U_2$, $U_3$ functions, along with associated resistors $R_1$, $R_2$, $R_3$, as current/voltage converters for the photodiodes 300a and 302A–302D. An output signal $J_1$ of the operational amplifier $U_1$ is the measurement signal DSr, DSw corresponding to the diffracted lights 604 or 605.

The photodiode 302D is connected to the operational amplifier $U_2$, and the photodiode 302A is connected to the operational amplifier $U_3$. The remaining two photodiodes 302B, 302C are selectively connected to the the photodiodes 302A, 302B in parallel through a change-over switch Sk, respectively. When the switch Sk is in a state as shown, the photodiode 302B is connected to the photodiode 302D in parallel and an output signal $J_2$ of the operational amplifier $U_2$ has a level corresponding to (B+ D). On the other hand, the photodiode 302C is connected to the photodiode 302A in parallel and an output signal $J_3$ of the operational amplifier $U_3$ has a level corresponding to (A+ C). The operational amplifiers $U_4$ functions, together with four resistors R, as a subtracter and issues an output signal $J_4$ ($J_3-J_2$). In the shown state of the switch Sk, therefore, the position of the light receiving element 300 can be adjusted by monitoring a level (ΔV) of the output signal $J_4$. After completion of that position adjustment, the switch is changed over from the illustrated state to such a one that the photodiodes 302A and 302B are connected in parallel, and the photodiodes 302C and 302D are connected in parallel. In this state, the output signals $J_2$, $J_3$ take their levels corresponding to the intensity of the 0th order lights $L_0$, respectively. The switch Sk may be of a relay switch or analog switch which can be changed over in response to an external signal. Supplied to the printed circuit board PCB are source voltages ± Vc for the operational amplifiers and an earth level from the apparatus body via connectors $J_5$, $J_6$, $J_7$. Incidentally, the position adjustment of the light receiving element 300 using the signal $J_4$ from the above circuit is preferably performed once again after the adjustment of tele-centricity (i.e., the symmetry adjustment of the incident angles θr of the beams $LB_1$, $LB_2$) during the process of manufacturing the apparatus.

Further, as a technique of adjusting the positions of the diffracted lights 604, 605 and the 0th order lights $L_0$ for the light receiving system, it is conceivable to provide a tiltable parallel-planar glass in front of the light receiving element 300, and to control an inclined degree of the parallel-planar glass by a motor. In this case, upon tilting of the parallel-planar glass, three spots of the diffracted lights 604 (605) and the two 0th order lights $L_0$ are displaced concurrently over the light receiving element 300 in the array direction of those spots. Then, the switch Sk is changed over to the state shown in FIG. 26, and the output signal $J_4$ is applied, as a feed-back signal (i.e., a deviation signal), to a servo circuit for the motor of controlling an inclination of the parallel-planar glass. This allows the servo mechanism to start working as soon as the mirror surface member is placed in the intersecting region of the two beams $LB_1$, $LB_2$, whereby the parallel-planar glass is caused to stop at a predetermined inclined degree. Upon elapse of a certain period of time after the level ΔV of the output signal $J_4$ has become almost zero, the input terminal of the motor is forcibly dropped to a zero level (namely, the motor is disconnected from the servo circuit), followed by stopping the servo drive operation. With that process, the positions of the light receiving surface 300a and the diffracted lights 604 (605) can also be adjusted relatively in a similar manner. In this case of tilting the parallel-planar glass in the array direction of the grating in place of moving the light receiving element, it is possible to adjust the optimum light receiving positions using a mirror surface portion of the reference mark plate FM on the wafer stage 505, whenever the position of the object lens 521A of the alignment system is changed upon replacement of the reticle R. Note that the similar adjustment can also be performed with the differential operation of the photodiodes 302A and 302D, by omitting the photodiodes 302C, 302B and the switch Sk in FIG. 26.

Figure 27:
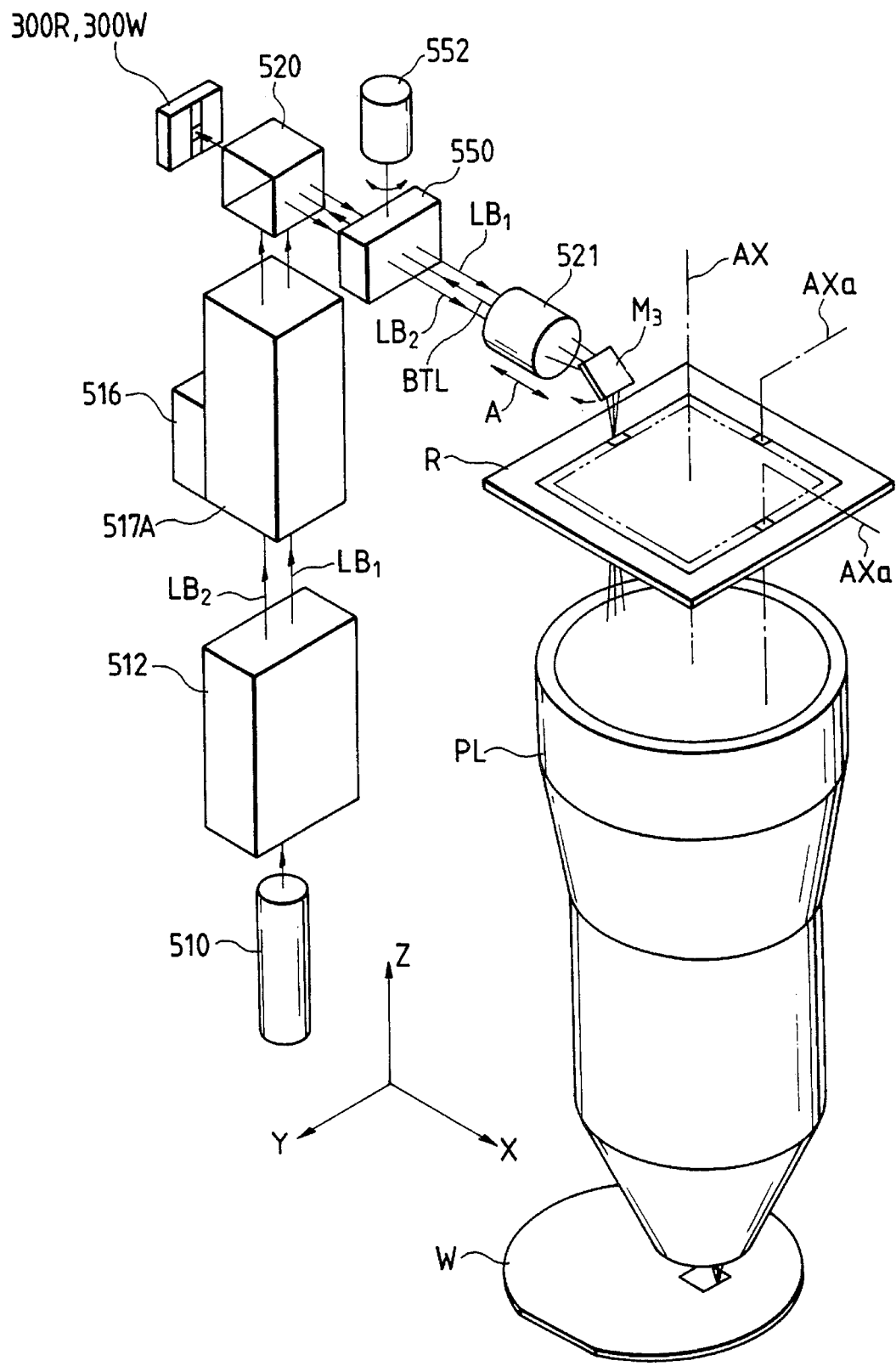
FIG. 27 is a perspective view showing the configuration of a projection type exposure equipment according to another modified embodiment of the present invention.

Next, another modified embodiment of the present invention will be described below with reference to FIG. 27. FIG. 27 shows the configuration of a stepper equipped with a conventional TTR alignment system. The components functioning in a like manner to those in FIG. 20 are designated by the same reference symbols. In this modified embodiment, a 2-focus object lens optical system 521 for alignment and a mirror $M_3$ are one-dimensionally moved together in the horizontal direction as indicated by an arrow A. Also, in FIG. 27, alignment marks RM are formed at three locations around the reticle 1 and the same alignment system is provided for each of mark positions, as with the embodiment of FIG. 21. Opto-electric detectors for receiving the diffracted lights from the wafer mark WM and the reticle mark RM are given by light receiving elements 300R, 300W (FIGS. 12A and 12B or FIG. 25) disposed in the pupil space. Here, the mirror $M_3$ is turned about 45° as indicated by an arrow from the illustrated position during exposure, whereby it is retreated so as not to interrupt the illumination light path for exposure.

In the case of the stepper thus arranged, the turning of the mirror $M_3$ may change tele-centricity of the optical axis AXa of the beams ($LB_1$, $LB_2$) and the alignment system with respect to the wafer W between the processes of alignment and exposure, and hence reproducibility in detecting the mark positions may be varied in small amounts for each of shot regions on the wafer, if the mirror $M_3$ is poor in position reproducibility. On the contrary, the mirror $M_3$ is required to be reduced in both size and weight to move the mirror $M_3$ into and out of the proper position at a high speed. Reproducibility of mechanical position is however naturally subjected to a limitation.

Therefore, this modified embodiment made it possible to automatically correct tele-centricity (i.e., symmetry of the incident angles θr of the beams $LB_1$, $LB_2$) immediately before starting alignment (mark detection) through the mirror $M_3$. In this case, it is assumed that the alignment for each of shot regions on the wafer is performed by finely moving the wafer W (wafer stage), and the reticle R is held fixed after initial setting. More specifically, after fixing the reticle R in place, the reflecting surface of the reference mark plate FM is first arranged below a projection lens PL. Then, by vertically moving the reference mark plate FM, tele-centricity is adjusted using a parallel-planar glass 550 disposed at the beam waist position or in the vicinity thereof. The parallel-planar glass 550 is turned by a drive motor 552 about a shaft vertical to the plane containing the beams $LB_1$, $LB_2$. After the adjustment, the position of the mark RM on the reticle R is detected and stored as a phase difference ør between the reference signal DR and the measurement signal DSr.

In order to successively perform alignment for each shot region on the die-by-die basis, immediately after turning the mirror $L_3$ about 45°, a new phase difference ør between the reference signal DR and the measurement signal DSr is checked and its deviation from the initially stored phase difference ør is monitored. If the deviation is larger than a predetermined value, the parallel-planar glass 550 is finely moved dependent on the amount of the deviation for automatically adjusting tele-centricity. Afterward, the reticle R and the shot region on the wafer W are aligned with each other using the measurement signal Sw corresponding to the wafer mark WM.

This results in an advantage that tele-centricity of the optical axis AXa of the alignment optical system on the wafer W is not affected by position reproducibility of the mirror $M_3$ after its turning, and can be kept substantially constant. In this connection, poor position reproducibility of the mirror $M_3$ is eventually none other than that the positional relationship between the reference grating 663 (FIG. 23) and the reticle mark RM is relatively shifted in a small amount in the array direction of the grating.

The above example can be realized on assumption that the position of the reticle R remains fixed during the processes of alignment and exposure. In the case of adopting the sequence in which the reticle R is finely moved during alignment for each of the shot regions, it is needed to read an amount of the fine movement from the interferometer 543 (FIG. 20), calculates the moved amount of the mark RM in the direction of measurement from that amount read, and determine a driven amount of the parallel-planar glass 550 based on both the amount calculated and the amount of deviation corresponding to the phase difference ør stored in advance. By way of example, supposing that the amount of deviation corresponding to the phase difference ør stored in advance is ΔXm, the reading of the interferometer 543 at the time of determining the phase difference ør is $Xr_1$, the amount of deviation corresponding to the phase difference ør' determined based on the signal DSr at the time of inserting the mirror $M_3$ for alignment of some shot region is ΔXm', and the reading of the interferometer 543 at that time is $Xr_2$, the error ΔXr of tele-centricity due to the mirror $M_3$ is given by:

$\Delta Xr = \Delta Xm - \Delta Xm' - (Xr_1 - Xr_2)$

Accordingly, the condition of making ΔXr almost zero is below:

$\Delta Xm' = \Delta Xm - (Xr_1 - Xr_2)$

Thus, it is just required to turn the parallel-planar glass 550 until ΔXm' becomes equal to ΔXm–(Xr$_1$–Xr$_2$). When the value of (Xr$_1$–Xr$_2$) is larger than ±½ pitch of the mark RM, the measured phase difference ør is handled on an assumption that its cycle is shifted by multiples of an integer correspondingly.

Although the second embodiment and its modified embodiments of the present invention have been explained above, they can also exactly similarly be practiced in the proximity system in which exposure is made with a mask and a wafer being set close to each other on the order of 10–300 μm. In the case of the system shown in FIG. 23, the spatial filter 523 may be moved in the direction of the optical axis upon movement of the object lens 521A. In this case, the moved amount of the spatial filter 523 is preferably proportional to the moved amount of the object lens 521A. However, since the numerical apertures (N. A.) of the diffracted lights BTL and the 0th order lights L$_0$ in the pupil space are very small as analyzed before, the spatial filter 523 and the object lens 521A are not necessarily moved in proportional relation. Alternatively, it is also possible to provide spatial filters which can be inserted into or removed from the pupil space at several locations, and to select one spatial filter at an appropriate location dependent on change in position of the object lens 21A. In addition, only the position of the wafer mark WM may be detected without detecting the reticle mark RM. This case can be adapted by arranging the object lens 521A so as to observe the wafer W via the projection lens PL from a level below the reticle R, or by forming a mere transparent window in place of the reticle mark RM.

Figure 28:
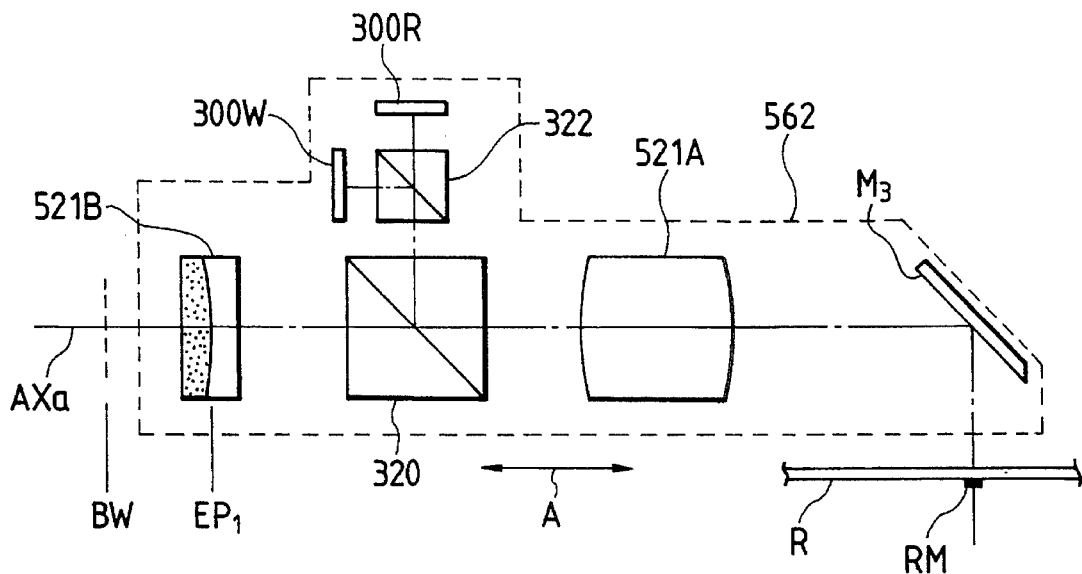
FIG. 28 is a view showing the configuration of an alignment system according to another modified embodiment of the present invention.

FIG. 28 shows the configuration of an alignment system according to another modified embodiment of the present invention. The same components as those shown in FIG. 20 or 27 are designated by the same reference symbols. In this modified embodiment, the object lens 521A is set to have a long focal length, and a beam splitter 320 is provided between the object lens 521A and the 2-focus element 521B so that diffracted lights BTL from the reticle mark RM or the wafer mark WM are taken out immediately after the object lens 521A. The diffracted lights BTL branched by the beam splitter 320 are then divided by a polarizing beam splitter 320 into the diffracted lights 604 of P-polarized component from the reticle mark RM and the diffracted lights of S-polarized component from the wafer mark WM, the diffracted lights 604, 605 being received by the light receiving elements 300R, 300W in FIGS. 12A and 12B or FIG. 25, respectively. Further, the fore end mirror M$_3$, the object lens 521A, the 2-focus element 521B, the beam splitters 320, 322, and the light receiving elements 300R, 300W are fixed together in the metal holder 562 to be moved as indicated by an arrow A upon changes of the mark position. Here, the light receiving elements 300R, 300W are arranged essentially in the same position as the pupil plane EP$_1$ of the object lens 521A. Supposing that the two beams LB$_1$, LB$_2$ are positioned on both sides about the optical axis AXa in the direction normal to the drawing sheet of FIG. 28, the positional relationship between the optical axis AXa and the light receiving surfaces can be adjusted by finely moving the polarizing beam splitter 322 and the light receiving elements 300R, 300W together in the direction normal to the drawing sheet as well as in the right and left direction on the drawing sheet.

The fore end mirror M$_3$ may be arranged to be turnable as shown in FIG. 27. Further, the system of this modified embodiment can also exactly similarly be applied to the system shown in FIG. 20. With this modified embodiment, since the light receiving elements 300R, 300W are disposed in the pupil space and fixed in the holder 562 together with the object lens 521A, it is possible to adapt for changes of the observing position without causing no effect on the positional relationship between the light receiving elements 300R, 300W and the optical axis AXa of the object lens 521A.

Figure 29:
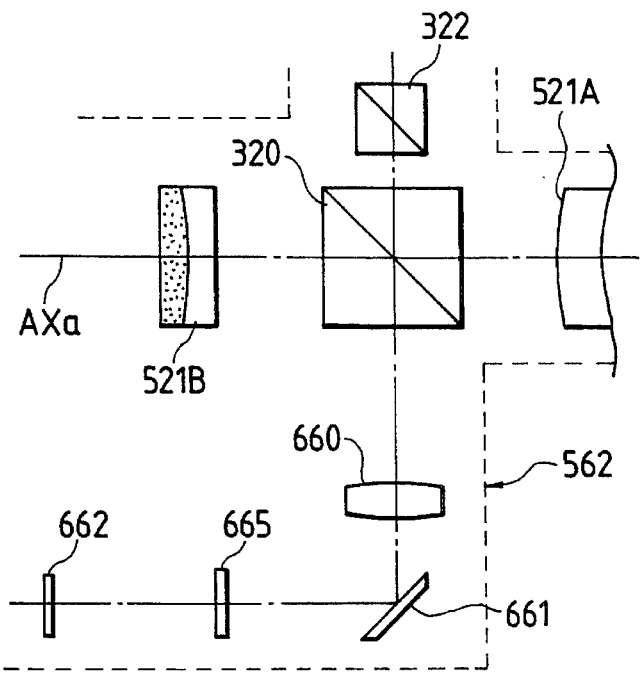
FIG. 29 is a view showing the configuration of an alignment system according to still another modified embodiment of the present invention.

FIG. 29 shows the configuration of another modified embodiment on the basis of the configuration of FIG. 28. In this modified embodiment, the reference signal producing section 516 shown in FIG. 20 is also provided together in the metal holder 562 for the object lens 521A. Since the beam splitter 320 divides the two beams LB$_1$, LB$_2$ having passed through the 2-focus element 521B in their amplitudes, the almost half intensity of those beams are lost in vain. As shown in FIG. 29, therefore, the nearly half of the beams LB$_1$, LB$_2$ reflected by the beam splitter 320 are led to the lens 660, the mirror 661, a polarizing plate 665, the reference grating plate 662, etc. which are housed together in the holder 562. Of course, the spatial filter 663 and the light receiving element 519 shown in FIG. 23 are provided together in the holder 562. The difference from the case of FIG. 23 is in that the polarizing plate 665 is disposed in front of the reference grating plate 662 to irradiate either one pair of the beams LB$_{1P}$, LB$_{2P}$ of P-polarized light and the beams LB$_{1P}$, LB$_{2P}$ of S-polarized light onto the reference grating plate 662.

According to the second embodiment of the present invention, as described above, when moving a part of the alignment optical system upon changes in the mark position, there is no need of providing a special optical system for correcting the optical path length, or the like required to maintain the pupil conjugate relation in the prior art. The structure of the alignment optical system can be very simple. It becomes hence possible to reduce the number of various error factors added in the mark detection, thereby improving accuracy of alignment.

Third Embodiment

Figure 30:
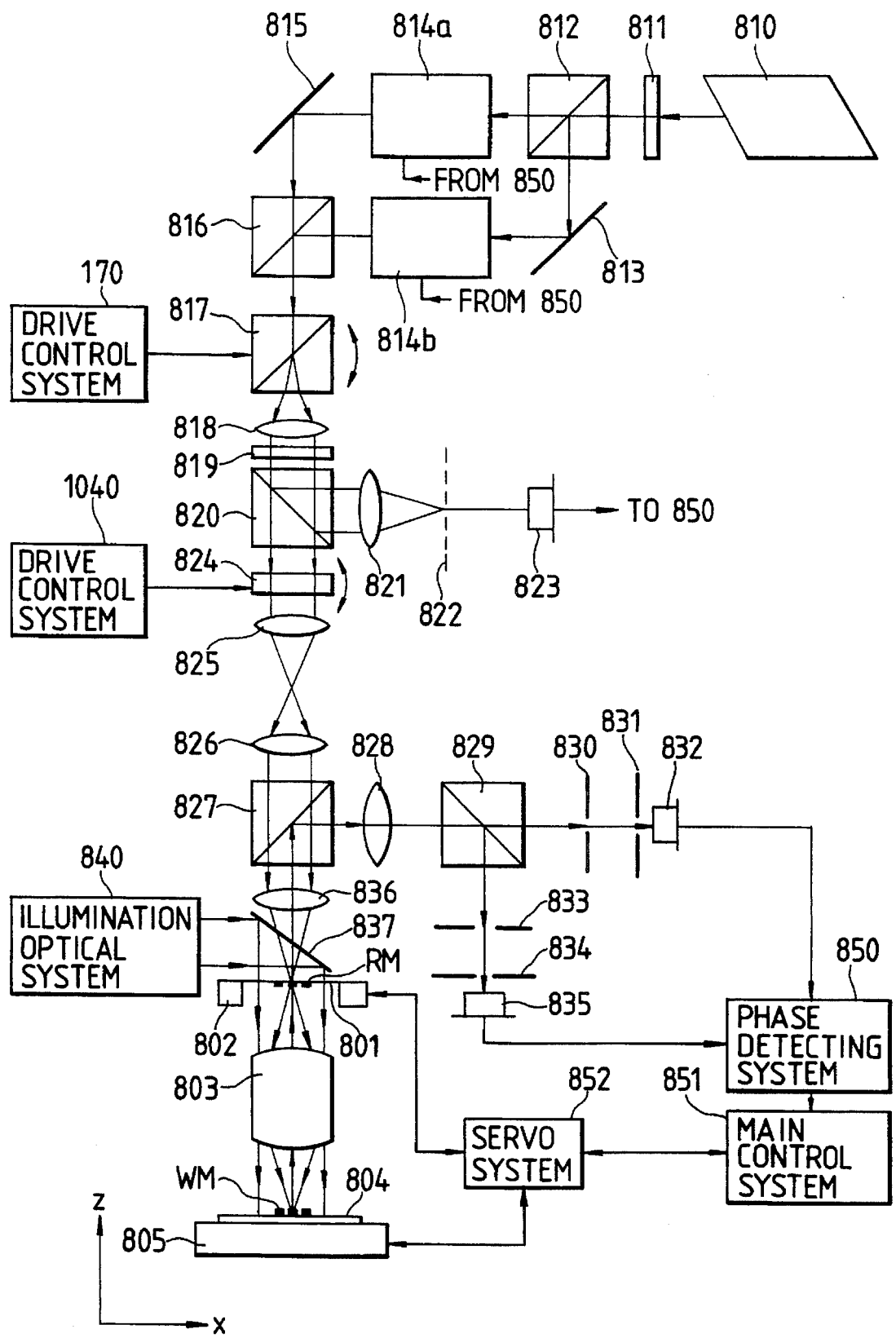
FIG. 30 is a diagrammatic view showing the configuration of a stepper according to a third embodiment of the present invention.

FIG. 30 is a view showing the schematic configuration of a position detecting apparatus according to a third embodiment of the present invention. The third embodiment will be described in detail hereinafter with reference to FIG. 30. A reticle (mask) 801 having a predetermined circuit pattern and a mark RM (grating) for alignment thereon is held on a reticle stage 802 movable two-dimensionally. Each pattern on the reticle 801 is imaged with an exposure light supplied via an illumination optical system 840 on a wafer 804 (substrate) through a projection lens 803. A grating mark WM similar to the grating mark RM formed on the reticle is formed on the wafer 804 as well.

The wafer 804 is held under suction on a stage 805 which is two-dimensionally movable using the step and repeat technique. When transfer of a pattern on the reticle to one shot region on the wafer has been completed, the wafer is stepped to a next shot position.

On each of the reticle stage 802 and the wafer stage 805, there are provided interferometers (not shown) adapted to detect a relevant position in the x-, y- and rotating (θ-) directions independently of one another. Then, each stage is driven by a drive motor (not shown) in the respective directions.

The exposure light from the illumination optical system 840 is reflected downwardly by a dichroic mirror 837 or the like obliquely disposed above the reticle an inclined angle of 45°, thereby to uniformly illuminate the reticle 801. The pattern on the reticle thus uniformly illuminated are then imaged and transferred onto the wafer through the projection lens 803.

On the other hand, an alignment optical system (810–836) for position detection is disposed above the dichroic mirror 837. The alignment optical system will now be described in detail.

An illumination light for alignment having a different longer wavelength than that of the exposure light is emitted from a laser source 810 and enters a ¼ wavelength plate 811 for conversion to a circularly polarized light. The circularly polarized beam is divided by the polarizing beam splitter 812 into a P-polarized beam and an S-polarized beam which have the same light intensity. The P-polarized beam (polarized in the direction containing the drawing sheet) having passed through the polarizing beam splitter 812 enters a first acoustic optical modulator 814a (hereinafter referred to simply as an AOM 814a), while the S-polarized beam (polarized in the direction vertical to the drawing sheet) having being reflected by the polarizing beam splitter 812 enters a second acoustic optical modulator 814b (hereinafter referred to simply as an AOM 814b) via a reflecting mirror 813. The AOM's 814a, 814b modulate the P-polarized beam at a frequency $f_1$ and modulates the S-polarized beam at a frequency $f_2$, respectively, so that a relative frequency difference between the S-polarized beam and the P-polarized beams becomes $\Delta f$.

The P-polarized beam modulated at the frequency $f_1$ by the AOM 814a reaches a polarizing beam splitter 816 via a reflecting mirror 815, and the S-polarized beam modulated at the frequency $f_2$ by the AOM 814b also reaches the polarizing beam splitter 816.

The beam splitter 816 synthesizes the two beams modulated at the different frequencies into the same optical path and introduces them to a Wollaston prism 817 as one of double-refractive or birefringent optical elements. The Wollaston prism 817 separates the incident beams into the P-polarized light of frequency $f_1$ and the S-polarized light of frequency $f_2$, which lights pass through a lens 818 and proceed in a separated state in parallel under the lens action. These two beams are then rotated in their polarizing directions through 45° by a ½ wavelength plate 819. Thus, the two beams are each divided by a polarizing beam splitter 820 into the P-polarized component in the passing-through direction and the S-polarized component in the reflecting direction.

The two beams reflected by the polarizing beam splitter 820 are caused by a lens 821 to intersect with each other at a reference grating 822 to form an interference fringe thereon which flows or drifts in the pitch of the grating. The diffracted lights from the grating 822 are opto-electrically detected by a detector 823 as a light beat signal for reference.

Meanwhile, the two beams having passed through the polarizing beam splitter 820 reach a parallel-planar plate 824 which is arranged in a tiltable manner. Though described later in detail, the parallel-planar plate 824 (optical correction member) has a function to eliminate an error which would otherwise be mixed into a position detection signal from the result of that the optical paths of the respective beams may be shifted dependent on an inclination of the Wollaston prism 817, and two beam spots formed at the pupil position of the alignment optical system may become asymmetrical with respect to the optical axis.

After passing through the parallel-planar plate 824, the two beams reach via a relay system (825, 826) a beam splitter 827 disposed near the pupil position of the alignment optical system. In this connection, although the parallel-planar plate 824 is disposed in the pupil space of the alignment optical system, it is more preferably disposed at the pupil position.

Then, the two beams passing through the beam splitter 827 and proceeding in parallel are irradiated via an object lens 836 and the dichroic mirror 837 to the grating mark RM on the reticle from two directions at a predetermined intersect angle.

When the projection lens 803 is not corrected in color aberration for the alignment light, it is desired that the object lens 836 is constituted by a 2-focus optical system which has been proposed in Japanese Patent Laid-Open No. 63-283129 by the same applicant of the present invention. In this case, the 2-focus optical system is arranged such that the polarizing directions of the incident beams are inclined with respect to the optical axis of the 2-focus optical system, for dividing each of the two polarized beams incident on the 2-focus optical system into the two components. As a result, one pair of beams proceeding toward a first focus are imaged on the reticle, while the other pair of beams proceeding toward a second focus are imaged at a position apart from the reticle and then imaged again on the wafer through the projection lens 803.

Figure 31A:
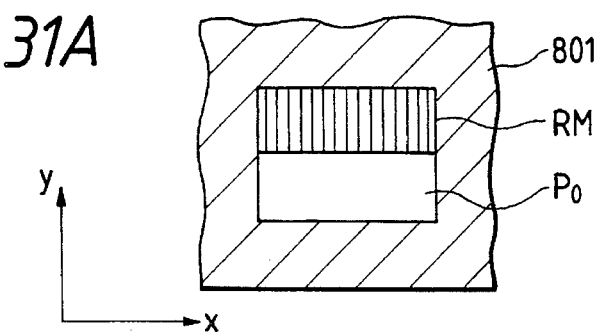
FIG. 31A is a plan view showing the form of a grating mark on a reticle.
Figure 31B:
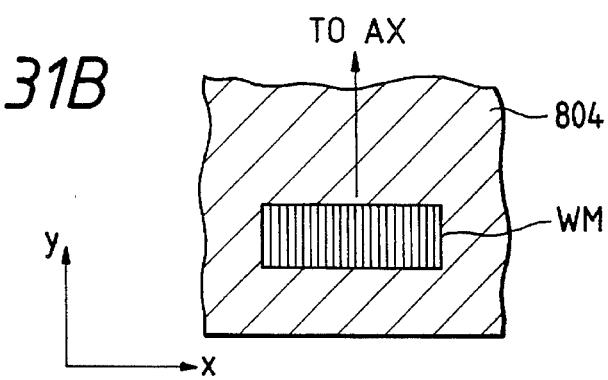
FIG. 31B is a plan view showing the form of a grating mark on a wafer.

In the reticle 801, as shown in FIG. 31A, there are provided the grating mark RM and a window Po for passing the alignment light therethrough (hereinafter referred to as a transparent window portion) in parallel. Corresponding to the transparent window portion Po, the grating mark WM having the same pitch as that of the grating mark RM formed on the reticle is formed on the wafer as shown in FIG. 31B.

Therefore, since a part of the alignment light is irradiated to the grating mark RM on the reticle from two directions at a predetermined intersect angle $\theta$, there appears an interference fringe which flows in the pitch direction of the grating. The intersect angle $\theta$ of the two beams is preset so that the diffracted and reflected lights of ± 1st order produced from the grating mark RM proceed in the direction of the optical axis.

Thus, the ± 1st order diffracted lights produced from the grating mark RM reversely pass through the dichroic mirror 837 and the object lens 836 again, and then reach a view field diaphragm 833 via the beam splitter 827, a lens 828 and a beam splitter 829.

Figure 31C:
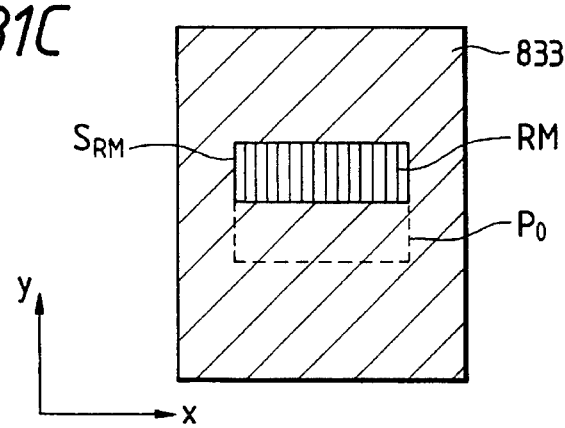
FIG. 31C is a plan view showing a field diaphragm for obtaining the diffracted lights from the grating mark on the reticle.

The view field diaphragm 833 is disposed in a position conjugate to the reticle 801. More specifically, as indicated by slant lines in FIG. 31C, the diaphragm 833 is formed with an opening $S_{RM}$ corresponding to the position of the grating mark RM, so that only the diffracted lights from the grating mark RM on the reticle 801 are allowed to pass through the diaphragm 833.

Accordingly, the diffracted lights from the grating mark RM which have passed through the view field diaphragm 833 are filtered by a spatial filter 834 to cut off the 0th order lights (i.e., the regularly reflected lights), and a light beat signal including information on the position of the reticle 801 is detected by a detector 835 in an opto-electric manner.

On the other hand, the remaining part of the alignment light having passed through the transparent window portion Po of the reticle is irradiated via the projection lens 803 to the grating mark WM formed by a diffraction grating on the wafer from two directions at a predetermined intersect angle. The ± 1st order diffracted lights produced from the grating mark WM and proceeding in the direction of the optical axis finally reach a view field diaphragm 830 via the projection lens 803, the dichroic mirror 837, the object lens 836, the beam splitter 827, the lens 828 and the beam splitter 829.

Figure 31D:
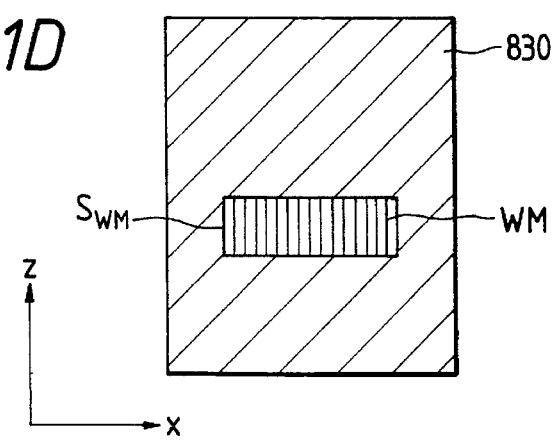
FIG. 31D is a plan view showing a field diaphragm for obtaining the diffracted lights from the grating mark on the wafer.

The view field diaphragm 830 is disposed in a position conjugate to the wafer 804. More specifically, as indicated by slant lines in FIG. 31D, the diaphragm 830 is formed with an opening $S_{WM}$ corresponding to the position of the grating mark WM, so that only the diffracted lights from the grating mark WM-on the wafer 804 are allowed to pass through the diaphragm 830.

Accordingly, the diffracted lights from the grating mark WM which have passed through the view field diaphragm 830 are filtered by a spatial filter 831 to cut off the 0th order lights (i.e., the regularly reflected lights), and a light beat signal including information on the position of the wafer 804 is detected by a detector 831 in an opto-electric manner.

The spatial filters (831, 834) are each arranged in a position substantially conjugate to the pupil plane of the alignment optical system, i.e., in a position virtually almost conjugate to the pupil (exit pupil) of the projection lens 803, and are set to cut off the 0th order lights (i.e., the regularly reflected lights) from the grating marks formed on the reticle and the wafer, while passing only the + 1st order diffracted lights (i.e., the diffracted lights produced in the direction vertical to the gratings on the reticle 801 and wafer 804) therethrough.

Further, the detectors (832, 835) are arranged to be substantially conjugate to the reticle 801 and the wafer 804 via the object lens 836 and the lens 828, respectively.

In this embodiment thus arranged, when the reticle 801 and the wafer 804 are rested at arbitrary positions in a not-aligned state, the three opto-electric signals obtained from the detectors (823, 832, 835) are all given by sinusoidal light beat signals of the same frequency Δf which are shifted by a certain phase difference from one another. Here, the phase difference (± 180°) between the two light beat signals from the reticle 801 and the wafer 804 uniquely corresponds to a shift amount in relative position of the grating marks formed on the reticle 801 and the wafer 804 within a range of ½ of the grating pitch.

When the reticle 801 and the wafer 804 are relatively moved in the array (pitch) direction of the grating marks (RM, WM), there produce the light beat signals of the same phase whenever the shift amount in relative position of the grating marks (RM, WM) becomes equal to ½ of the grating pitch. Therefore, the positions of the reticle and the wafer can be detected with high resolution by performing pre-alignment with accuracy less than ½ of the pitch of the grating mark (RM, WM), and then two-dimensionally moving the reticle stage 802 or the wafer stage 805 by a main control system 851 for proper alignment until the phase difference obtained by a phase difference detecting system 850 becomes zero through a servo system 852.

Alternatively, by using the light beat signal for reference obtained from the detector 823 as a reference signal, the alignment may be performed in such a manner that the phase differences between the reference signal and the respective light beat signals from the grating marks (RM, WM) each become zero. Of course, it is also possible to utilize drive signals, as reference signals, for driving the AOM's (815a, 815b).

Next, the Wollaston prism 817 for adjustment of the intersect angle will be described in detail which is used in this embodiment to irradiate the alignment light to the grating marks (RM, WM) from two directions at the predetermined intersect angle θ.

Figure 32:
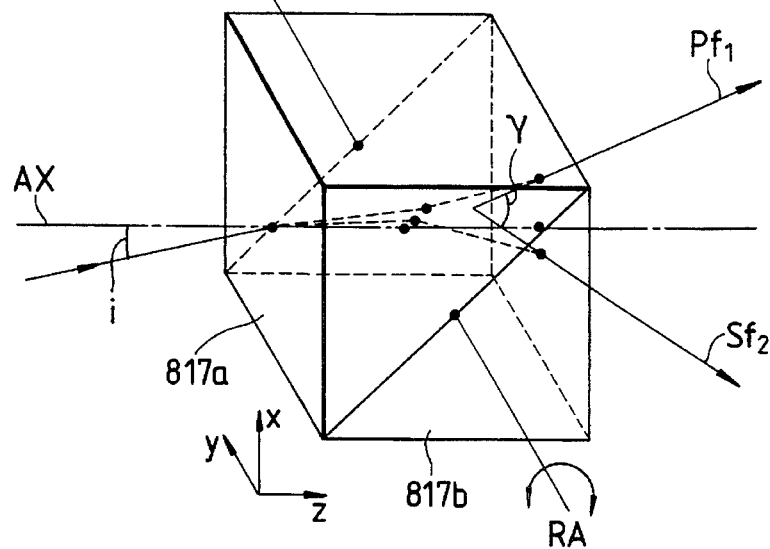
FIG. 32 is a perspective view of a Wollaston prism.
Figure 33:
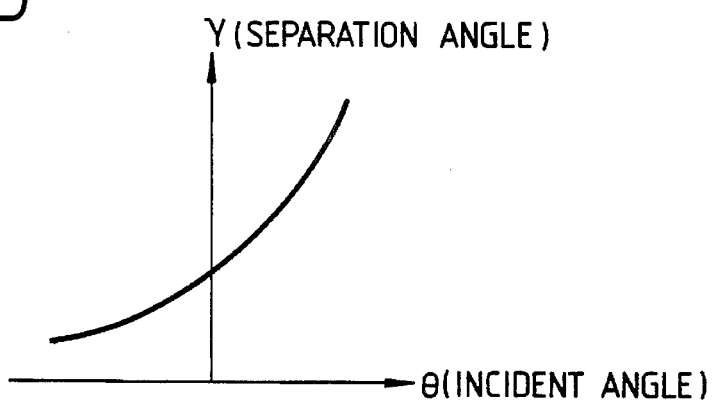
FIG. 33 is a graph showing an optical characteristic of the Wollaston prism.

The Wollaston prism 817 arranged substantially in conjugate relation to each of the reticle 801 and the wafer 804 in an optical sense comprises, as shown in FIG. 32, a trigonal double-refractive prism 817a with its optical axis extending in the y-direction, and a trigonal double-refractive prism 817b with its optical axis extending in the z-direction, these prisms being joined with each other at their slant surfaces.

When a beam comprising a P-polarized light of frequency $f_1$ and an S-polarized light of frequency $f_2$ now enters the prism 817 on the incident side face thereof at an incident angle i, the beam is separated into a beam $P_{f1}$ consisted of the P-polarized light of frequency $f_1$ which proceeds as an ordinary ray and a beam $S_{f2}$ consisted of the S-polarized light of frequency $f_2$ which proceeds as an extraordinary ray. These divided beams exit from the emergent side face of the prism 817b at a predetermined separation angle γ (which is an angle formed between the exiting direction of the P-polarized beam and the exiting direction of the S-polarized beam when they exit from the Wollaston prism 817). Such separation is attributable to the fact that the P-polarized light (ordinary ray) and the S-polarized light (extraordinary ray) are subjected to the different propagating directions while passing through an optical material of the prisms 817a, 817b.

The angle γ by which the P-polarized beam $P_{f1}$ of frequency $f_1$ and the S-polarized beam $S_{f2}$ of frequency $f_2$ are separated from each other through the Wollaston prism 817, is varied dependent on changes in the incident angle i of the beam entering prism 817. In this embodiment, therefore, the separation angle γ is adjusted by tilting the Wollaston prism about a rotation shaft RA provided at such a position as equally bisecting the joined surface of the prism, as illustrated.

FIG. 32 shows the optical characteristic relationship between the incident angle i entering the Wollaston prism and the separation angle γ of the beams separated by the Wollaston prism, as measured when tilting the prism about the rotation shaft RA.

By tilting the Wollaston prism to change the separation angle γ in such a manner, the mutual interval between the two beams propagating in parallel along the direction of the optical axis under the action of the lens 809 is varied and hence the intersect angle θ of the two beams irradiating the reticle 801 and the wafer 804 from two directions can eventually be adjusted freely. In other words, changes of the separation angle γ corresponds to changes of the intersect angle.

Accordingly, if the grating marks (RM, WM) are formed on the reticle and the wafer with the still finer pitch P in order to increase resolution for higher alignment accuracy, the larger intersect angle is required as will be apparent from the equation (1) mentioned before. However, this case can easily be adapted simply by changing an inclination of the Wollaston prism 817 so as to have a larger angle.

For automatically adjusting the intersect angle in this embodiment, it is desired to previously store the correlation between the inclined degree of the Wollaston prism 817 and the intersect angle in the main control system 851 or the like, and to provide a control drive system 970 which includes attitude detecting means for detecting an attitude (inclined state) of the Wollaston prism 817.

Now, if the intersect angle is deviated from the predetermined value, the main control system 851 computes the inclined degree of the Wollaston prism 817 required to provide the predetermined intersect angle from attitude information of the Wollaston prism 817 detected by the attitude detecting means on the basis of the correlation information stored in advance, and then issues a command to the drive control system 970 for tilting the Wollaston prism 817 by the computed degree. In response to the command, the drive control system 970 tilts the Wollaston prism 817 until it takes a predetermined attitude. At this time, the main control system 851 determines whether or not adjustment of the intersect angle is being performed correctly, by checking whether or not the light beat signals obtained from the detectors are kept at maximum contrast. If the light beat signals are not in a satisfactory contrast state, the main control system 851 outputs a signal to finely adjust an inclination of the Wollaston prism to the right and left, whereby the drive control system 970 is driven to correct the attitude of the Wollaston prism 817 so as to exhibit maximum contrast.

By arranging the apparatus to be able to automatically adjust the intersect angle as mentioned above, it becomes possible to precisely and promptly adapt for not only fine adjustment of the intersect angle, but also different type adjustment of changing the intersect angle to a large extent.

However, the optical paths of the respective beams are varied dependent on the inclined angle of the Wollaston prism 817. Strictly speaking, the two beams are out of symmetry about the optical axis of the alignment optical system, and the beam spots of those beams formed at the pupil position of the alignment optical system becomes asymmetrical about the optical axis. This further results in that the incident angles of the two beams irradiating each of the grating marks (RM, WM) from two directions become asymmetrical about the direction of normal to the grating mark, and tele-centricity (i.e., parallelism of the line bisecting the two beams irradiated to the grating marks from two directions with respect to the optical axis of the projection lens) is deteriorated.

For the reason, if the reticle 801 or the wafer 804 is slightly displaced from a predetermined position in the direction of the optical axis of the projection lens 803 (i.e., in the z-direction), the same phase points of the interference fringes formed on the respective grating marks are relatively shifted in the array (pitch) direction of the grating, thereby causing an error in the position detection.

In this embodiment, therefore, the parallel-planar plate 824 functioning as an optical correction member to correct tele-centricity is arranged to be turnable about a rotation shaft extending vertically to the drawing sheet of FIG. 30. The parallel-planar plate 824 is turned about that rotation shaft to have a predetermined inclined degree dependent on the inclined degree of the Wollaston prism 817.

Figure 34:
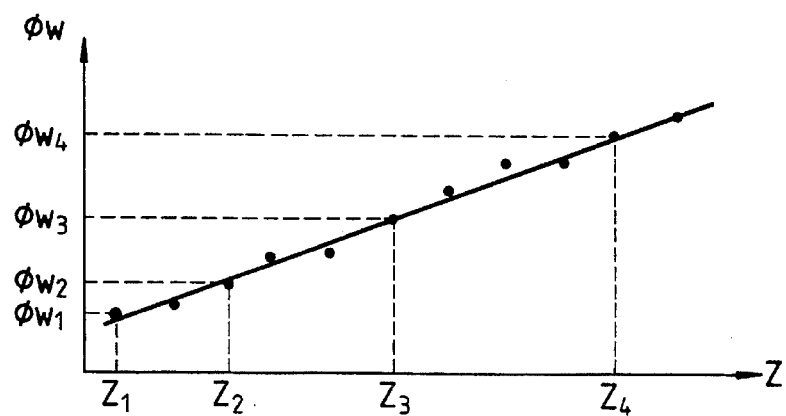
FIG. 34 is a graph showing measured values of telecentricity.

Such adjustment of tele-centricity can automatically be performed as follows. As shown in FIG. 34, for example, the phase difference between the light beat signal opto-electrically detected by the detector and the signal for driving the AOM is sampled successively for each small displacement of the reticle stage 802 or the wafer stage 805 in the direction of the optical axis of the projection lens 803. Assuming that the lateral shift amount corresponding to a difference $\Delta \phi_w$ between $\phi_{w1}$ and $\phi_{w4}$ is given by $\Delta X$, the value of $T = \Delta X / |Z_1 - Z_4|$ is determined. Here, the value of $|Z_1 - Z_4|$ represents the moved amount of the reticle stage 802 or the wafer stage 805 within a range capable of position detection. And T represents a degree of tele-centricity. The smaller the value of T, the higher the degree of tele-centricity.

The main control system 851 judges as to whether or not the value of tele-centricity T thus determined is within an allowable range. If the determined value is out of the allowable range, the main control system 851 computes an appropriate inclined degree of the parallel-planar plate 824 based on a difference between the target tele-centricity and the measured tele-centricity, and issues a command to a drive control system 1040 for tilting the parallel-planar plate 824 to the computed inclined degree.

With the above-mentioned arrangement, by tilting the parallel-planar plate 824 to the appropriate inclined degree, the two beam spot positions formed at the pupil position of the alignment optical system become symmetry about the optical axis thereof. It is thus possible to irradiate the two beams to each grating mark (RM, WM) at the incident angles kept symmetrical about the optical axis of the object lens 833, while maintaining the predetermined intersect angle.

The parallel-planar plate 824 for correcting tele-centricity is only required to be disposed in the pupil space of the alignment optical system. With the parallel-planar plate 824 being disposed in the optical path between the lens 818 and the polarizing beam splitter 820, the two beams irradiating each of the grating marks (RM, WM) and the reference grating 822 from two directions can be corrected in tele-centricity at the same time. Alternatively, in addition to the parallel-planar plate 824 disposed between the polarizing beam splitter 820 and the lens 825, another parallel-planar plate for correcting tele-centricity may be disposed between the polarizing beam splitter 820 and the lens 821 on the side of detecting the reference light.

In short, when adjusting the intersect angle, the Wollaston prism 817 in the alignment optical system is changed into the optimum inclined angle, while adjusting an inclination of the parallel-planar plate 824 to correct tele-centricity in interlock relation, with the result that the grating marks (RM, WM) can each be irradiated from two directions at a predetermined intersect angle without affecting the (conjugate) relationship for imaging in the respective optical systems at all. This permits to always keep satisfactory contrast and high reliability, provide the stable opto-electric signals, and hence perform precise alignment.

Next, another modified embodiment of the present invention will be described in detail with reference to the schematic configuration of a modified position detecting apparatus shown in FIG. 35.

In this modified embodiment, the components common to those in FIG. 30 which shows the schematic configuration of the third embodiment are designated by the same reference symbols.

In place of the Wollaston prism used in the above embodiment, this modified embodiment includes a double-refractive optical element 971 comprising a pair of wedge-like double-refractive prisms which are arranged to face each other at their slant surfaces with the incident side face and the emergent side face being located substantially in parallel, and to be movable along the direction in which the slant surfaces are extending.

Figure 35:
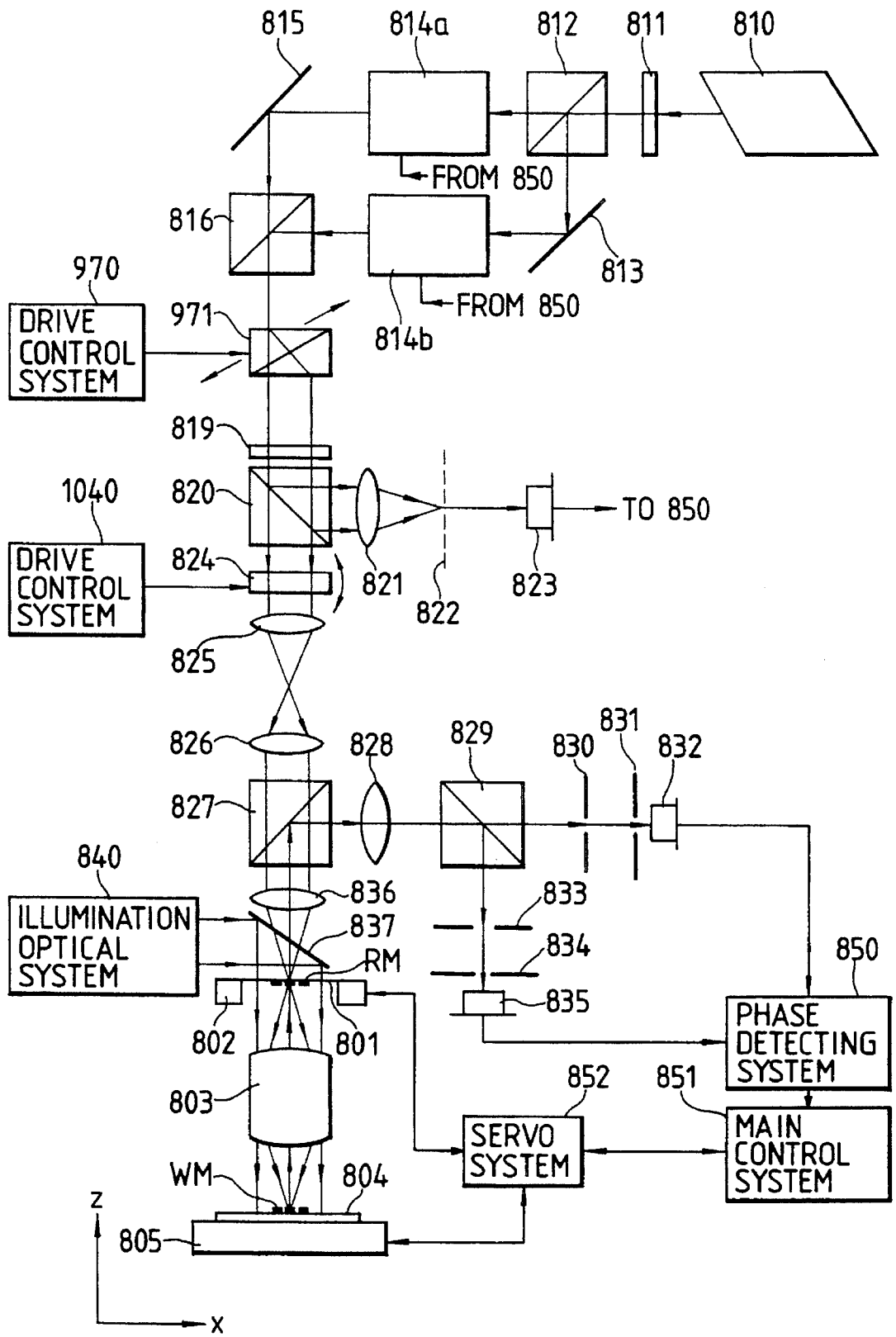
FIG. 35 is a diagrammatic view showing the configuration of a stepper according to a modified embodiment of the present invention.

As with the above embodiment, the double-refractive optical element 971 is disposed substantially at the pupil conjugate position of the alignment optical system after two beams modulated by AOM's or the like at different frequencies from each other have been led by a polarizing beam splitter onto the same optical path, as illustrated in FIG. 35.

Figure 36A:
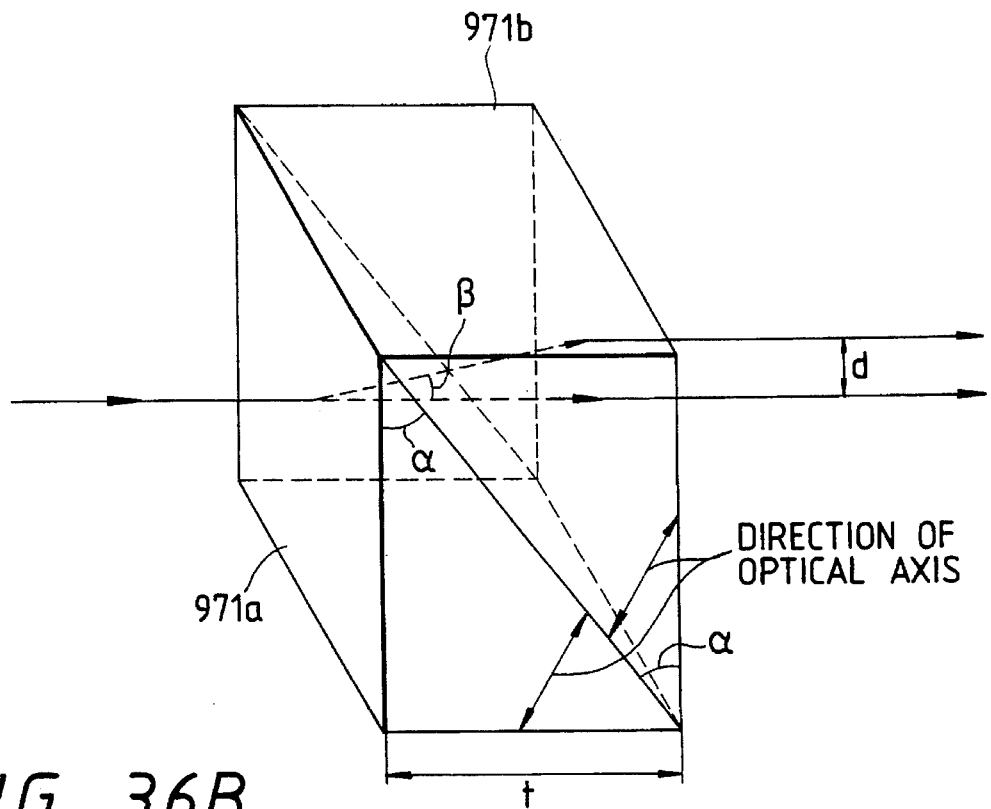
FIG. 36A is a perspective view of a double-refractive optical element constituted by a pair of wedge-like double-refractive prisms.

As shown in FIG. 36A, the pair of wedge-like double-refractive prisms 971a, 971b jointly constituting the double-refractive optical element 971 have their apical angles α equal to each other. Then, one wedge-like double-refractive prism 971a is set so as to have its optical axis extending in a predetermined direction with respect to the incident surface, and the other wedge-like double-refractive prism 971b is set so as to have its optical axis extending in a similar direction.

Further, as illustrated, when a beam comprising a P-polarized light of frequency $f_1$ and an S-polarized light of frequency $f_2$ enters the incident side face of the wedge-like double-refractive prism 971a at a right angle, the beam is separated into a P-polarized beam $P_{f1}$ (extraordinary ray) of frequency $f_1$ which proceeds straightforward and an S-polarized beam $S_{f2}$ (ordinary ray) of frequency $f_2$ which proceeds at a predetermined angle. These divided beams exit from the wedge-like double-refractive prism 971b in parallel to each other.

Figure 36B:
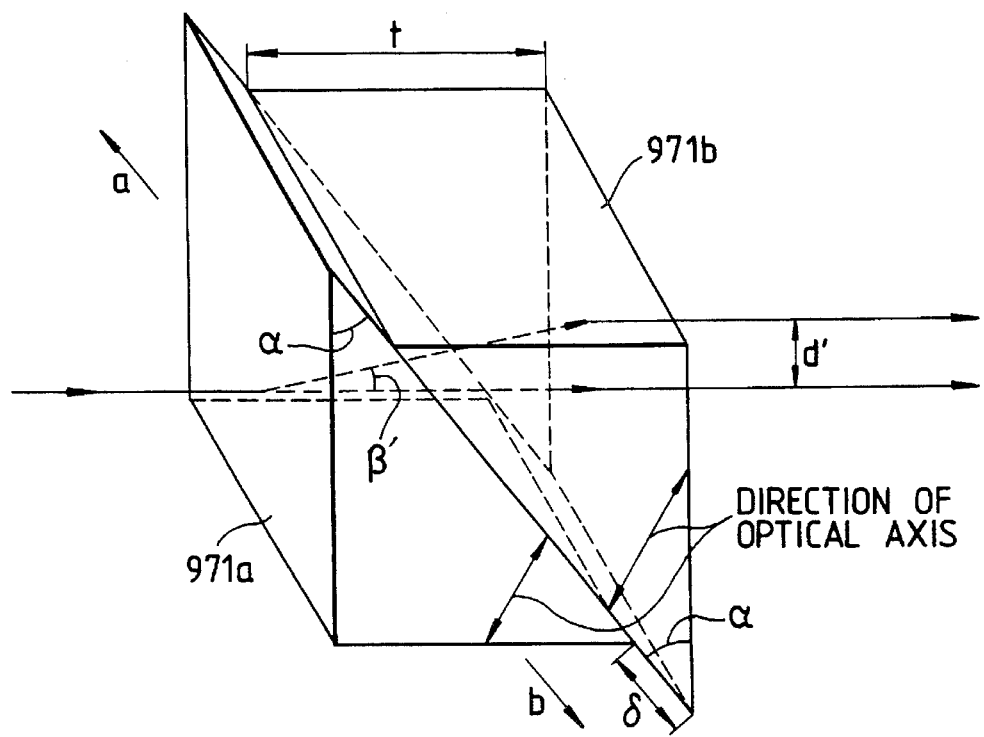
FIG. 36B is a view showing the state that one of the wedge-like double-refractive prisms is moved along the slant surfaces thereof.
Figure 37:
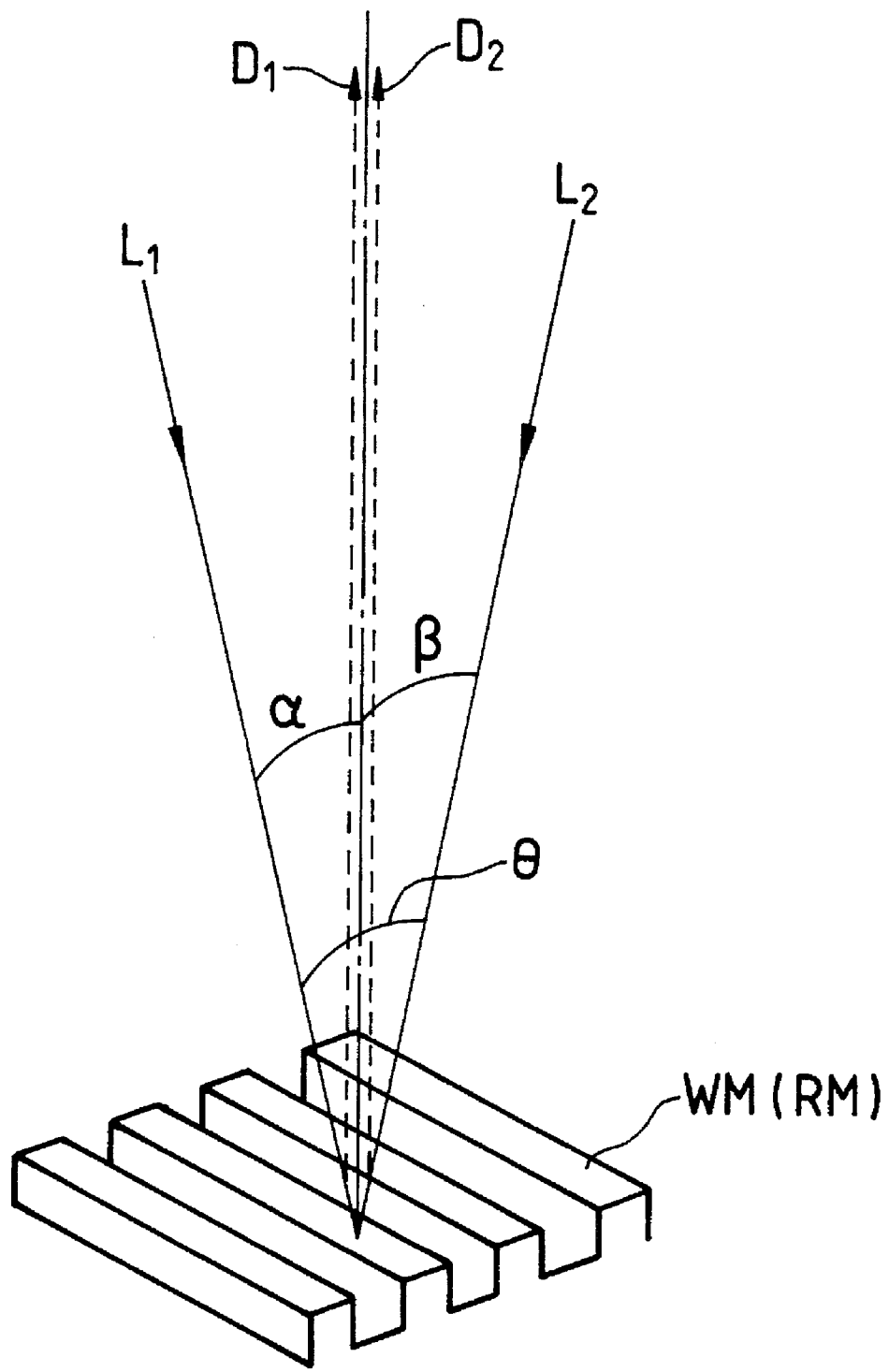
FIG. 37 is a view showing the state that the diffracted lights are produced by irradiating two coherent light beams to a diffraction grating.
Figure 38:
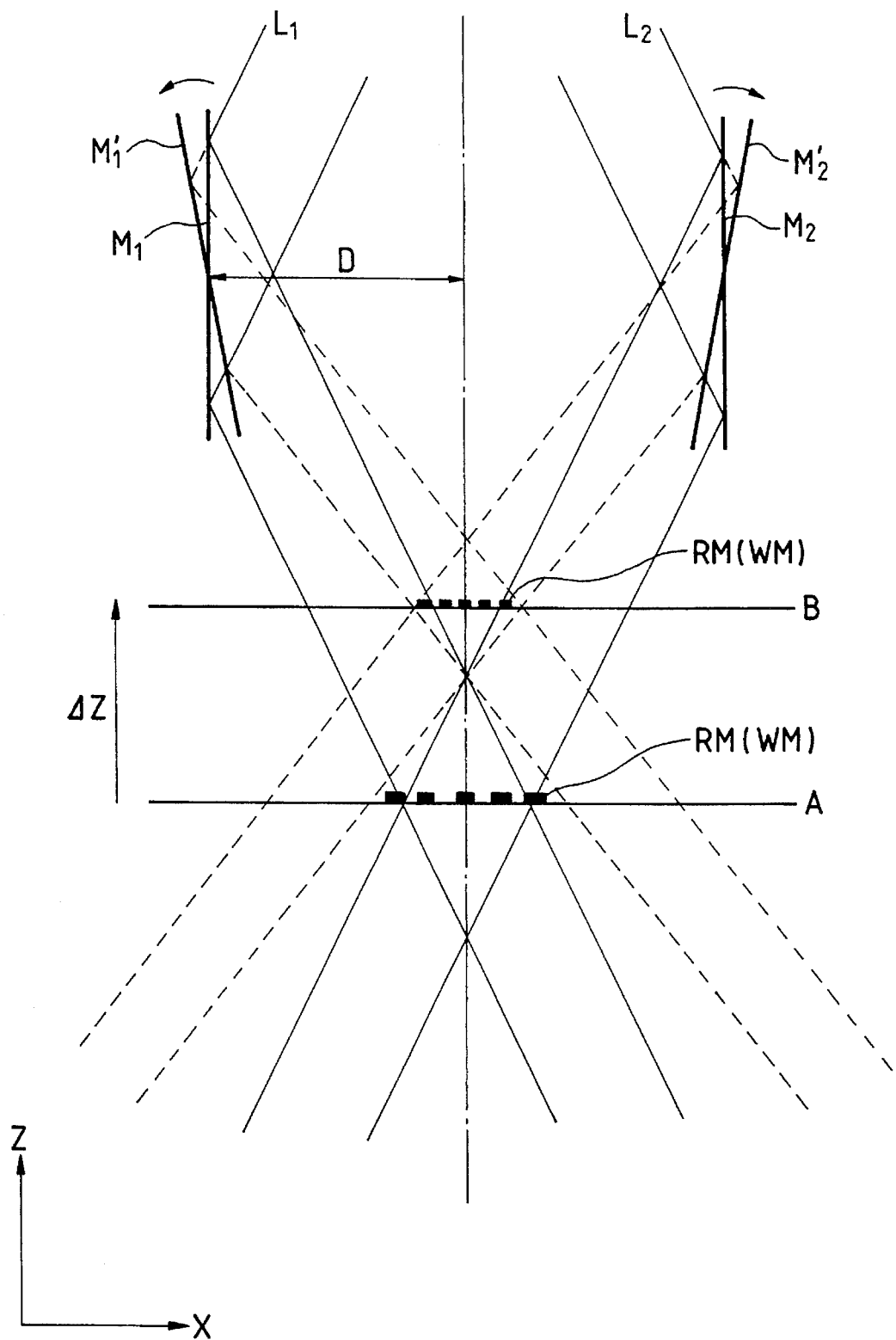
FIG. 38 is a view showing the manner of adjusting the intersect angle in a conventional apparatus.

When the wedge-like double-refractive prism 971a is now moved in the direction of an arrow a along the slant surfaces of the paired double-refractive prisms, as shown in FIG. 36B, such that parallelism between the incident side face and the emergent side face of the double-refractive optical element 971 is maintained, the interval or distance d' between the two beams exiting from the wedge-like double-refractive prism 971b is increased dependent on the moved amount δ of the prism 971a. On the contrary, when the wedge-like double-refractive prism 971a is moved in the direction of an arrow b, the interval or distance d' between the two beams exiting from the wedge-like double-refractive prism 971b is decreased dependent on the moved amount of the prism 971a.

Thus, as the optical paths of the two polarized beams proceeding through the double-refractive optical element 971 is changed, the relative interval between the two polarized beams exiting from the double-refractive optical element is also changed, and a degree of this change in the beam-to-beam interval corresponds to a change of the intersect angle.

The interval d between the two beams of P- and S-polarized lights separated by the double-refractive optical element is given by:

$$d = (t \pm \delta \sin \alpha) \tan \beta \qquad (22)$$

Here, the apical angle of each wedge-like double-refractive prism (971a, 971b) is α, the angle by which the beam incident on the wedge-like double-refractive prism 971a is separated into the P-polarized beam and the S-polarized beam from each other is β, the moved amount as measured when the two wedge-like double-refractive prisms are relatively moved along the slant surfaces thereof is ± δ, and the thickness of each double-refractive optical element in the direction of the optical axis is t.

As described above, since the intersect angle θ of the beams irradiating each grating mark (RM, WM) from two directions can easily be adjusted by relatively moving the pair of wedge-like double-refractive prisms by an appropriate amount in the direction in which the slant surfaces of the prisms are extending, it becomes possible to sufficiently adapt for various grating marks (RM, WM) having different value of the pitch.

In the illustrated embodiment, the pair of wedge-like prisms constituting the double-refractive optical element 971 are held contacted with each other at their slant surfaces. As an alternative, however, the pair of wedge-like prisms may be arranged to face each other with a space left between their slant surfaces, and may relatively be moved along the slant surfaces while keeping constant an air gap defined between the slant surfaces of the wedge-like double-refractive prisms.

Automatic adjustment of the intersect angle in this embodiment can be achieved, for example, by previously storing in a main control system 851 or the like the correlation between the relative moved amount of the paired wedge-like double-refractive prisms constituting the double-refractive optical element 971 and the intersect angle changed upon that relative moved amount, and by providing a control drive system 970 which includes moved-amount detecting means for detecting the relative movement of the paired wedge-like double-refractive prisms along their slant surfaces.

Now, if the intersect angle is deviated from the predetermined value, the main control system 851 computes the moved amount of the paired wedge-like double-refractive prisms required to provide the predetermined intersect angle from the current relative moved amount of the paired wedge-like prisms (971a, 971b) detected by the moved-amount detecting means on the basis of the correlation information stored in advance, and then issues a command to the drive control system 970 for relatively moving the paired wedge-like prisms (971a, 971b) along their slant surfaces by the computed amount. At this time, the main control system 851 determines whether or not adjustment of the intersect angle is being performed correctly, by checking whether or not the light beat signals obtained from the detectors are kept at maximum contrast. If the light beat signals are not in a satisfactory contrast state, the main control system 851 outputs a signal to finely move the paired wedge-like prisms (971a, 971b) along their slant surfaces relatively, whereby the drive control system 970 is driven to correct the relative moved amount of the paired wedge-like prisms (971a, 971b) so as to exhibit maximum contrast.

By arranging the apparatus to be able to automatically adjust the intersect angle as mentioned above, it becomes possible to precisely and promptly adapt for not only fine adjustment of the intersect angle, but also different type adjustment of changing the intersect angle to a large extent.

In this embodiment too, however, when the pair of wedge-like double-refractive prisms are moved along their slant surfaces for adjusting the intersect angle, the optical paths of the respective beams proceeding on both sides of the optical axis of the alignment optical system are varied, and hence the incident angles of the two beams irradiating each of the grating marks (RM, WM) from two directions become asymmetrical about the direction of normal to the grating mark, thereby deteriorating tele-centricity. For the reason, if the reticle 801 or the wafer 804 is slightly displaced from a predetermined position in the direction of the optical axis of the projection lens 803, an error is mixed into the signal detected.

In this embodiment too, therefore, the parallel-planar plate 824 is changed in its inclined angle with respect to the optical axis dependent on the relative movement of the paired wedge-like double-refractive prisms (971a, 971b) for maintaining tele-centricity, in a like manner to the above embodiment.

Because the deteriorated tele-centricity incidental to adjustment of the intersect angle can be corrected by the process similar to that explained in connection with the above embodiment, the explanation of the correction process is omitted here.

Further, the parallel-planar plate 824 for correcting tele-centricity is only required to be disposed in the pupil space of the alignment optical system, as with the above embodiment. The position and number of parallel-planar plate 824 to be disposed are not limited to those in the illustrated embodiment.

With this embodiment, when adjusting the intersect angle, the pair of wedge-like prisms (971a, 971b) in the alignment optical system is relatively moved by the optimum moved amount along their slant surfaces, while adjusting an inclination of the parallel-planar plate 824 to correct tele-centricity in interlock relation, with the result that the grating marks (RM, WM) can also each be irradiated from two directions at a predetermined intersect angle without affecting the (conjugate) relationship for imaging in the respective optical systems at all. This permits to always keep satisfactory contrast and high reliability, provide the stable optoelectric signals, and hence perform precise alignment.

In any of the third embodiment and the modified embodiments thereof, if the direction in which the interference fringe is produced (or arrayed) upon irradiation of the beams to each grating mark (RM, WM) from two directions is deviated from the array (or pitch) direction of the grating mark (RM, WM), contrast of the detection signals is remarkably lowered to such an extent that the position detection may be difficult to perform in a stable manner.

This can be coped by simultaneously rotating both the Wollaston prism 817 and the parallel-planar plate 824 about the optical axis by a degree corresponding to the deviated amount. In this connection, the polarizing separation surface of the Wollaston prism 817 at which the P-polarized light and the S-polarized light are separated from each other is also rotated. Therefore, a ½ wavelength plate or the like is disposed between the polarizing beam splitter 816 and the Wollaston prism 817, and then rotated about the optical axis so as to rotate the polarizing direction of the beam incident upon the Wollaston prism by a predetermined degree. For automatic correction in this case, it is desired that the respective components are controlled in their rotation degrees to provide maximum contrast of the light beat signals detected by the detectors (832, 835).

Although the Wollaston prism and the double-refractive optical element prepared by combining a pair of wedge-like double-refractive prisms are employed in the third embodiment and its modified embodiments of the present invention, any suitable other double-refractive optical elements such as a Rochon prism, a Senermont prism, or a combination of a double-refractive prism and an isotropic glass having no birefringence, may be used instead.

Moreover, the present invention is not limited to the embodiments as mentioned above, and may also be applied to the arrangement capable of irradiating an alignment light to a grating mark on a wafer from two directions through a projection lens without passing a reticle, as proposed in Japanese Patent Laid-Open No. 60-130742 by the same applicant of the present invention. The present invention is further applicable to the proximity system and can sufficiently be adapted for aligners operating with the homodyne interference process as well.

According to the present invention, as described above, by changing the separation angle of two beams separated from the alignment light by the double-refractive optical element, or the distance between those two beams, it becomes possible to adjust the intersect angle of the two beams without moving the stage which holds the reticle or the wafer. The various problems in the prior art can thereby be cleared away to provide beat signals which are always high in contrast and reliability and are cyclically changed at the equal pitch, with the simple arrangement, thereby enabling to achieve precise and stable position detection with high accuracy.

In addition, the present invention can also easily be adapted to various grating marks for alignment which have different values of the pitch.

We claim:

1. A projection type exposure apparatus including, a projection optical system for projecting a pattern formed on a mask;

a substrate stage member for holding a photosensitive substrate onto which the pattern is projected, and movable in a two dimensional X-Y plane substantially perpendicular to an optical axis of said projection optical axis and further movable in a Z direction along the optical axis; and a pattern position detecting device for radiating two beams, each of which intersects the other on said photosensitive substrate and has a frequency which is different from that of the other, and for optoelectrically detecting and converting beat light caused by interference between at least two diffracted beams generated along the same direction from a grating pattern on said photosensitive substrate, into a signal, and for determining a position of the grating pattern along a pitch direction thereof based on phase of the signal, thereby detecting the grating pattern formed on said photosensitive substrate or an alignment; said apparatus comprising:

(a) a reference plate provided on said substrate stage member and having a reference grating pattern which is substantially the same as the grating pattern on said photosensitive substrate;

(b) a first stage control system for positioning said substrate stage member in the X-Y plane so that the reference grating pattern is irradiated by the two beams from said pattern position detecting device;

(c) a second stage control system for controlling movement of said substrate stage member along the Z direction go that said reference grating pattern is moved parallel to the optical axis of said projection optical system within a range where the two beams intersect;

(d) a monitoring device to monitor the phase of the signal optoelectrically detected and converted from the beat light generated from the reference grating pattern by said pattern position detecting device at each predetermined change in position of said reference plate on said substrate stage member along the Z direction;

(e) a calculating device to calculate an inclination of an imaginary line bisecting an intersect angle formed between the two beams at the grating pattern, based on a characteristic of a change in the phase of the signal with respect to a change in said position along the Z direction; and an optical element to compensate the incident angle of each of the two beams at the grating pattern so that the imaginary line is maintained substantially perpendicular to the pitch direction of said grating pattern.

2. A projection type exposure apparatus including, a projection optical system for projecting a pattern formed on a mask;

a substrate stage member for holding a photosensitive substrate onto which the pattern is projected, and movable in a two dimensional X-Y plane substantially perpendicular to an optical axis of said projection optical axis and further movable in a Z direction along the optical axis; and a pattern position detecting device for radiating two beams, each of which intersects the other on said photosensitive substrate and has a frequency which is different from that of the other, and for optoelectrically detecting and converting beat light caused by interference between at least two diffracted beams generated along the same direction from a grating pattern on said photosensitive substrate, into a signal, and for determining a position of the grating pattern along a pitch direction thereof based on phase of the signal, thereby detecting the grating pattern formed on said photosensitive substrate for an alignment; said apparatus comprising:

(a) a reference plate provided on said substrate stage member and having a reference grating pattern which is substantially the same as the grating pattern on said photosensitive substrate;

(b) a first stage control system for positioning said substrate stage member in the X-Y plane so that the reference grating pattern is irradiated by the two beams from said pattern position detecting device, and for servo-controlling said substrate stage member so that the phase of the signal optoelectrically detected and converted from the beat light generated from the reference grating pattern by said pattern position detecting device is held in a predetermined state;

(c) a second stage control system for controlling said substrate stage member under the servo-control of said first stage control system so that said reference grating pattern is moved along the Z direction parallel to the optical axis of said projection optical system within a range where the two beams intersect;

(d) a measuring device for detecting a displacement amount of said substrate stage member in the X-Y plane, which occurs as said substrate stage member is moved along the Z direction by said second stage control system;

(e) a calculating device to calculate an inclination of an imaginary line bisecting an intersect angle formed between the two beams at the grating pattern, based on change in position of said substrate stage member along the Z direction and the detected displacement amount thereof in the X-Y plane; and an optical compensating device to change the incident angle of each of the two beams at the grating pattern based on the calculated inclination so that the imaginary line is maintained substantially perpendicular to the pitch direction of said grating pattern.

3. A projection type exposure apparatus including, a projection optical system for projecting a pattern formed on am ask;

a substrate stage member for holding a photosensitive substrate onto which the pattern is projected, and movable in a two dimensional X-Y plane substantially perpendicular to an optical axis of said projection optical axis and further movable in a Z direction along the optical axis; and a pattern position detecting device for radiating two beams, each of which intersects the other on said photosensitive substrate and has a frequency which is different from that of the other, and for optoelectrically detecting and converting beat light caused by interference between at least two diffracted beams generated along the same direction from a grating pattern on said photosensitive substrate, into a signal, and for determining a position of the grating pattern along a pitch direction thereof based on phase of the signal, thereby detecting the grating pattern formed on said photosensitive substrate for an alignment; said apparatus comprising:

(a) a reference plate provided on said substrate stage member and having a reference grating pattern which is substantially the same as the grating pattern on said photosensitive substrate;

(b) a first stage control system for positioning said substrate stage member in the X-Y plane so that the reference grating pattern is irradiated by the two beans from said pattern position detecting device;

(c) a second stage control system for controlling movement of said substrate stage member along the Z direction so that said reference grating pattern is moved parallel to the optical axis of said projection optical system within a predetermined range where the two beams intersect;

(d) an indicating device for indicating a beat signal waveform or Lissajous's figure of the signal optoelectrically detected and converted from the beat light generated from the reference grating pattern by said pattern position detecting device; and (e) an adjusting device to change incident angles of the two beams with respect to said reference plate while maintaining constant an intersect angle between the two beams as said reference grating pattern is moved along the Z direction within the predetermined range by said second stage control system, until the signal waveform or the Lissajous's figure indicated by said indicating device represents a substantially constant phase state.

4. A position detecting apparatus including, a light source of coherent light;

a divider for dividing a beam from said light source into two beams;

an objective optical system for receiving the two beams and making the two beams intersect each other on a diffraction grating pattern of an object, the position of which is to be detected; and an optoelectric detector for receiving at least two diffracted beams generated along the same direction from said diffraction grating pattern; said apparatus comprising:

(a) two optical modulators for shifting frequencies of incident beams in response to high frequency drive signals, and generating two diffracted beams with diffraction angles in response to the frequency of said drive signals in order to make a predetermined frequency difference between the two beams;

(b) a drive signal generator for generating high frequency drive signals respectively applied to said two optical modulators;

(c) an optical lens system for substantially conjugating each diffracting point of said optical modulators, with respect to the object through said objective optical system; and (d) a frequency changing circuit for changing frequencies of the high frequency drive signals respectively applied to said optical modulators by said drive signal generator while maintaining constant the frequency difference therebetween, thereby changing diffracting angles of the incident beams generated by said optical modulators, in order to adjust the incident angles of the two beams radiated to the object from said objective optical system.

5. A position detecting apparatus including, a light source of coherent light;

a divider for dividing a beam from said light source into two radiated beams;

an objective optical system for receiving the two radiated beams and making the two radiated beams intersect each other on a diffraction grating pattern of an object; and a first optoelectric detector positioned at a pupil space or a conjugated space thereof of said objective optical system for receiving interference light between two beams generated coaxially along the same direction from said diffraction grating pattern and passing through said objective optical system; said apparatus detecting the object position based on a signal from said optoelectric detector, the apparatus comprising:

(a) a detector holding member holding said first optoelectric detector and holding second and third optoelectric detectors with light receiving planes thereof at said pupil space or the conjugated space thereof, said second and third optoelectric detectors being located at opposite sides of said first optoelectric detector along a pitch direction of the diffraction grating pattern; and (b) an adjusting member to adjust a relative positional relation between said detector holding member and the received interference light path in a plane perpendicular to an optical axis of said objective optical system based on signals obtained by said second and third optoelectric detectors which respectively receive two light beams generated from the object differently from said interference light.

6. A position detecting apparatus according to claim 5, wherein said adjusting member comprises a mechanism for finely moving said detector holding member with respect to said interference light path.

7. A position detecting apparatus according to claim 5, wherein said adjusting member comprises a tiltable parallel plane glass disposed in front of said detector holding member for shifting said interference light path with respect to said detector holding member.

8. An exposure apparatus including, an exposure light illuminating system for exposing a pattern of a mask onto a photosensitive substrate;

an objective optical system positioned in a space above the mask and movable in accordance with a position of a first diffraction grating mark on the mask for detecting a relative positional deviation between said first diffraction grating mark on said mask and a second diffraction grating mark formed on said photosensitive substrate, said objective optical system comprising an objective lens system having an optical axis substantially perpendicular to a surface of the mask, and a reflection member movable with said objective lens system and bending the optical axis perpendicularly at a portion thereof, said exposure apparatus detecting the first and second diffraction grating marks through said objective optical system, and comprising:

(a) a beam generating system for directing two beams into said objective optical system so as to form beam waists at each of two positions in a pupil space of said objective lens system, which are symmetrically separated from the optical axis by a predetermined distance, thereby to radiate two parallel flux beams intersecting with a predetermined angle on said first diffraction grating mark of the mask;

(b) a driving device for driving said objective optical system along a direction of the beam radiation from said beam generating system, in accordance with location of said first diffraction grating mark on the mask; and (c) an optoelectric detector for optoelectrically detecting diffracted light generated parallel to the optical axis of said objective lens system from said first diffraction grating mark, within the pupil space of said objective lens system or a conjugated space thereof, through said objective optical system;

said driving device driving said objective optical system within a predetermined range along the optical axis, and the predetermined range being limited to a distance $\Delta Z$ between the beam waist positions of the two beams radiated from said beam generating system and a pupil plane of said objective lens system, the distance $\Delta Z$ satisfying the following inequality, $$\Delta Z < (\lambda \cdot f^2)/(Dr-Pr)$$

wherein, f: a focal distance of said objective lens system $\lambda$: a wavelength of the two beams Dr: an irradiation width of the two beams intersecting on said first diffraction grating mark, along a pitch direction on said mark Pr: a pitch of said diffraction grating mark.

* * * * *